United States Patent
Tischler et al.

(10) Patent No.: US 9,431,462 B2
(45) Date of Patent: *Aug. 30, 2016

(54) HIGH EFFICIENCY LEDS AND LED LAMPS

(71) Applicants: Michael A. Tischler, Vancouver (CA); Vladimir Odnoblyudov, Eagle, IN (US); David Keogh, San Diego, CA (US)

(72) Inventors: Michael A. Tischler, Vancouver (CA); Vladimir Odnoblyudov, Eagle, IN (US); David Keogh, San Diego, CA (US)

(73) Assignee: Cooledge Lighting, Inc., Richmond (CA)

(*) Notice: Subject to any disclaimer, the term of this patent is extended or adjusted under 35 U.S.C. 154(b) by 0 days.

This patent is subject to a terminal disclaimer.

(21) Appl. No.: 14/860,800

(22) Filed: Sep. 22, 2015

(65) Prior Publication Data

US 2016/0010805 A1    Jan. 14, 2016

Related U.S. Application Data

(63) Continuation of application No. 14/531,332, filed on Nov. 3, 2014, now Pat. No. 9,179,510, which is a continuation of application No. 13/747,857, filed on Jan. 23, 2013, now Pat. No. 8,921,134, which is a (Continued)

(51) Int. Cl.
*H01L 33/00* (2010.01)
*H01L 21/00* (2006.01)
(Continued)

(52) U.S. Cl.
CPC ............ *H01L 27/32* (2013.01); *F21K 9/137* (2013.01); *F21K 9/56* (2013.01); *F21V 29/773* (2015.01); *H01L 51/50* (2013.01);
(Continued)

(58) Field of Classification Search
CPC .......................... H01L 27/32; H01L 51/50

USPC ............. 438/22–31; 257/13, 37, 83–98, 257/E51.001–51.052
See application file for complete search history.

(56) References Cited

U.S. PATENT DOCUMENTS 5,081,520 A    1/1992 Yoshii et al.
5,631,191 A    5/1997 Durand et al.
(Continued)

FOREIGN PATENT DOCUMENTS

EP    0265077    4/1988
EP    1067598    1/2001
(Continued)

OTHER PUBLICATIONS

International Search Report and Written Opinion mailed Jun. 2, 2011 for International Application No. PCT/CA2011/050006 (7 pages).

(Continued)

*Primary Examiner* — Calvin Lee
(74) *Attorney, Agent, or Firm* — Morgan, Lewis & Bockius LLP

(57) ABSTRACT

In various embodiments, lighting systems include an electrically insulating carrier having a plurality of conductive elements disposed thereon, a light-emitting array, and at least one power source. The light-emitting array is disposed over the carrier and includes a plurality of light-emitting strings, each light-emitting string comprising a plurality of electrically connected light-emitting diodes (LEDs). Each LED has at least two electrical contacts, and each electrical contact is electrically connected to a conductive element. The power source provides power to the light-emitting strings.

40 Claims, 28 Drawing Sheets

Related U.S. Application Data continuation of application No. 13/378,880, filed as application No. PCT/US2010/039684 on Jun. 23, 2010, now Pat. No. 8,384,114.

(60) Provisional application No. 61/221,046, filed on Jun. 27, 2009.

(51) Int. Cl.

| | | |
|---|---|---|
| *H01L 27/32* | (2006.01) | |
| *H05B 33/08* | (2006.01) | |
| *H01L 51/50* | (2006.01) | |
| *F21K 99/00* | (2016.01) | |
| *F21V 29/77* | (2015.01) | |
| *F21Y 101/02* | (2006.01) | |
| *H01L 27/15* | (2006.01) | |
| *H01L 33/62* | (2010.01) | |
| *F21V 7/00* | (2006.01) | |
| *F21Y 105/00* | (2016.01) | |

(52) U.S. Cl.
CPC ..... *H05B 33/0803* (2013.01); *H05B 33/0818* (2013.01); *H05B 33/0821* (2013.01); *H05B 33/0824* (2013.01); *H05B 33/0845* (2013.01); *H05B 33/0896* (2013.01); *F21V 7/0066* (2013.01); *F21Y 2101/02* (2013.01); *F21Y 2105/001* (2013.01); *H01L 27/156* (2013.01); *H01L 33/0079* (2013.01); *H01L 33/62* (2013.01); *H01L 2224/48137* (2013.01); *H01L 2224/48227* (2013.01); *H01L 2224/49107* (2013.01); *H01L 2924/13033* (2013.01)

(56) References Cited

U.S. PATENT DOCUMENTS

| | | | |
|---|---|---|---|
| 5,918,113 A | 6/1999 | Higashi et al. | |
| 6,281,450 B1 | 8/2001 | Urasaki et al. | |
| 6,357,889 B1 | 3/2002 | Duggal et al. | |
| 6,357,893 B1 | 3/2002 | Belliveau | |
| 6,478,909 B1 | 11/2002 | Tuttle | |
| 6,501,102 B2 | 12/2002 | Mueller-mach et al. | |
| 6,513,949 B1 | 2/2003 | Marshall et al. | |
| 6,576,488 B2 | 6/2003 | Collins, III et al. | |
| 6,603,258 B2 | 8/2003 | Mueller-mach et al. | |
| 6,614,103 B1 | 9/2003 | Durocher et al. | |
| 6,621,211 B1 | 9/2003 | Srivastava et al. | |
| 6,642,652 B2 | 11/2003 | Collins et al. | |
| 6,650,044 B1 | 11/2003 | Lowery | |
| 6,665,170 B1 | 12/2003 | Warner et al. | |
| 6,685,852 B2 | 2/2004 | Setlur et al. | |
| 6,733,711 B2 | 5/2004 | Durocher et al. | |
| 6,936,857 B2 | 8/2005 | Doxsee et al. | |
| 6,939,481 B2 | 9/2005 | Srivastava et al. | |
| 6,965,361 B1 | 11/2005 | Sheats et al. | |
| 6,998,777 B2 | 2/2006 | Suehiro et al. | |
| 7,005,679 B2 | 2/2006 | Tarsa et al. | |
| 7,025,651 B2 | 4/2006 | Song et al. | |
| 7,042,165 B2 | 5/2006 | Madhani et al. | |
| 7,052,924 B2 | 5/2006 | Daniels et al. | |
| 7,115,983 B2 | 10/2006 | Wagner | |
| 7,122,405 B2 | 10/2006 | Tiao | |
| 7,163,327 B2 | 1/2007 | Henson et al. | |
| 7,206,507 B2 | 4/2007 | Lee et al. | |
| 7,207,693 B2 | 4/2007 | Ratcliffe | |
| 7,217,956 B2 | 5/2007 | Daniels et al. | |
| 7,244,326 B2 | 7/2007 | Craig et al. | |
| 7,256,483 B2 | 8/2007 | Epler et al. | |
| 7,259,030 B2 | 8/2007 | Daniels et al. | |
| 7,294,861 B2 | 11/2007 | Schardt et al. | |
| 7,294,961 B2 | 11/2007 | Daniels et al. | |
| 7,316,488 B2 | 1/2008 | Wall, Jr. | |
| 7,319,246 B2 | 1/2008 | Soules et al. | |
| 7,335,951 B2 | 2/2008 | Nishi et al. | |
| 7,344,902 B2 | 3/2008 | Basin et al. | |
| 7,344,952 B2 | 3/2008 | Chandra | |
| 7,427,782 B2 | 9/2008 | Daniels et al. | |
| 7,488,088 B2 | 2/2009 | Brukilacchio | |
| 7,488,621 B2 | 2/2009 | Epler et al. | |
| 7,498,734 B2 | 3/2009 | Suehiro et al. | |
| 7,564,070 B2 | 7/2009 | Sayers et al. | |
| 7,618,157 B1 | 11/2009 | Galvez et al. | |
| 7,638,854 B2 | 12/2009 | Tanaka et al. | |
| 7,642,708 B2 | 1/2010 | Juestel et al. | |
| 7,656,371 B2 | 2/2010 | Shimizu et al. | |
| 7,663,234 B2 | 2/2010 | Sun et al. | |
| 7,682,850 B2 | 3/2010 | Harbers et al. | |
| 7,703,942 B2 | 4/2010 | Narendran et al. | |
| 7,723,733 B2 | 5/2010 | Daniels et al. | |
| 7,740,373 B2 | 6/2010 | Yoon et al. | |
| 7,758,221 B2 | 7/2010 | Weijers | |
| 7,766,536 B2 | 8/2010 | Peifer et al. | |
| 7,775,685 B2 | 8/2010 | Loh et al. | |
| 7,791,093 B2 | 9/2010 | Basin et al. | |
| 7,811,843 B1 | 10/2010 | Lai | |
| 7,819,539 B2 | 10/2010 | Kim et al. | |
| 7,821,023 B2 | 10/2010 | Yuan et al. | |
| 7,828,459 B2 | 11/2010 | Rains | |
| 7,838,346 B2 | 11/2010 | Tokunaga | |
| 7,847,302 B2 | 12/2010 | Basin et al. | |
| 7,855,092 B2 | 12/2010 | Shimizu et al. | |
| 7,858,198 B2 | 12/2010 | Kashiwagi et al. | |
| 7,858,408 B2 | 12/2010 | Mueller et al. | |
| 7,863,760 B2 | 1/2011 | Daniels et al. | |
| 7,897,483 B2 | 3/2011 | Yamazaki et al. | |
| 7,898,085 B2 | 3/2011 | Fujimori | |
| 7,902,550 B2 | 3/2011 | Yamazaki | |
| 7,902,560 B2 | 3/2011 | Bierhuizen et al. | |
| 7,909,480 B2 | 3/2011 | Kang et al. | |
| 7,909,496 B2 | 3/2011 | Matheson et al. | |
| 7,932,531 B2 | 4/2011 | Lin et al. | |
| 7,972,031 B2 | 7/2011 | Ray et al. | |
| 7,997,784 B2 | 8/2011 | Tsai | |
| 8,384,114 B2 * | 2/2013 | Tischler et al. | 257/98 |
| 8,384,121 B2 * | 2/2013 | Tischler et al. | 257/99 |
| 8,921,134 B2 * | 12/2014 | Tischler et al. | |
| 9,179,510 B2 * | 11/2015 | Tischler et al. | H05B 33/0821 |
| 2003/0019735 A1 | 1/2003 | Howie et al. | |
| 2005/0056948 A1 | 3/2005 | Uchiyama | |
| 2005/0073840 A1 | 4/2005 | Chou et al. | |
| 2005/0183884 A1 | 8/2005 | Su | |
| 2005/0230853 A1 | 10/2005 | Yoshikawa | |
| 2006/0001055 A1 | 1/2006 | Ueno et al. | |
| 2006/0186423 A1 | 8/2006 | Blonder et al. | |
| 2006/0228973 A1 | 10/2006 | Janning | |
| 2007/0069663 A1 | 3/2007 | Burdalski et al. | |
| 2007/0096113 A1 | 5/2007 | Inoshita et al. | |
| 2007/0096272 A1 | 5/2007 | Wang | |
| 2007/0145884 A1 | 6/2007 | Wu et al. | |
| 2007/0211449 A1 | 9/2007 | Holman et al. | |
| 2007/0252512 A1 | 11/2007 | Bertram et al. | |
| 2007/0262920 A1 | 11/2007 | Werner et al. | |
| 2007/0297020 A1 | 12/2007 | Shen et al. | |
| 2008/0007885 A1 | 1/2008 | Mehri et al. | |
| 2008/0019134 A1 | 1/2008 | Mukai | |
| 2008/0157689 A1 | 7/2008 | Kato | |
| 2008/0179611 A1 | 7/2008 | Chitnis et al. | |
| 2008/0186704 A1 | 8/2008 | Chou et al. | |
| 2008/0315228 A1 | 12/2008 | Krames et al. | |
| 2009/0002810 A1 | 1/2009 | Jeon et al. | |
| 2009/0026915 A1 | 1/2009 | Nagatomi et al. | |
| 2009/0073350 A1 | 3/2009 | Toyama et al. | |
| 2009/0095966 A1 | 4/2009 | Keller et al. | |
| 2009/0096370 A1 | 4/2009 | Murazaki et al. | |
| 2009/0109668 A1 | 4/2009 | Isobe | |
| 2009/0160364 A1 | 6/2009 | Ackermann et al. | |
| 2009/0178834 A1 | 7/2009 | Akutsu et al. | |
| 2009/0212257 A1 | 8/2009 | Sohn et al. | |
| 2009/0239086 A1 | 9/2009 | Ishizuka et al. | |
| 2009/0243457 A1 | 10/2009 | Jung et al. | |
| 2009/0244882 A1 | 10/2009 | Samber et al. | |
| 2009/0256163 A1 | 10/2009 | Chakraborty | |

(56) References Cited

U.S. PATENT DOCUMENTS

| | | |
|---|---|---|
| 2010/0001631 A1 | 1/2010 | Gotoh et al. |
| 2010/0051984 A1 | 3/2010 | West |
| 2010/0060144 A1 | 3/2010 | Justel et al. |
| 2010/0085727 A1 | 4/2010 | Igaarashi et al. |
| 2010/0096977 A1 | 4/2010 | Lee et al. |
| 2010/0207536 A1 | 8/2010 | Burdalski et al. |
| 2010/0214777 A1 | 8/2010 | Suehiro et al. |
| 2010/0244071 A1 | 9/2010 | Wada et al. |
| 2010/0277084 A1 | 11/2010 | Lee et al. |
| 2010/0283072 A1 | 11/2010 | Kazlas et al. |
| 2010/0295070 A1 | 11/2010 | Su et al. |
| 2010/0295077 A1 | 11/2010 | Melman |
| 2010/0295078 A1 | 11/2010 | Chen et al. |
| 2010/0320928 A1 | 12/2010 | Kaihotsu et al. |
| 2011/0002140 A1 | 1/2011 | Tsukahara et al. |
| 2011/0031516 A1 | 2/2011 | Basin et al. |
| 2011/0045619 A1 | 2/2011 | Ling |
| 2011/0058372 A1 | 3/2011 | Lerman et al. |
| 2011/0063838 A1 | 3/2011 | Dau et al. |
| 2011/0101399 A1 | 5/2011 | Suehiro et al. |
| 2011/0104834 A1 | 5/2011 | Suehiro et al. |
| 2011/0108878 A1 | 5/2011 | Namiki et al. |
| 2011/0114989 A1 | 5/2011 | Suehiro et al. |
| 2011/0163681 A1 | 7/2011 | Dau et al. |
| 2011/0163683 A1 | 7/2011 | Steele et al. |
| 2011/0180818 A1 | 7/2011 | Lerman et al. |
| 2011/0193105 A1 | 8/2011 | Lerman et al. |
| 2011/0193106 A1 | 8/2011 | Lerman et al. |
| 2011/0193114 A1 | 8/2011 | Lerman et al. |
| 2011/0195532 A1 | 8/2011 | Lerman et al. |
| 2011/0198631 A1 | 8/2011 | Lerman et al. |
| 2011/0198632 A1 | 8/2011 | Lerman et al. |
| 2011/0204390 A1 | 8/2011 | Lerman et al. |
| 2011/0204391 A1 | 8/2011 | Lerman et al. |
| 2012/0146066 A1 | 6/2012 | Tischler et al. |

FOREIGN PATENT DOCUMENTS

| | | |
|---|---|---|
| EP | 1473978 | 11/2004 |
| EP | 1653523 | 5/2006 |
| EP | 1770788 | 4/2007 |
| EP | 2017890 | 1/2009 |
| EP | 2031437 | 3/2009 |
| TW | 423166 | 9/1999 |
| WO | WO 90/01751 | 2/1990 |
| WO | WO 99/60829 | 11/1999 |
| WO | WO 2005/062382 | 7/2005 |
| WO | WO 2005/119314 | 12/2005 |
| WO | WO 2007/067758 | 6/2007 |
| WO | WO 2007/105853 | 9/2007 |
| WO | WO 2008/051397 | 5/2008 |
| WO | WO 2009/079040 | 6/2009 |
| WO | WO 2010/098273 | 9/2010 |

OTHER PUBLICATIONS

International Search Report and Written Opinion mailed Sep. 7, 2011 for International Application No. PCT/CA2011/050399 (11 pages).

International Search Report and Written Opinion mailed Oct. 24, 2011 for International Application No. PCT/CA2011/050436 (9 pages).

International Search Report and Written Opinion mailed Aug. 30, 2011 for International Application No. PCT/CA2010/039684 (9 pages).

* cited by examiner

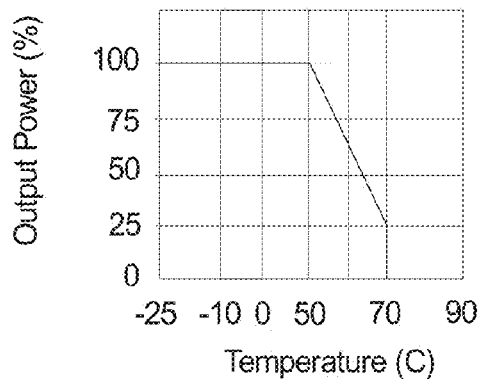
FIG. 7
| | Incandescent (60W) | Fluorescent | LED (prior art) |
|---|---|---|---|
| Visible light | 7.5% | 21% | 15 - 25% |
| Heat (IR + conduction + convection) | 92.5% | 89% | 75 - 85% |
FIG. 8
| | | |
|---|---|---|
| Driver efficiency | 85% | 92% |
| LED efficiency | 30% | 51% |
| Thermal efficiency | 85% | 95% |
| Optics efficiency | 80% | 92% |
| Total Lamp efficiency | 17% | 41% |
FIG. 9
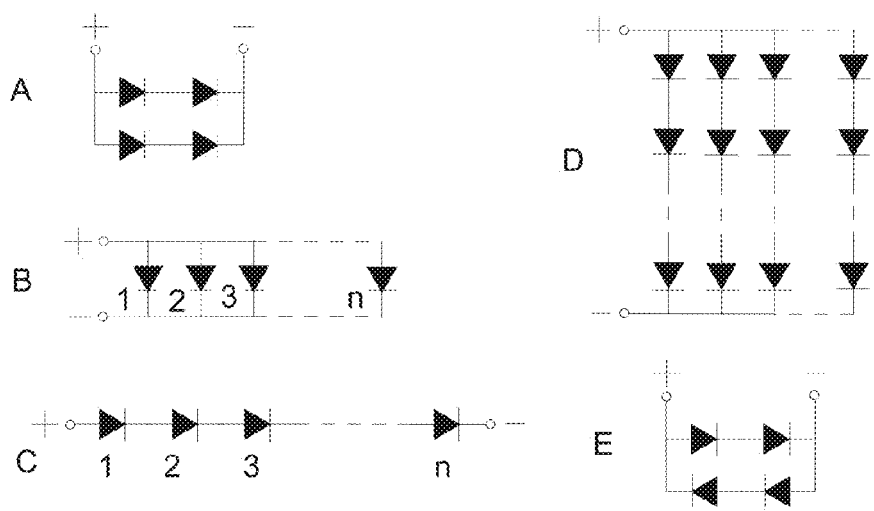
FIG. 10

HIGH EFFICIENCY LEDS AND LED LAMPS

PRIORITY CLAIM

This application is a continuation of U.S. patent application Ser. No. 14/531,332, filed on Nov. 3, 2014, now U.S. Pat. No. 9,179,510 issued on Nov. 3, 2015, which is a continuation of U.S. patent application Ser. No. 13/747,857, filed on Jan. 23, 2013, now U.S. Pat. No. 8,921,134 issued on Dec. 30, 2014, which is a continuation of U.S. patent application Ser. No. 13/378,880, filed on Feb. 29, 2012, now U.S. Pat. No. 8,384,114 issued on Feb. 26, 2013, which is the U.S. national stage application of International (PCT) Patent Application Serial No. PCT/US2010/039684, filed Jun. 23, 2010, which claims the benefit of U.S. Provisional Patent Application No. 61/221,046, filed Jun. 27, 2009. The entire disclosure of each of these applications is incorporated by reference herein.

TECHNICAL FIELD

This application relates generally to light-emitting devices. More specifically, this application relates to arrays of light-emitting diodes ("LEDs") and lamps and fixtures comprising arrays of LEDs fabricated and operated in a mode having improved efficiency and reduced cost.

BACKGROUND ART

Increasing the efficiency of general lighting is one of the main ways to reduce global power consumption. About 25% of the electrical power produced in US is used for lighting. Since conventional lamps are not quite inefficient, increasing the efficiency of general lighting will yield major energy-saving benefits worldwide. In the United States, the U.S. Department of Energy (DOE) estimates that power consumption for lighting could be reduced by 50% simply by replacing conventional lamps with solid state lamps.

Currently, general lighting is achieved using a wide variety of lamp types: incandescent, fluorescent, tungsten halogen, sodium, clear metal halide, etc. The most commonly used types of lamps are incandescent and fluorescent, with incandescent lamps being most widely used in residential settings. These types of lamps are available in many different forms and with different total lumen outputs and color characteristics. Two other important lighting parameters are the Color Temperature (CT) and the Color Rendering Index (CRI). The CT is a measure of the lamps "whiteness", its yellowness or blueness, or its warmth or coolness. CRI is a measure of the quality of the light; in other words how accurately do colors appear when illuminated with the lighting source. The highest CRI is 100 and typically incandescent lamps have the highest value of CRI, as their emission spectrum is basically identical to a black body radiation spectrum. Other types of lamps may have a lower CRI. It is possible for different lamps to have the same color temperature but a different CRI.

The economics of lighting has three main variables—light (lumens, lm), power (watt, W), and cost (dollar, $). Luminous efficacy is the amount of light produced per unit of electrical power (lm/W). Purchase cost efficacy is the amount of light produced per dollar (lm/$). For reference, incandescent lamps have a luminous efficacy of about 8-15 lm/W. The purchase cost may also be referred to as the first cost.

For users of light, the cost of lighting has two components, the first (purchase and installation) costs, and the cost of the electricity (operating cost). While incandescent and fluorescent lamps have a relatively high purchase cost efficacy, their luminous efficacy and operating costs are relatively high because of their low luminous efficacy. In continuous operation, an incandescent lamp costs about $90-$120 per year and must be replaced after approximately 1000 hours (1.5 months). In normal residential use (about 14 hours/week of on time) incandescent lamps cost about $8/year to operate and must be replaced in about 18 months. Operating cost may also include the cost to change lamps, in addition to the electricity cost. In order to reduce energy consumption associated with general lighting, new types of lamps are being investigated. One of the new types that are receiving interest because of its potentially relatively higher efficiency is a light emitting diode (LED)-based lamp. LEDs have demonstrated luminous efficacies over a wide range, from about 20 to about 140 lm/watt (here LED means a package containing an LED die; in a few cases a package may have several discrete die mounted in one package).

LEDs may emit light in one wavelength range, for example red, amber, yellow, green, blue, etc. or may be designed to emit white light. In general single color LEDs are made by using a material whose bandgap emits light in desired the wavelength range. For example, yellow, amber or red light may be produced using LEDs formed from the AlInGaP material system. Blue, UV and green LEDs may be formed, for example, using the AlInGaN material system. In other examples, single color LEDs may be formed using a combination of a LED emitting light of a first wavelength and a light conversion material, for example a phosphor, that absorbs a portion or all of the first emitted wavelength and re-emits it at a second wavelength.

White LEDs may be produced by a number of techniques, for example by combining an LED with one or more light conversion materials such as phosphors, here referred to as a phosphor-converted white LED, or by color mixing of multiple LEDs emitting different colors (a typical color mixing arrangement may comprise a red, a green and a blue LED but other combinations may be used) or by combinations of one or more phosphor-converted LEDs and one or more direct emitting LEDs, that is LEDs that do not comprise a phosphor. LEDs may have a high CRI (>90) and a warm CT, producing a quality of light similar to that of an incandescent lamp. The CT and CRI of an LED depend on the spectral output of the LED as well as the characteristics of the phosphor. Warm colors and a high CRI typically require more emission in the red wavelength range, and phosphor efficiency and the human eye's sensitivity in the red wavelength range is relatively lower than that in green-yellow range. Thus LEDs with a warm color and/or a relatively high CRI typically have a relatively lower luminous efficacy than LEDs with a cool color and/or a relatively low CRI.

Conventional LED lamps, also called prior art LED lamps, have improved luminous efficacy (about 40 to about 70 lm/W) and long lifetime (about 30,000 to about 50,000 hours) compared to incandescent lamps. However, conventional LED lamps are very expensive (about $80 to about $130 per lamp) and thus, even though the electricity costs are typically about ¼ to about ½ that of incandescent lamps, the high first cost (also known as the purchase cost) is sufficient to prevent widespread adoption. A LED lamp comprises the LEDs and any necessary electronics, optics, thermal management systems and housing to permit it to operate on generally available AC power.

Two key problems with prior art LED lamps are (1) the luminous efficacy of the LED lamp is only about 50-70% of that achievable with an individual LED and (2) the very high first cost. Although higher first costs can be mitigated by reduced operating costs and longer lifetimes, customers' price expectations often pose psychological barriers to sales. The DOE predicts that a payback time of no more than 2 years (less than two incandescent bulb lifetimes (IBL)) will be required to accelerate adoption of LED lighting. Meaningful energy conservation is possible only with widespread adoption of LED lighting. The cost element with the biggest impact on the payback time is the first cost—for conventional LED lamps it is a virtually insurmountable obstacle. For example, the current approximately $100 lamp first cost leads to a payback time of about 10 years or about 7 IBL.

Payback time may be calculated in many different ways, but two main ones are the out-of-pocket approach and amortization approach. In the out of pocket approach, payback occurs when the cost of the LED lamp plus its electricity cost equals the cost of the incandescent lamp or lamps plus its electricity cost. This calculation includes the purchase of an additional incandescent lamp at the end of the payback time, to reflect the fact that going forward one would need a new lamp after the previous incandescent lamp burned out, whereas the LED lamp would keep operating because of its significantly longer lifetime. The amortization payback time approach amortizes the lamp cost over its entire lifetime, thus resulting in shorter payback times than the out-of-pocket approach. The out-of-pocket approach may be more realistic and representative of how such decisions are made and is the calculation mainly used for payback times in this document.

The lower luminous efficacy of prior art LED lamps compared to individual LEDs is caused by a number of factors including the reduction of luminous efficacy of the individual LEDs under actual operating conditions, the cost of assembling multiple LEDs into a lamp, the optical losses associated with the use of multiple LEDs in the lamp and fixture, the efficiency losses associated with the power converter and LED driver and the further reduction in efficiency and lifetime of all components from high operation temperatures, which in turn is a result of high junction temperatures and high current densities at which LED die are operated to achieve the desired total lumen output Each of these factors will be discussed in detail below.

Very few individual LEDs produce enough light to be used individually for general lighting. In most cases LED lamps contain a relatively large number of individual packaged LEDs, on the order of about 10 to about several hundred. It is understood that a large number of individually packaged LEDs increases the lamp cost as it then includes the package cost for each LED as well as the assembly cost of putting all of the LEDs together in the lamp. Thus the current industry direction and DOE roadmap is to drive the LEDs at higher currents in order to generate more light from each LED while minimizing the required number of LEDs.

The problem with this approach is that the luminous efficacy of an individual LED decreases strongly with increasing drive current (for a given LED die size one may use a value of current and when comparing LED die of different sizes, one may choose to use either current or current density). The relatively high luminous efficacies demonstrated for prior art LEDs are achieved by operating at very low current (current density). At the low currents used to achieve the high luminous efficacy numbers, these devices produce relatively little light; certainly not enough to replace a single incandescent lamp. For example individual LEDs may produce, at these current levels, about 5 to about 200 lumens. Operation at higher current produces more light, but at the expense of significantly reduced luminous efficacy. For example, FIG. 1 shows a plot of luminous efficacy (top graph) and total light output (bottom graph) as a function of drive current for several state of the art LEDs. In particular, there are three curves in each graph of FIG. 1 showing cool white LEDs made by Lumileds (K2 star package, dash lines), Cree (XLamp XR-E, dotted lines), and Luminus Devices (SST-90, dash-dotted lines). The data for the brightest bins for each device is used. Each curve has a thick solid part which represents the driving conditions at which devices are designed to operate. It is clear that the luminous efficacy decreases rapidly with increasing current, and that the luminous efficacy within the designed operation range is about half of the peak luminous efficacy that could be achieved at low currents.

The data shown in FIG. 1 is taken with the LEDs maintained at 25° C. In actual operation maintaining such a low temperature is not possible and as the current increases, the LEDs operate at significantly higher temperatures, in the range of about 50° C. to about 100° C., which causes the luminous efficacy to drop further. Advanced packaging techniques may be utilized to improve the heat removal and slow the junction temperature rise; nevertheless, the luminous efficacy of the same LED at high currents is almost always lower than that at low currents in actual operation.

Another problem with the conventional LED lamp approach of using high currents (current density) is that the temperature rise associated with this mode of operation decreases the lifetime of an LED. The LED lifetime is generally referred to as the time period during which the total light output of an LED decreases to some percentage, typically 70%, of its initial light output level (LEDs do not typically burn out, but instead have a gradual reduction in brightness). Driving an LED at relatively high current densities and junction temperatures causes degradation mechanisms to accelerate. A specific example of this is shown in FIG. 2 taken from DOE document PNNL-SA-51901, April 2007, Thermal management of white LEDs. One can see that for a typical GaN-based LED the lifetime is about 40,000 hours when the junction temperature is about 63° C. (curve 136) and decreases to about 14,000 hours when the junction temperature is about 74° C. (curve 138). It should also be noted that as the brightness decreases, the luminous efficacy is also decreasing, so a longer-lived LED may have a higher luminous efficacy and thus may have a lower cost, over its lifetime.

Because these LEDs are designed to operate at high current, the package must be designed to manage the relatively large amount of heat (about 1 to about 5 watts) generated when the LED is operated at relatively lower luminous efficacy (at high currents). Such packages are expensive, thus reducing the purchase cost efficacy. FIG. 3 shows the luminous efficacy (top graph) and the purchase cost efficacy (bottom graph) as a function of lumen output (the lumen output is varied by changing the drive current, as shown in FIG. 1) for the same devices as in FIG. 1. The same line types are used for each device and the thick solid part of each curve represents the designed operating range. It is clear from this data that the purchase cost efficacy (lm/$) increases rapidly with increased lumen output but this is at the expense of luminous efficacy. For example, for the Luminus Devices SST-90, a purchase cost efficacy of about 40 lm/$ is only achieved at a relatively low luminous efficacy of about 60 lm/watt, about half the value achieved at very low currents. At low currents, where the luminous efficacy is about 120 lm/W, the purchase cost efficacy drops to only about 10 lm/$.

As discussed above, a prior art LED lamp contains a relatively large number of LEDs. FIG. 4 shows a schematic of an exemplary prior art LED lamp. Each packaged LED 142 is mounted on a carrier or circuit board 141 and coupled with interconnects 144. The lamp housing 146 may also contain the power converter (to convert the 120VAC input to a DC level suitable for the LED driver and the LED driver (together shown as 148, inside housing 146) that provides a controlled current to the LEDs, appropriate thermal management systems including heat sinks 150, and an optical system 140 to combine and diffuse and/or direct the light emitted from the individual LEDs into a desired profile exiting the lamp and a base 152.

LED lamp manufacturers must purchase multiple LEDs and assemble and integrate them on the circuit board. This can be relatively expensive, and the cost increases when using higher and higher power LEDs. In addition to more expensive LED die, the LED package cost increases as well. As the LEDs are designed to operate at higher and higher temperatures, the packages for such LEDs become more complex and more expensive, in some cases costing more than the LED die itself. As discussed above, the luminous efficacy decreases at high current levels where the LEDs are designed to be operated. Thus the LED package must be designed to handle the large amounts of heat generated when the LED is operating at the relatively lower luminous efficacy of the operation point. Such packages are expensive, and the need to use multiple such packages in the lamp significantly increases the lamp cost. Associated with this are the cost of the carrier or circuit board and the cost of attaching the LED packages to the circuit board or carrier, for example using solder. The lamp cost is further increased because of the need for advanced thermal management systems required by operation at sub-optimal luminous efficacy values. Such thermal management systems are often passive, including for example metal core circuit boards, heat sinks and heat radiating fins, but in some cases may even include an active device such as a fan. All of these factors act to decrease the LED lamp purchase cost efficacy, increase the total cost/unit time and decrease the lifetime of the lamp.

Referring again to FIG. 4, one can see that the light emitted from the lamp must traverse a large number of interfaces with different refractive indices. Starting with the LED die, the light passes from the semiconductor die through the encapsulation of the package, a region of air, the lens/diffuser system 140 and then out of the lamp. Thus the light must traverse at least 4 interfaces. Each interface is associated with optical losses resulting from the difference in refractive indices of the materials forming the interface. Even at a OO incident angle part of the incident light may be reflected back and potentially absorbed and converted to heat. The amount of the light reflected back depends on the values of refractive indices of the materials forming the interface—the closer they are, the less light that may be reflected back. At a typical semiconductor (for example Si, GaAs, GaP or GaN)/air interface up to about 30% of visible light may be reflected back, as the ratio of refractive indices between semiconductor and air is typically around 3.

Another optical loss mechanism that occurs at the interface is total internal reflection. According to Snell's law, light incident upon an interface is refracted or reflected depending on the angle of incidence and the index of refraction on either side of the interface according to the equation $n1 \sin \theta 1 = n2 \sin \theta 2$ where n1 and n2 are the index of refraction on either side of the interface, $\theta 1$ is the incident angle and $\theta 2$ is the refracted angle. A schematic of this is shown in FIG. 5 in which material 1 is identified as 164, material 2 is identified as 162 and the interface between material 1 and material 2 is identified as 160. 165 identifies the normal direction to the interface, 166 represents the angle of incidence in material 1 and 168 represents the refracted angle in material 2. When the angle of incidence is large enough, no light is refracted, but instead all light is reflected back into material 1. This situation is called total internal reflection (TIR) and may be the cause of large optical losses. For example, using typical values for semiconductors and encapsulants, all light incident upon that interface at an incident angle greater than about 27° will be totally internally reflected. TIR light will suffer absorption losses within the die as it is reflected from various interfaces, leading to reduced light output and increased generation of heat. For an example of a simple rectangular LED die, only about 28% or less of the light generated within the LED die may escape the die, into the surrounding encapsulant. A great deal of work has gone into improving the light extraction efficiency of the die within the package/encapsulant. As discussed above, the LED lamp includes at least three (3) other interfaces at which Snell's law applies and at which further optical losses may occur.

Additional optical losses may also occur in lamps comprising a plurality of individual LEDs, for example packaged LEDs, arranged on a circuit board or carrier because of the increased etendue of the optical system (etendue refers to how "spread out" the light is in area and angle). In a given lamp or fixture design, one can only capture all of the light from the light source if the etendue of the light source is below a certain value (that value depends on the optical design of the lamp or fixture). In other words, as the dimensions of the light emitting area increase (the etendue increases) it becomes more difficult to focus and direct the light into a desired pattern without optical losses.

Lamps may also suffer further optical losses when put into a fixture. This is more significant for incandescent and fluorescent lamps that emit light in a relatively omnidirectional pattern. LEDs emit light in a direction pattern and thus LED lamps may suffer less light losses when installed in a fixture. Typically the optical efficiencies associated with light loss from prior art LED lamps in a fixture are in the range of about 80%.

In some embodiments the LED lamp may use 120VAC for its input source and this may be converted to DC to drive the LEDs in a constant current mode. In this situation electronics, also called the driver, may be required to convert the 120VAC to a DC voltage and current suitable for the LEDs.

The electronics efficiency is affected by its output voltage and typically increases as the output voltage approaches the input voltage. For example FIG. 6 shows the efficiency of a National Semiconductor LM3445 Triac LED driver as a function of output voltage for an input voltage of 115VAC. As the output voltage increases from about 33 volts to about 47 volts (corresponding to about 10 and about 14 GaN-based LEDs in series, respectively), the driver efficiency increases from about 85% to about 90%. LEDs typically operate in the range of about 2.5 to about 4 volts and when the number of the LEDs in the lamp is relatively low, the difference in LED voltage and the input voltage is relatively large, resulting in a relatively low efficiency. The electronics efficiency may also be a function of temperature, decreasing with increasing temperature. In some embodiments, the electronics efficiency may begin to decrease when the ambient temperature rises above about 500 C. FIG. 7 shows the power conversion efficiency of an exemplary 20 watt AC/DC converter (Recom RAC20-S_D_TA series) as a function of temperature.

As can be seen, the power conversion efficiency decreases significantly over about 50° C. In the typical operating temperature range for prior art LED-based lamps (about 60° C.) the power conversion efficiency has decreased by almost 50% for this particular power converter.

Typically the efficiencies associated with present day electronics (drivers) are in the range of about 85%. While the electronics efficiency may be able be improved with respect to both output voltage and dissipated heat for conventional LED lamps, this may lead to unacceptable increases in the electronics form factor and cost.

As discussed above, prior-art LED lamps comprising one or more packaged LEDs driven at relatively high currents and high current densities generate significant heat because of their low luminous efficacy. As the temperature is increased, the light output of LEDs is reduced, thus further reducing the luminous efficacy. The LED and driver lifetime is also reduced as potentially is the efficiency of the driver. FIG. 8 shows a table presenting the percentage of input power that is converted to either heat (IR+conduction+convection) or light for exemplary incandescent and fluorescent lamps and exemplary prior art LED lamps. It can be seen that the LED lamps produce significantly more visible light power than incandescent lamps, but still produce a significant amount of heat which must be managed appropriately. Typically this means higher operating temperatures and more expensive packaging and thermal management techniques.

The overall luminous efficacy of a LED lamp may be expressed as where is the luminous efficacy of the LED and is a function of temperature, is the optical efficiency and is the efficiency of the driver electronics and is a function of ambient temperature. For example, the LEDs from dotted and dash-dotted curves in FIG. 1 which may have a low current luminous efficacy of about 135 lm/W, in typical prior art operation conditions may have a luminous efficacy of about 75-85 lm/W. Using values of 85% for both the optics and driver efficiency, the prior art LED lamp in operation would then have an overall luminous efficacy of 54 lm/W. Note that this does not include any temperature effects. Typical design guides recommend an 85% derating for the LED related to temperature, yielding a temperature-adjusted overall LED lamp luminous efficacy of only about 46 lm/W.

Alternatively the LED lamp efficiency may be described as the product of non-temperature sensitive factors for the LED, the optics and the driver and a temperature factor, which may also be called the thermal efficiency; ηlamp=ηLED*ηDriver*ηOptics*ηThermal. FIG. 9 shows current (2008) and 2015 target values for these four efficiencies as determined by the U.S. Department of Energy (Multi-Year Program Plan FY'09-FY'15, Solid State Lighting Research and Development, March 2009). In FIG. 9, the efficiency of the LED is expressed as a percentage, that is, the light output power divided by the input electrical power. For reference a neutral white LED efficiency of about 30% corresponds to a LED luminous efficacy of about 90 lm/W. From this table it can be seen that even though advances have been made in conventional LED lamps, the overall efficiency of conventional LED lamps is only about 17%.

In spite of all of these issues, the overall luminous efficacy of prior art LED lamps is still higher than that of incandescent lamps. However, conventional LED lamps are very expensive ($80-$120 per lamp) and thus, as discussed previously, even though the electricity costs are typically about ¼ to about ½ that of incandescent lamps, the high first cost is sufficient to prevent widespread adoption.

There is accordingly a general need in the art for techniques and devices that simultaneously provide high efficiency, high brightness and low cost in LEDs, LED lamps and LED lighting systems.

SUMMARY OF INVENTION

In the following description and claims, the terms "comprise" and "include," along with their derivatives, may be used and are intended as synonyms for each other and mean that addition of unnamed extra elements is not precluded. In addition, in the following description and claims, the terms "coupled" and "connected," along with their derivatives, may be used.

As used herein, the term "connected" may be used to indicate that two or more elements are in direct physical or electrical contact with each other. The term "coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements.

As used herein, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements. It should be noted that "overlying" and "over" are relative terms that include layers located beneath a substrate when the substrate is turned upside down.

As used herein, the term "group III" elements indicates the elements found in what is commonly referred to as group III of the periodic table. For example, boron (B), aluminum (Al), gallium (Ga), and indium (In) are group III elements. Similarly, the term "group V" elements indicates the elements found in what is commonly referred to as group V of the periodic table. For example, nitrogen (N), phosphorus (P), arsenic (As), antimony (Sb), and bismuth (Bi) are group V elements.

A first aspect of the present invention is light-emitting devices comprising a plurality of relatively small LED units operating at near peak efficacy. In some embodiments of this aspect the LED units may be organized in an array, wherein such array may be a regular array, for example a rectangular array comprising rows and columns of LED units. In other embodiments of this aspect, the array may have other shapes, or may not be a regular array. Such light emitting devices may be referred to as a light engine or LED array.

In some embodiments of this aspect, the LED units of the light emitting device are operated within 30%, or within 20% or within 10% of their peak efficiency value. In some embodiments of this aspect, the number of LED units is sufficiently large to produce a total light output of at least 300 lumens, or at least 500 lumens, or at least 1000 lumens or greater. In some embodiments the number of LED units in the array may be at least 4, or at least 25, or at least 50, at least 100 or at least 150. Each light emitting device provides the required amount of light for a particular application. The amount of light is varied by changing the number of LED units, rather than changing the current drive in the LEDs, as is done in prior art LED lamps.

In some embodiments of this aspect, each LED unit of the light emitting device is operated at a relatively low current or current density, such that the luminous efficacy of the LED unit is within 30%, or within 20% or within 10% of its peak efficiency value. In some embodiments of this aspect each LED unit is operated with a current density that does not exceed 0.75 A/mm2, or does not exceed 0.55 A/mm2 or does not exceed 0.4 A/mm2 or does not exceed 0.10 A/mm2. In some embodiments of this aspect each LED unit may have an area no larger than 1 mm2, or no larger than 0.5 mm2, or no larger than 0.25 mm2 or no larger than 0.05 mm2. In some embodiments of this aspect the current in each LED unit may not exceed 100 mA, or may not exceed 50 mA or may not exceed 25 mA. In some embodiments of this aspect, the ratio of optical output power to total power dissipated by each LED unit (heat+optical power) may be greater than 25%, or greater than 30%, or greater than 40%.

Several merits arise from the present invention, relative to prior art LEDs. First, because each LED unit is operated at a relatively low current or current density, the luminous efficacy of the light emitting device is relatively closer to the peak value possible in comparison to prior art LEDs or LED lamps. Second, because the luminous efficacy is relatively high, the amount of heat generated by the light emitting device is relatively low compared to prior-art LEDs. Thus the light emitting device of the present invention produces relatively more light and relatively less heat, resulting in relatively decreased purchase and operating costs. The purchase cost is lower because the reduced heat generation permits less costly packaging and thermal management systems. The operating cost is reduced because the luminous efficacy is higher and, because less heat is generated, heat-induced luminous efficacy losses and electrical efficiency losses are reduced.

In some embodiments of this aspect the LED units of the light emitting device may all be the same shape and size and have the same spacing between LED units, or the LED units may have different shapes and/or sizes and/or different spacing between LED units. In some embodiments of this aspect, the spacing between LED units within the array may be at least 10 µm, or may be at least 30 µm, or may be at least 50 µm or may be at least 100 µm.

In some embodiments of this aspect, all or a portion of the LED units of the light emitting device may be operated in a continuous mode; that is the applied current is constant as a function of time for time periods less than about 1 second or less than about 0.1 seconds. In other embodiments of this aspect, all or a portion of the LED units may be operated in a pulsed mode; that is the applied current varies as a function of time for time periods less than about 1 second or less than about 0.1 seconds. In other embodiments of this aspect, a portion of the LED units may be operated in continuous mode and a portion may be operated in pulsed mode. Pulse mode may also be called pulse width modulation.

In some embodiments of this aspect, the LED units of the light emitting device may be electrically coupled in series, in parallel, or in a combination comprising a string of one or more LEDs in series and a plurality of such strings in parallel. In other embodiments of this aspect all of the LED units in the array may be electrically coupled together, and in other embodiments of this aspect, portions of the LED units in the arrays may be electrically coupled together resulting in a plurality of sub-arrays, each sub array comprising one or more LED units which may be electrically coupled in series, in parallel, or in a combination comprising a string of one or more LEDs in series and a plurality of such strings in parallel.

In some embodiments of this aspect, a first terminal of the light-emitting device may be coupled to only anodes of the LED units and a second terminal of the light-emitting device may be coupled only to cathodes of the LED units. In some embodiments of this aspect, a first terminal of the light-emitting device may be coupled to the anodes of a first portion of the LED units and to the cathodes of a second portion of the LED units. In some embodiments of this aspect, the light-emitting device may be operated with an AC or with a DC voltage.

In some embodiments of this aspect, each LED unit of the light emitting device may be operated with a DC voltage V (measure in volts) and a drive current I (measured in Amps) such that $V>30*I$, or such that $V>60*I$, or such that $V>100*I$.

In some embodiments of this aspect, the light emitting device may be operated with a DC voltage V (measure in volts) and a drive current I (measured in Amps) such that $V>30*I$, or such that $V>60*I$, or such that $V>100*I$.

In some embodiments of this aspect, the LED units of the light emitting device may all emit a single color or may emit a plurality of colors. In other words, the LED units may all emit light of a single spectral distribution or color, or different LED units may emit light with different spectral distributions or colors. In some embodiments of this aspect, different LED units may emit light with different spectral distributions or colors and this may produce light appearing as white to the eye. For example, LED units emitting red, green and blue colors may together appear as white to the eye. In some embodiments of this aspect, each LED unit of the light emitting device may comprise one or more active regions in which carrier radiative recombination occurs. In LED units comprising more than one active region, each active region may emit the same or different wavelengths and/or distributions of light.

In some embodiments of this aspect, all or a portion of the LED units of the light emitting device may be covered or partially covered by one or more light conversion materials, for example phosphors that may absorb all or a portion of the light emitted directly by one or more LED units and re-emit light with a different wavelength or color or spectral distribution than that of the light emitted directly by the LED unit or LED units. In some embodiments the combination of light emitted directly from all or a portion of the LED units and/or all or a portion of the light emitted by the one or more phosphors or light conversion materials may produce light appearing as white to the eye, or as blue to the eye, or as green to the eye, or as red to the eye. However this is not a limitation of the present invention and in other embodiments, the light may appear to be any color to the eye.

In some embodiments of this aspect, light extraction features may be formed on the LED units of the light emitting device. Light extraction features may increase the light extraction efficiency, resulting in a relatively higher LED unit luminous efficacy, and as a result, a higher light emitting device luminous efficacy. In some embodiments of this aspect the light extraction features may include surface roughening, photonic lattices, encapsulation or index-matching, anti-reflection coatings, mesa shaping, reflective contacts and other light extraction techniques known to those in the art.

In some embodiments of this aspect, additional circuitry may be formed on a common or adjoining carrier, substrate or circuit board to provide additional functionality to the light-emitting device, for example to provide AC to DC power conversion or to provide a current source for driving the LED units, or to permit independent or synchronized operation and control of a plurality of sub-arrays of LED units. Said additional circuitry may be formed in a monolithic or hybrid fashion.

In some embodiments of this aspect of the present invention the light-emitting devices comprising an array of relatively small LED units operating at near peak efficacy comprise individual packaged LEDs mounted on a circuit board or carrier.

In some embodiments of this aspect of the present invention the light-emitting devices comprising an array of relatively small LED units operating at near peak efficacy comprise individual LED die mounted on a circuit board or carrier.

In some embodiments of this aspect of the present invention the light-emitting devices comprising an array of relatively small LED units operating at near peak efficacy comprise individual LEDs units formed monolithically on a common substrate. In an embodiment of this aspect in which additional circuitry is formed in a monolithic fashion, such circuitry may be formed on or from all or a portion of the layer structure from which the LED units are formed, on or from all or a portion of an additional layer structure, on or from a common carrier substrate or otherwise disposed on a common substrate.

A second aspect of the present invention are methods of fabricating light-emitting devices comprising an array of relatively small LED units operating at near peak efficacy, said relatively small LED units formed in a hybrid fashion on a common substrate.

A third aspect of the present invention are methods of fabricating light-emitting devices comprising an array of relatively small LED units operating at near peak efficacy, said relatively small LED units formed in a monolithic fashion on a common substrate.

A forth aspect of the present invention are light-emitting devices comprising an array of relatively small LED units operating at near peak efficacy, a first portion of said relatively small LED units formed in a monolithic fashion and a second portion of said relatively small LED units formed in a hybrid fashion.

A fifth aspect of the present invention are LED lamps comprising an array of relatively small LED units operating at near peak efficacy, said relatively small LED units formed in a hybrid fashion on a common substrate.

A sixth aspect of the present invention are LED lamps comprising an array of relatively small LED units operating at near peak efficacy, said relatively small LED units formed in a monolithic fashion on a common substrate.

A seventh aspect of the present invention are LED fixtures or luminaires comprising one or more arrays of relatively small LED units operating at near peak efficacy, said relatively small LED units formed in a hybrid fashion on a common substrate.

A eighth aspect of the present invention are LED fixtures or luminaires comprising one or more arrays of relatively small LED units operating at near peak efficacy, said relatively small LED units formed in a monolithic fashion on a common substrate.

BRIEF DESCRIPTION OF DRAWINGS

A further understanding of the nature and advantages of the present invention may be realized by reference to the remaining portions of the specification and the drawings wherein like reference numerals are used throughout the several drawings to refer to similar components.

FIG. 7 shows the power conversion efficiency of an AC/DC converter as a function of temperature;

FIG. 8 is a table listing the percentage of input power that is converted to light and heat in various types of lighting;

FIG. 9 is a table listing current and 2015 target efficiency values for LEDs;

FIG. 10 is a schematic of examples of electrical configurations of arrays of LEDs;

Figure 1:
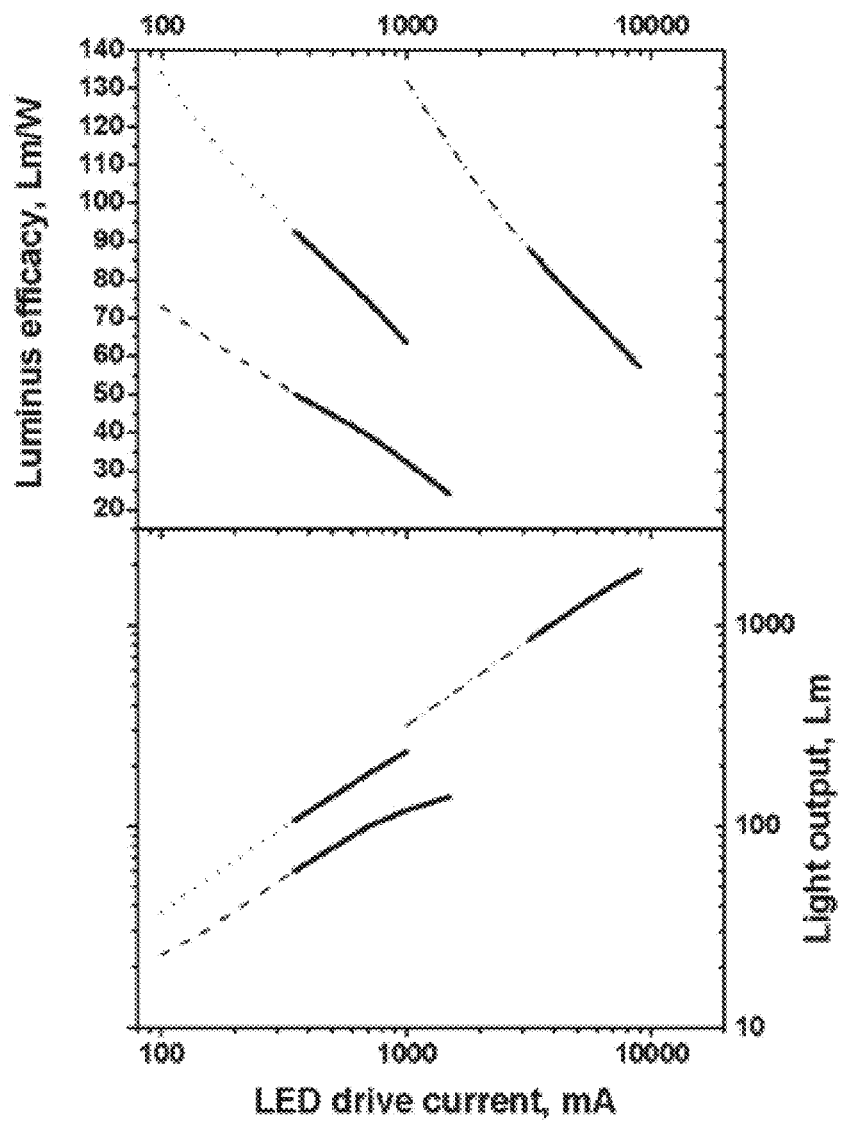
FIG. 1 is a plot of luminous efficacy and total light output as a function of drive current for state-of-the-art LEDs.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

DESCRIPTION OF EMBODIMENTS

Embodiments of the invention generally provide a LED-based light system, for example a LED light engine, LED lamp or LED luminaire comprising a plurality of LED units operated at near peak efficiency.

In some embodiments of the present invention a light emitting device, also referred to as an LED array or a light engine, may comprise a plurality of relatively small LED units operating at near peak efficiency and at relatively low current. The LED units, also referred to as LEDs, may be coupled in a variety of configurations, as discussed below. The number of LED units comprising the light engine may be adjusted to produce a desired amount of light. For example, a LED unit having an area in the range of about 0.0625 mm2 to about 0.25 mm2 may operate in the range of about 2.8 volts to about 3.3 volts with a current in the range of about 0.005 A to about 0.07 A and produce a light output in the range of about 1 lm to about 25 lm. In a specific example, a 350 μm by 350 μm LED unit operating at 3.0 V and 0.02 A may produce about 8 lm. Each light engine provides the required amount of light for a particular application. The amount of light is varied by changing the number of LED units, rather than changing the current drive in the LEDs, as is done in conventional LED lamps. If it is desired for the light engine to produce 1000 lm, then about 125 LED units may be required in the light engine. The luminous efficacy of such an array may be calculated by multiplying the voltage and current of each LED unit together, then multiplying by the number of LED units and dividing this into the total lumen output (light output per LED unit times the number of light units) for the light engine. In this example, the luminous efficacy of the light engine of the present invention is about 135 lm/W.

FIG. 10 is a schematic showing several examples of electrical configurations of arrays of relatively small LEDs operating at relatively low current and near peak luminous efficacy. For example, in some embodiments of the present invention, the individual LED units may be electrically coupled in parallel as shown in FIG. 10B, in series as shown in FIG. 10C or a combination of series and parallel connections as shown in FIGS. 10A and 10D. In some embodiments, a portion or all of the individual LED units may be coupled anode to cathode as shown in FIGS. 10A to 10D while in other embodiments parallel LEDs or parallel strings of LEDs may be electrically couples such that one or more anode and one or more cathode are electrically coupled at the end or ends of the series strings, as shown, for example, in FIG. 10E, and in other embodiments, a combination of these types of couplings may be utilized. The configuration shown in FIG. 10E and ones similar to it may be used to operate the LED array on AC power. Individual LED units operate on DC power, but using a configuration like the one shown in FIG. 10E may permit AC operation as follows; during the positive half of the AC cycle the LED units that are positively biased turn on and emit light while the LED units that are reverse biased turn off and block the flow of current. When the AC cycle reverses, the LED units that were previously on now turn off and the ones that were previously off now turn on. FIG. 10E shows one configuration that may be used for AC powering of the LED array, however this is not a limitation of the present invention and in other embodiments, other AC configurations may be used.

As was discussed in the Background of the Invention section, operation of conventional LEDs in their normal operating range results in a relatively lower luminous efficacy. For example, a Cree XP-E white LED may produce about 122 lumens when operated at about 3.5 volts and a current of about 0.5 A. Production of about 1000 lm would require 9 of these Cree XP-E lamps and the luminous efficacy would be about 70 lm/W, about half of that for the present invention. In another example, a Luminus Devices SST-90 white LED may produce about 700 lm when operated at about 3.1V and about 3.2 A. Two of these would be required to produce about 1000 lm (actual light output would be 1400 lm) with a luminous efficacy of about 70 lm/W. As has been discussed, the luminous efficacy values in actual operation may be less because of the high temperatures generated when operated in the normal operational range. For example, in the case of the Cree XP-E lamp, a maximum junction temperature of 70° C. would require the light output be derated to about 88% of its room temperature value. This would result in ten lamps being required for the 1000 lm light engine and a luminous efficacy of about 62 lm/W. In the comparison of the Cree XP-E lamps and the present invention, each system produces that same optical power, about 1000 lm, or about 3.3 watts of optical power. However, because of the large difference in luminous efficacy, the Cree system generates about 14 watts of heat while that of the present invention generates about 3 to about 6 watts.

Figure 2:
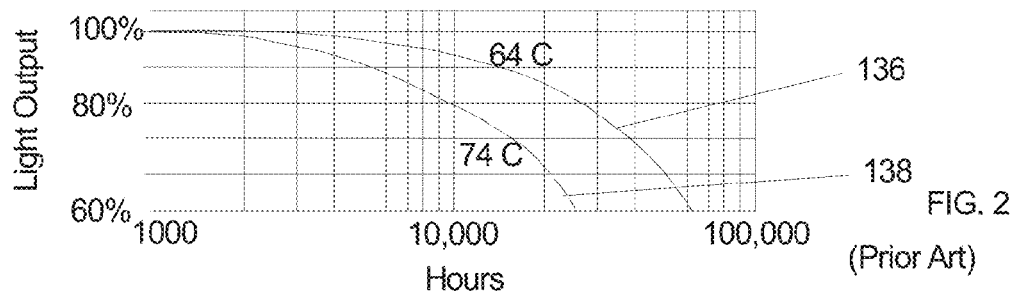
FIG. 2 shows a relationship between operating temperature and lifetime for LEDs.

The relatively much smaller heat generation in some embodiments of the present invention has a large number of benefits. These include a lower junction temperature, longer operating time, reduced thermal management requirements and cost, reduced color shift and simplified design, relaxed requirement for thermally stable phosphors and higher efficiency. Based on the higher luminous efficacy achieved in the present invention the junction temperature of the LED units in some embodiments of the present invention may be less than 75° C., or less than 65° C., or less than 55° C. As was discussed with reference to FIG. 2, lower junction temperatures translate to longer lifetimes. Lower heat levels may lead to simplified requirements for the thermal management system, heatsinking, etc. as well as reduced costs of these and related components.

Another aspect of heat management is related to the fact that all LEDs shift their output color with changes in temperature. These shifts are typically worse for AlInGaP materials than for nitride-based materials, but color shifts that may be visible to the human eye may occur in all LED materials. One cause of this type of color shift is an increase in the current or current density to change the light intensity. As the LED heats up the color shifts. This is in particular a problem in color mixing systems, for example when using red, green and blue LEDs, phosphor converted white LEDs and red LEDs or color mixing in phosphor converted systems. By operating at higher luminous efficacies, less heat is generated and thus less color shift occurs. Some conventional LED lamp or lighting systems employ sensors to detect the color and correction circuitry to change the intensity of various light emitting elements of the system to achieve a constant color output. Such a system may not be necessary using the light emitting device of the present invention. In addition to the color shift of directly emitted light from LEDs as a function of temperature, phosphor (or light other light conversion material) efficiency may also be a function of temperature and thus as the temperature increases the phosphor efficiency may decrease. The spectral characteristics of the phosphor may also change as a function of temperature. Thus in any systems comprising a phosphor or other light conversion material, color shifts may additionally occur from changes in the phosphor efficiency, changes in the phosphor spectral characteristics and/or changes in the combination of the light emitted directly by the LED and the phosphor (or other light conversion material).

In a first embodiment of this aspect of the present invention the plurality of LED units may comprise a plurality of packaged LEDs. In some embodiments of this aspect, the packaged LEDs may be mounted over or on a carrier, circuit board, a metal core circuit board or the like. The carrier may comprise portions for mounting of each packaged LED as well as conductive elements which may electrically couple the anode and cathode of each LED package to anodes and/or cathodes of other LED packages.

Some embodiments of this aspect of the present invention may also employ a light sensor that communicates with the driver or electronics to make relatively small adjustments to the power input (for example current input) to the LED array to ensure a relatively narrow distribution in the total luminous intensity from LED array to LED array or lamp to lamp. For example, in an LED array designed to provide about 1000 lm, some arrays may produce about 950 lm and some may produce about 1050 lm. In the former case the electronics may increase the input power to provide a luminous flux of about 1000 lm, while in the latter case the electronics may decrease the input power to provide a luminous flux of about 1000 lm.

The conventional LEDs (or LED packages) discussed above are comprised of a LED die in a package. The LED die and packages used in conventional LED lamps are designed to support high current and high temperature operation and thus are relatively expensive. The price for the Cree XP-E lamp in quantities of 1000 is about $4.40 each and thus the price for the LEDs alone (not counting a carrier or assembly costs) for such an array or light engine would be relatively expensive. For example, an array having 100 LEDs would have a cost of just the LEDs of about $440. Thus while such a light emitting device would have a relatively high luminous efficacy, its relatively high cost may not be acceptable in most applications.

In another aspect of this embodiment of the present invention, the packaged LEDs may comprise a relatively small LED die in a relatively inexpensive package. Such an aspect may have more packaged LEDs per light engine than in the previous example because in this case, each LED may emit less light than in the preceding example. In one example the LED package may comprise a surface mount package. In this embodiment it is important that the cost of the die and the package, as well as the means of mounting the packaged LEDs onto the carrier, circuit board, metal core circuit board or the like, be as inexpensive as possible.

In a second aspect of this embodiment of the present invention, the plurality of LED units may comprise a plurality of unpackaged LED die. In some embodiments of this aspect, the LED die may be mounted over a carrier, for example a circuit board, a metal core circuit board, a semiconductor wafer or other support structures. For example the LED die may be mounted over a carrier comprising silicon, aluminum nitride, silicon carbide, diamond, sapphire or other materials. The carrier may comprise portions for mounting of each packaged LED as well as conductive elements which may electrically couple the anode and cathode of each LED package to anodes and/or cathodes of other LED packages. In some embodiments it may be desirable for the carrier to have a high thermal conductivity.

In some embodiments of this aspect of the present invention, the LED die may be mounted over an electrically conductive carrier while in other embodiments the LED die may be mounted over a carrier that is electrically insulating. For example, a conductive carrier may comprise a metal such as aluminum or copper, silicon, conductive aluminum nitride or conductive silicon carbide. An insulating carrier may comprise, for example, glass, sapphire, insulating aluminum nitride or insulating silicon carbide. In some examples the carrier may be electrically conductive, with an electrically insulating film or material formed over all of or portions of the carrier and in some cases further electrically conductive elements may be formed over portions of or all of the electrically insulating film or material. In other examples the carrier may be electrically insulating, and electrically conductive elements may be formed over portions or all of the electrically insulating carrier.

Figure 11:
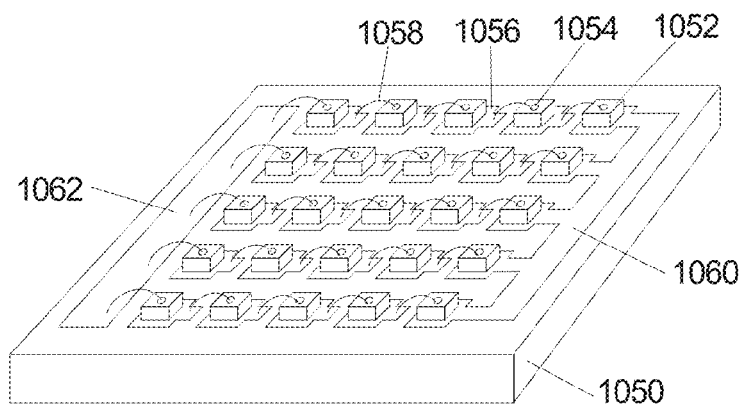
FIG. 11 is a schematic illustration of a structure of a light emitting device made in accordance with a first embodiment of the invention.

FIG. 11 is a schematic of one embodiment of this aspect of the present invention comprising a plurality of LED die 1052 formed over carrier 1050. LED die 1052 comprise a semiconductor chip, a bottom contact (not shown) and a top contact 1054. Carrier 1050 may comprise an electrically insulating material, for example silicon carbide, aluminum nitride, sapphire or silicon with a layer of silicon dioxide formed over it. First conductive elements 1056 may be formed over carrier 1050 and the bottom contact of LED die 1052 may be electrically coupled to first conductive elements 1056. In some embodiments LED die 1052 may be attached to first conductive elements 1056, for example using a solder or conductive epoxy or adhesive. In this example there are five parallel strings of LED die 1052, with each string comprising five LED die 1052 electrically coupled in series. However, this is not a limitation of the present invention and in other embodiments number of LED die 1052 and other series and parallel couplings may be utilized. The series connection is made by electrically coupling the bottom contact (not shown) of one LED 1052 to top contact 1054 of the adjacent LED die 1052 in the series string using a bonding wire 1058. Second conductive element 1060 and third conductive element 1062 may form contact areas through which electrical connection to the LED array is made.

In the example shown in FIG. 11 LED die 1052 are in part electrically coupled using bond wires 1058. In one example bond wires 1058 may comprise gold bond wires. However, this is not a limitation of the present invention and in other embodiments LED die 1052 may be electrically coupled using other coupling elements, for example using air bridges, evaporated conductive elements, buss bars, or other such coupling elements or combinations of such coupling elements.

In the example shown in FIG. 11, carrier 1050 is insulating. However this is not a limitation of the present invention and in other embodiments carrier 1050 may be electrically conductive.

In the example shown in FIG. 11, LED die 1052 are shown as cube shaped with a top and bottom contact. However this is not a limitation of the present invention and in other embodiments LED die 1052 may have any shape and may have contacts in any orientation, for example LED die 1052 may have two contacts on one side of the die.

In FIG. 11, LED die 1052 are shown in a regular periodic array, however this is not a limitation of the present invention and in other embodiments other configurations may be utilized.

LED die 1052 may be attached to carrier 1050 using, for example, solder, glue or adhesive. An example of a solder is an alloy of gold and tin. Adhesives may be electrically conductive, thermally conductive or both. In some embodiments of this aspect of the present invention the die may be mounted on or over carrier 1050 using a thermally and electrically conductive adhesive. In other examples LED die 1052 may be mounted over or on carrier 1050 using bonding techniques, for example thermocompression bonding. However this is not a limitation of the present invention and in other embodiments LED die 1052 may be mounted over or attached to carrier 1050 by any technique and with any attachment materials.

In some embodiments of this aspect of the present invention, one or more portions or all of carrier 1052 may be reflective to a wavelength of light emitted by LED die 1052. Such reflectivity may be achieved by choice of the material comprising carrier 1050 or by the application of a reflective coating over all of or portions of carrier 1052. For example a reflective coating may comprise silver, gold aluminum or the like. In some embodiments of this aspect of the present invention, the reflective coating may comprise a plurality of layers. In other examples the reflectivity may be achieved using a Bragg reflector.

Figure 12:
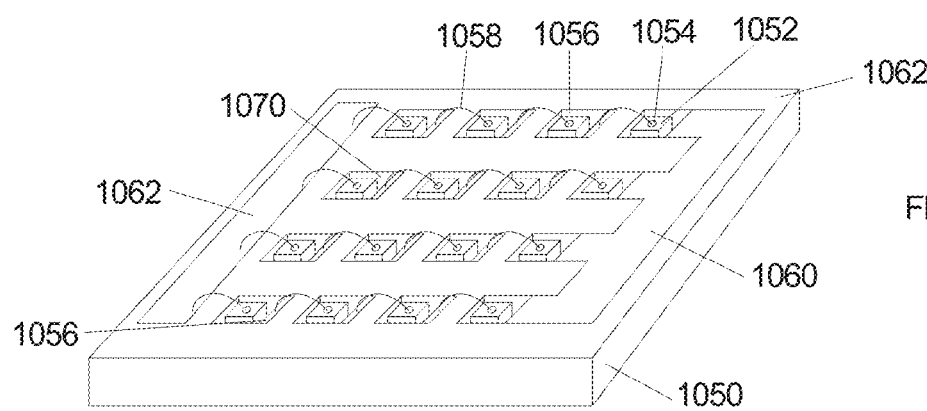
FIG. 12 is a schematic illustration of a structure of a light emitting device made in accordance with a second embodiment of the invention.

FIG. 12 is a schematic of another embodiment of this aspect of the present invention comprising a plurality of depressions 1070 in carrier 1050 into which one or more LED die 1052 may be positioned. Carrier 1050 may comprise an electrically insulating material, for example silicon carbide, aluminum nitride, sapphire of silicon with a layer of silicon dioxide formed over it. In some embodiments of this aspect of the present invention, a conductive element 1056 may be formed over a portion of or all of the surfaces of depression 1070 as well as a portion of or all of the surface of carrier 1050 The bottom contact (not shown) of LED die 1052 may be electrically coupled to first conductive element 1056. In some embodiments LED die 1052 may be attached to first conductive element 1056, for example using a solder or conductive epoxy or adhesive. In this example there are five parallel strings of LED die 1052, with each string comprising five LED die 1052 electrically coupled in series. The series connection is made by electrically coupling the bottom contact (not shown) of one LED 1052 to top contact 1054 of the adjacent LED die 1052 in the series string using bonding wire 1058. However, this is not a limitation of the present invention and in other embodiments other number of LED die 1052 and other series and parallel couplings may be utilized. Second conductive element 1060 and third conductive element 1062 may form contact areas through which electrical connection to the LED array is made.

In the example shown in FIG. 12 LED die 1052 are in part electrically coupled using bond wires 1058. In one example bond wires 1058 may comprise gold bond wires. However, this is not a limitation of the present invention and in other embodiments LED die 1052 may be electrically coupled using other coupling elements, for example using air bridges, evaporated conductive elements, buss bars, or other such coupling elements or combinations of such coupling elements.

In the example shown in FIG. 12, carrier 1050 is insulating. However this is not a limitation of the present invention and in other embodiments carrier 1050 may be electrically conductive.

In the example shown in FIG. 12, LED die 1052 are shown as cube shaped with a top and bottom contact. However this is not a limitation of the present invention and in other embodiments LED die 1052 may have any shape and may have contacts in any orientation, for example LED die 1052 may have two contacts on one side of the die.

LED die 1052 may be attached to carrier 1050 using, for example, solder, glue or adhesive. An example of a solder is an alloy of gold and tin. Adhesives may be electrically conductive, thermally conductive or both. In some embodiments of this aspect of the present invention the die may be mounted on or over carrier 1050 using a thermally and electrically conductive adhesive. In other examples LED die 1052 may be mounted over or on carrier 1050 using bonding techniques, for example thermocompression bonding. However this is not a limitation of the present invention and in other embodiments LED die 1052 may be mounted over or attached to carrier 1050 by any technique and with any attachment materials.

In some embodiments of this aspect of the present invention, one or more portions or all of carrier 1052 and/or a portion or all of depressions 1070 may be reflective to a wavelength of light emitted by LED die 1052. Such reflectivity may be achieved by choice of the material comprising carrier 1050 or by the application of a reflective coating over all of or a portion of carrier 1052. For example a reflective coating may comprise silver, gold aluminum or the like. In some embodiments of this aspect of the present invention, the reflective coating may comprise a plurality of layers. In other examples the reflectivity may be achieved using a Bragg reflector.

Depressions 1070 may have surfaces positioned such that light exiting from a portion or of LED die 1052 is reflected in a direction perpendicular to or substantially perpendicular to the surface 1062 of carrier 1050. For example, light emitted from the sides of LED die 1052 may be reflected in a direction perpendicular or substantially perpendicular to the surface 1062 of carrier 1050. In other embodiments, the surfaces of depressions 1070 may be oriented to reflect light in a particular direction.

In the example shown in FIG. 12, one LED die 1052 is positioned in each depression 1070. However, this is not a limitation of the present invention and in other embodiments, two or more LED die 1052 may be positioned in each depression 1070 and in some embodiments one or more depressions 1070 may not contain any LED die 1052. In FIG. 12, depressions 1070 are shown in a regular periodic array, however this is not a limitation of the present invention and in other embodiments other configurations may be utilized.

In the example shown in FIG. 12, the orientation of all of the surfaces of each depression is the same. However, this is not a limitation of the present invention and in other embodiments carrier 1050 may comprise sub-arrays of depressions, with each sub-array of depressions having different surface orientations. In one example the surface orientations of the plurality of sub-arrays of depressions may be oriented to achieve a wide spread of light from the LED array. In another example the surface orientations of the plurality of sub-arrays of depressions may be oriented to achieve a narrow spread of light from the LED array. However, this is not a limitation of the present invention and in other embodiments the LED array may comprise any number of sub-arrays of depressions with different surface orientations to achieve any arbitrary light distribution.

In the example shown in FIG. 12 the bottom surface (not shown) of depressions 1070 may be parallel or substantially parallel to surface 1062 of carrier 1050. However, this is not a limitation of the present invention and in other embodiments the bottom surface (not shown) of depressions 1070 may have any orientation relative to surface 1062 of carrier 1050 and in some embodiments, carrier 1050 may comprise sub-arrays of depressions, with each sub-array of depressions having bottom surface (not shown) orientations different from each other.

In FIG. 12 LED die 1052 are shown as being positioned within depressions 1070. However this is not a limitation of the present invention and in other embodiments depression 1070 may comprise a platform, a sloped platform or other means for positioning and orienting LED die 1052.

In FIG. 12, depression 1070 are shown as having a square cross section, however this is not a limitation of the present invention and in other embodiments, depression 1070 may be circular, hexagonal, triangular or any arbitrary shape. In FIG. 12, all depressions 1070 are shown as having the same shape, however this is not a limitation of the present invention and in other embodiments a first portion of depressions 1070 may have a first shape and a second portion of depressions 1070 may have a second shape.

Some embodiments of this aspect of the present invention may comprise an optional light conversion material (not shown in FIG. 11 or 12), for example an organic or inorganic phosphor or other material capable of absorption of a portion of the light emitted from LED die 1052 and re-emitting it at a different wavelength. In some embodiments of the present invention the light conversion material may comprise a down conversion material and in other embodiments light conversion material may comprise an up conversion material. In some embodiments of the present invention, the light conversion material may be suspended or embedded in a second material (not shown), and in some embodiments the second material may comprise a material with an index of refraction between that of the semiconductor material in LED die 1052 and air. In one example of this embodiment such second material may comprise for example an epoxy, gel, or resin with an index of refraction in the range of about 1.2 to about 1.7. Such a second material may act to reduce total internal reflection and increase the light extraction efficiency of the light engine. The light conversion material may be formed over all or a portion of LED die 1052 in the light engine. The light conversion material may be deposited by spinning, screen printing, ink jet printing, dispensing or the like; the method of deposition is not a limitation of the present invention. Some embodiments of this aspect of the present invention comprising recesses in the substrate, as exemplified in FIG. 12 may comprise a light conversion material that partially or completely or substantially completely covers or fills the remaining volume within the recesses. In some embodiments, all of the recesses may be covered or filled or partially covered or filled with a light conversion material but this is not a limitation of the present invention and in other embodiments, only a portion or none of the recesses may be covered or filled with a light conversion material.

In some embodiments of this aspect of the present invention, LED die 1052 may comprise a first portion of LED die 1052 and a second portion of LED die 1052, wherein said first and second portions of LED die 1052 may have different properties, for example they may emit with a different color.

In some embodiments of this aspect of the present invention, assembly may comprise assembly using conventional semiconductor packaging tools, for example tools that may automatically pick and place die at the proper location. However this is not a limitation of the present invention and in other embodiments other assembly techniques may be utilized. For example another assembly technique may comprise a keyed system wherein the individual die and their desired locations are keyed to attract each other, for example using electric charge, magnets, shapes, etc. Another example of an assembly technique may be fluidic assembly. In some embodiments of this aspect of the present invention wherein LED die 1052 may comprise a first portion of LED die 1052 and a second portion of LED die 1052, and wherein said first and second portions of LED die 1052 may have different properties, said first portion of LED die 1052 may be keyed differently than said second portion of LED die 1052, permitting controlled assembly of first and second portions of LED die 1052 in specific locations on carrier 1050 or in specific depressions 1070.

Some embodiments of this aspect of the present invention may comprise a light sensor that communicates with the electronics to make relatively small adjustments to the power input to the LED array to ensure a relatively narrow distribution in the total luminous intensity from LED array to LED array or lamp to lamp. For example, in an LED array designed to provide about 1000 lm, some arrays may produce about 950 lm and some may produce about 1050 lm. In the former case the electronics may increase the input power to provide a luminous flux of about 1000 lm, while in the latter case the electronics may decrease the input power to provide a luminous flux of about 1000 lm.

In a third aspect of this embodiment of the present invention, the plurality of LED units may comprise an array of LED units fabricated monolithically on a common substrate using batch semiconductor processes. At the end of the process, the substrate is separated into complete light engines. Each light engine provides the required amount of light for a particular application. The amount of light is varied by changing the number of LED units in the light engine at the design and manufacturing stage, rather than changing the current drive in the LEDs, as is done in conventional LED lamps. This batch processing approach results in the light engine of this aspect of the present invention costing relatively significantly less than a comparable light engine using conventional LEDs or LED die mounted on a carrier, as discussed above or a conventional LED lamp using individual packaged LEDs.

The lower cost of this aspect of the present invention comes from several factors. Conventional packaged LEDs are fabricated by first depositing a plurality of films forming the LED structure on a substrate. The LED is then fabricated, generally including forming electrical contacts to the p- and p-layers of the LED. Other processes may also take place, for example to improve current spreading or light extraction. The substrate is then singulated to form individual LED die, after which the LED die are placed into packages. It is to be understood that the foregoing explanation is a general one for purposes of description, and is not meant to represent the actual process used when making LED die or packaged LEDs.

In an embodiment of this aspect of the present invention, the steps as described above for prior art LED die are generally the same up to the on-wafer fabrication steps. However, in an embodiment of this aspect of the present invention the processing at the wafer level continues to fabricate the light engine, as will be described below, resulting in a plurality of complete light engines on each wafer at the completion of wafer processing. The wafer is then singulated, resulting in several hundred light engines, of which only one may be required for each lamp. Thus all of the "taking apart and putting back together" steps in the conventional LED lamp approach, for example including singulation of individual LED die, packaging of individual LED die, fabrication of the carrier or circuit board and mounting of the LED packages on the carrier or circuit board are eliminated, saving parts cost, assembly cost and assembly time.

Large diameter wafers permit fabrication of many light engines on a wafer. In the example given above for the present invention, using a square LED unit with a side dimension of about 350 µm and a spacing between LED units of about 50 µm, results in about 200 light engines on a 100 mm diameter substrate. Use of larger diameter wafers increases the number of light engines per wafer. As is the case with electronic integrated circuits, increasing the wafer diameter may result in a further reduction in the cost of each light engine. Using a 100 mm diameter wafer, the cost of the light engine of an embodiment of this aspect of the present invention may be able to be fabricated for about $5.00 or less. In comparison, conventional packaged high power LEDs cost in the range of about $2 to about $5 each, and thus a prior-art LED lamp having 10 such LEDs would have a cost of about $20 to about $50 just for the packaged LEDs. This does not include the cost of assembly or any other lamp parts. Thus the cost of the entire light engine of an embodiment of this aspect of the present invention (capable, for example, of outputting about 1000 lm) may be similar to the price of a couple packaged LEDs. However such a light engine may have a higher luminous efficacy as described herein.

The light engine of an embodiment of this aspect of the present invention may use about 2-3× more wafer area than the combined wafer area in conventional packaged LEDs for a similar light output. However, this cost occurs at the wafer level, which may be significantly less expensive than the cost of using packaged LEDs. A further cost savings comes from the fact that the light engine of the present invention is complete after singulation from the wafer, whereas in the prior art devices the individual LEDs have to be mounted and connected together on a carrier.

In prior art light emitting devices the packaged LEDs may be binned by luminous intensity, forward voltage and color by the manufacturer. In other words, every LED may have to be tested and then separated into groups or bins of like characteristics. Typically LEDs with relatively more desirable characteristics, for example a higher luminous intensity, have a higher price. Binning may be required because the manufacturing process does not have a suitably tight distribution and thus LEDs with a range of characteristics are produced on each wafer, from wafer to wafer, growth run to growth run, from fabrication run to fabrication run and from packaging run to packaging run. In addition to complicating the manufacture and use of such LEDs, binning adds to the cost of each LED.

LEDs are typically binned by peak wavelength, forward voltage and luminous intensity. This presents a problem for lamp manufacturers who use a plurality of these LEDs in a lamp to achieve a desired light output. When combining separately packaged LEDs, control and uniformity of the I-V characteristics becomes important, especially when LEDs are connected in parallel. In a parallel configuration with LEDs with well-matched I-V characteristics, each LED will draw substantially its equal share of the total current. For example if four LEDs are electrically coupled in parallel, then each LED, when their I-V characteristics are well matched, will draw about ¼ of the total current. However, if the I-V characteristics of the LEDs are not well matched, the LED with the lower turn on voltage will draw a disproportionately large share of the total current, emit relatively more light and have a relatively higher junction temperature. In this scenario the lifetime of the different LEDs may be different because of the relatively large current and junction temperature mismatch between them. Light uniformity also becomes an issue in this case, as the lamp uses only a relatively small number (10-20) of high-power LEDs. If the light output of a small percentage of the LEDs is relatively significantly different from the others, it is difficult to homogenize the light, resulting in a lamp with relatively dim and bright (hot) spots.

This effect becomes relatively more important at higher drive currents, where the I-V characteristics are relatively linear. In the LED discussed in reference to FIG. 3, if the difference in the I-V characteristics between two LEDs electrically coupled in parallel is about 5%, then the lower turn on voltage LED may have about a 25% higher current at a low operating voltage of about 2.5 V, compared to about a 38% higher current at a relatively high operating voltage of about 3.5V.

Because individual packaged LEDs have variability in their intensity (luminous efficacy), color and I-V characteristics, the LED manufacturers have to bin the LEDs, that is test and separate them into a number of categories, for use by lamp or luminaire manufacturers. This leads to a lower yield of packaged LEDs that meet the lamp manufacturer's specifications and thus higher costs. For example, a typical LED process may have 8 color bins, 3 flux bins and 4 forward voltage bins. If the a customer desires to specify a portion of the LEDs from each category, for example they will take 30% of the available color bins, 55% of the available flux bins and 70% of the available forward voltage bins, the best yield for this choice is only about 11% of the full distribution. Such a low yield is not commercially acceptable, and thus at this point in time, manufacturers are typically limited to selecting portions of only one, or perhaps two of the 3 bins. For example if a manufacturer prioritizes on color and accepts variations in forward voltage or flux, or a manufacturer prioritizes on flux and accepts variations in color and forward voltage, the expected yield from these selections increases to about 70% to about 80% of the full distribution (Jeffrey Perkins, Yole Development, "LED Manufacturing Technologies and Costs," DOE SSL Workshop, Fairfax, Va. April 2009). Thus, in the prior art approach, while the yield has increased, this is at the expense of the ability to specify all three characteristics of the packaged LEDs comprising the LED lamp.

Another aspect of the present invention related to reduction of costs associated with binning is the fact that less testing and sorting is required in some embodiments of the present invention. In some embodiments of the present invention, the light engine, comprising the array of LED units, may be tested instead of testing each LED unit individually. This results in a reduction in the number of devices to be tested by a factor of about 20 to about 100. In this embodiment of this aspect of the present invention the binning issue is addressed in three ways. First, all of the LED units in each array are fabricated at the same time from one epitaxial structure, minimizing epitaxial structure and fabrication-related differences. Second, on-wafer variations in each LED array are minimized because the LED array may cover only a relatively small portion of the area of the entire wafer, for example and area of about 5 mm by about 5 mm, or less than about 0.5 cm2 or less than about 0.25 cm2 and over this small an area the properties of the epitaxial structure and the fabrication process are relatively very uniform. Third, the LED units are driven at relatively low currents or in the part of I-V curve in which the change in current resulting from a given voltage change is relatively smaller than at high currents. Thus the forward voltage, light output and color variations for the LED units within each light engine are relatively much less than those from packaged LEDs, which may have come from different wafers, runs or manufacturing lots produced over a wide range of times. From a lamp perspective, the present invention eliminates forward voltage binning, because only one light engine is used per lamp.

In order to achieve widespread acceptance a light engine or light system must have an acceptably low first or purchase cost, and must have a low total cost of ownership. Conventional incandescent and fluorescent lamps have a relatively low first cost (in the range of about $0.60 to about $10). However, their total cost of ownership is relatively high because of their low luminous efficacy. Prior art LED lamps have a relatively much higher first cost (in the range of about $50 to about $125). So even though they have a relatively lower total cost of ownership, their acceptance is low because of the long payback time.

Figure 13:
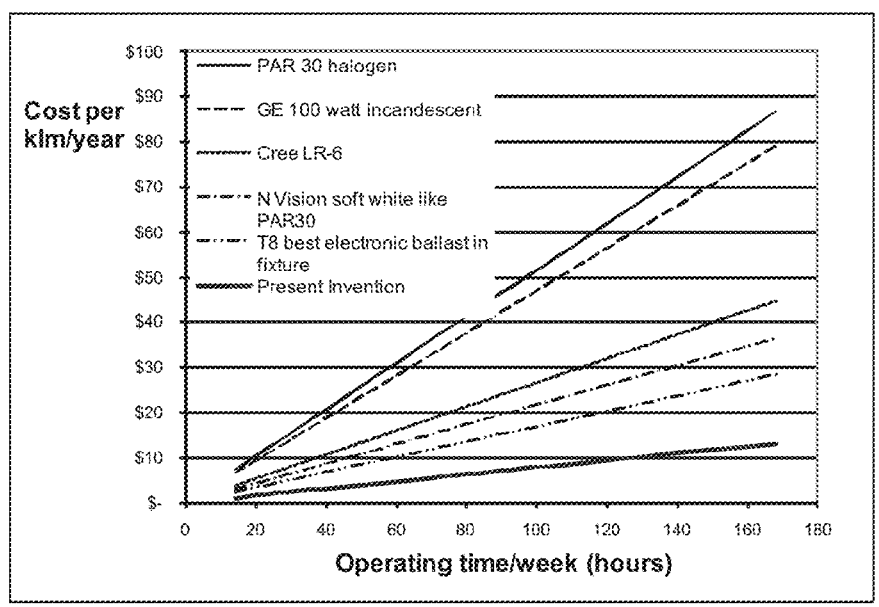
FIG. 13 shows the relationship of the cost of a kilolumen of light per year produced by different lighting technologies as a function of operating time per week.

A light engine of the present invention, utilizing a monolithically fabricated array of LED units operating at near peak efficiency may cost relatively significantly less to operate than both prior art LED systems and conventional lighting systems. FIG. 13 shows a graph showing the operating cost of a kilolumen (1000 lm) of light per year as a function of the operating time per week for a variety of lighting systems including an A19 incandescent lamp (1200 lumen, 100 watt lamp, $0.60), a PAR30 incandescent lamp (1000 lumen, 75 watt, $4.99), a CFL PAR-type lamp (640 lm, 12 watt, $3.50), a state of the art prior art LED lamp (Cree LR-6, 650 lm, 12 watt, $100), a state of the art T8 electronic ballast fluorescent lamp (14.3 watts, 1000 lm, $4.00) and a lamp using the light engine of the present invention (1000 lm, 10 watts, $20.00). At the low end of the scale, an operating time of about 14 hours per week represents an approximate average operating time in residential usage. On the high end, 168 hours represents continuous operation.

Figure 14:
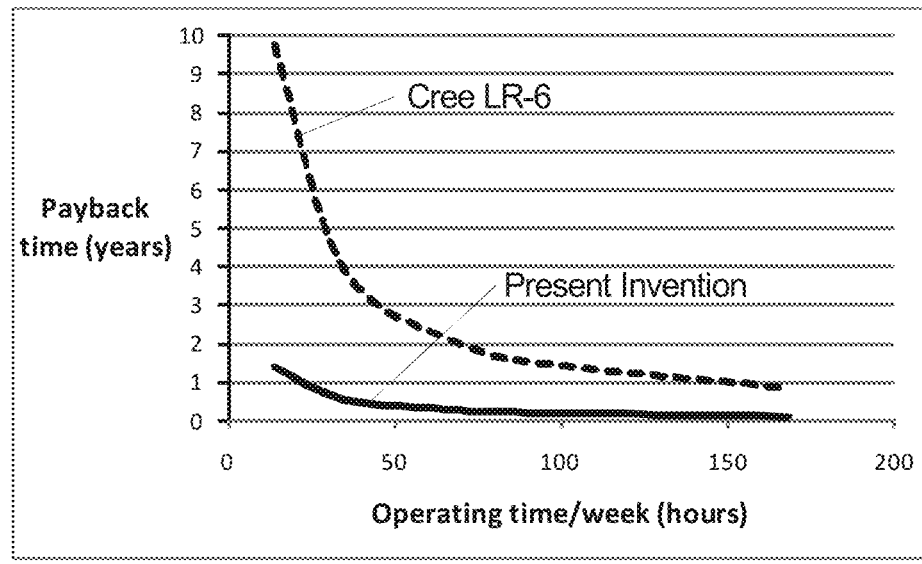
FIG. 14 shows payback time in years as a function of operating time for several LED lamps compared to an incandescent lamp.

FIG. 14 shows the payback time in years and electricity cost as a function of lamp operation time per week for a LED lamp using a monolithically fabricated light engine of the present invention compared to a conventional LED lamp. In residential use the payback time is about 1.4 years, which is about 7 times faster than state-of-the-art conventional LED lamps. Since an incandescent lamp in residential use has a lifetime of about 1.5 years, the 1.4 year payback time is substantially equivalent to one incandescent bulb lifetime.

The payback time calculation in the preceding paragraph is referenced to a PAR 30 incandescent lamp (1000 lm, $5 first or purchase cost and a lifetime of 1000 hr). The electricity cost is assumed to be about 14.7 ¢/kWh which is that for the state of CA. The payback time used here is an out-of-pocket payback time; it occurs when the cost of the LED lamp plus its electricity cost equals the cost of the incandescent lamp plus its electricity cost. This calculation includes the purchase of an additional incandescent lamp at the end of the payback time, to reflect the fact that going forward one would need a new lamp. This may be a more realistic and real-world calculation than one based on amortization of the LED lamp cost over its entire lifetime.

Another aspect of the present invention relates to the impact of the number of LED units within the array. An alternate configuration may be to use only one large LED unit operating at relatively low current density to achieve high luminous efficacy. However, there are several advantages over this approach that arise from the use of a larger array of smaller LED units.

First, one or a few very large LED units may have a lower luminous efficacy because of a reduced light extraction efficiency associated with a very large die. Light is guided within the epitaxial structure laterally and multiple small LEDs have a large number of edges to aid in breaking these modes and causing the light to exit the LED die. In a very large die, these edges do not exist and light may be trapped within the epitaxial structure for a much longer distance, resulting in more absorption, less emitted light and a lower luminous efficacy.

Second, one or a few very large LED units may have a lower yield than the yield of light engines comprised of a relatively large array of relatively small LED units. If a killer defect (one that prevents proper device operation, for example either making the LED non-operational or not meeting specifications) occurs in a light engine with one large LED unit, that LED unit is dead and so is the entire light engine. With a relatively large number of relatively small LED units, the same killer defect may prevent operation of one LED unit in the light engine but this will still permit operation of the light engine.

There are two significant kinds of killer defects; one that results in a shorted LED and one that results in an open LED. For LEDs in series or parallel, the shorted LED defect has the least impact, resulting in one less operational LED. The open LED defect has a larger impact on strings of LEDs in series; if one LED in a string is open, then no current can flow to any LEDs in that string. In spite of these differences, the impact of either of these types of killer defects is relatively significantly larger for a small number of LEDs.

Figure 15:
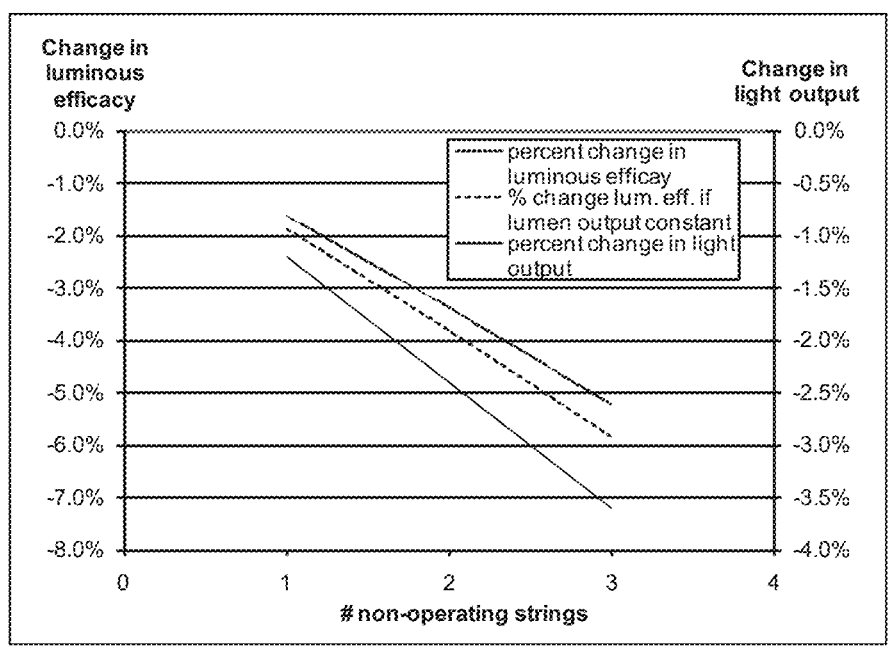
FIG. 15 shows the relationship between luminous efficacy and light output with different yield loss.

For example, if one LED unit in a light engine having 11 parallel strings of 11 LED units in series (121 total LED units) is not functional, then that one entire string of 11 LED units may not function. However, the current will divide up equally in the remaining 10 parallel strings, resulting in a relatively small increase in current in each LED unit. If each LED unit operates at 20 mA with a forward voltage of 2.9V and produces about 8.7 lm, then the total light output will decrease by only about 1.2% and the luminous efficacy of the light engine will decrease by only about 1.7%. In another embodiment of the present invention, a sensor may be used to detect the total light output and adjust the current to the remaining operating LEDs. In this case the total light output would remain the same and the luminous efficacy would decrease by about 1.9%. FIG. 15 is a graph showing the change in luminous efficacy and light output as a function of the number of non-operating strings of LEDs for this example (11×11 array of LED units). The dotted line shows the change in luminous efficacy as a function of non-operating strings with no current adjustment to maintain the same light output. The solid line shows the change in light output as a function of non-operating strings with no current adjustment to maintain the same light output. The dashed line shows the change in luminous efficacy as a function of non-operating strings when the current is adjusted to maintain the same light output. Even with two non-operating strings, the light output and luminous efficacy (with no correction) decrease by about 2.4% and 3.4% respectively. In contrast, with only one large LED unit, the entire light engine would be non-operational.

If the light engine comprised one or only a few relatively large LED units, the impact of one non-operational LED unit would be much more significant. For example, using the Luminus Devices LED data shown in FIGS. 1 and 3, two such LEDs operating at about 1.4 A each would produce about 1000 lm with a luminous efficacy of about 118 lm/W. If one of the LEDs becomes non-operational, the current in the remaining LED would increase to about 2.8 A, producing about 954 lm with a luminous efficacy of about 98 lm/W, about a 17% reduction in luminous efficacy and about a 4.6% decrease in light output (lm). Note that these values, especially the reduction in luminous efficacy, are much larger than those of the present invention. One may expect a further decrease in the luminous efficacy of the LED lamp in which these LEDs are used, because more heat is generated, resulting in a decrease in ηThermal.

This argument may also be applied to conventional LED lamps using packaged LEDs. In a prior-art LED lamp, the lamp comprises a relatively small number of high brightness LEDs. For example, a prior-art LED lamp may comprise about 12 to about 20 high brightness LEDs. Thus each LED in the lamp emits about 8.3% to about 5% of the total light output of the lamp. If one or more lamps fail, this will reduce the light output and may adversely affect other characteristics, for example luminous efficacy. For example, if all the LEDs in a conventional lamp are connected in series and one fails by shorting, the total LED voltage drops by about the value of the on-voltage of one LED. If two fail by shorting, the total LED voltage drops by about two times the value of the on-voltage of one LED. In this case the light output will decrease by about 8.3% and about 16.6% respectively, and the electronics/driver efficiency may drop because the total LED voltage has decreased. If all of the LEDs are connected in series and one fails open, then current cannot flow and the entire lamp has failed.

The reduction in luminous efficacy and light output for the present invention can be reduced further by changing the configuration of the LEDs units. Increasing the number of parallel strings while reducing the number of LED units in series causes the death of one LED string to have less of an impact. For example, an array of 12 parallel strings of 10 LED units in series would have a reduction of luminous efficacy and light output of 1.5% and 1.1% respectively if one string became non-operational. The limiting case of this would be to have all of the LED units in parallel, however this may have an adverse impact on the overall lamp luminous efficacy, as discussed below.

Figure 6:
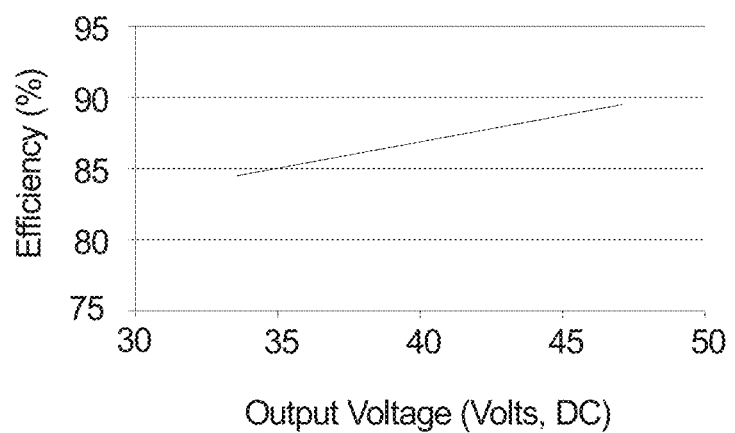
FIG. 6 shows the relationship between output voltage and efficiency for a LED driver.

Third, one or a few large LED units may have a reduced electronics or driver efficiency ηDriver. As was discussed with respect to FIG. 6, ηDriver is in part affected by the output voltage of the driver. If only one or a few very large LEDs are used in the LED lamp, the output voltage may be in the range of about 4 V to about 16V (for one to four LEDs). This results in large difference between the input voltage 120V and the output voltage, leading to a reduced ηDriver. Using the relatively large array of LED units of the present invention permits a relatively much higher output voltage, by putting more LED units in series, resulting in an increased ηDriver.

However, as was discussed previously, putting more LED units in series, and thus having less parallel strings, increases the impact of one or more non-operational LED units. Thus one approach may be to optimize the configuration to achieve the best efficiency and the least impact of a non-operational LED. In part this optimization will depend on the yield statistics from the manufacturing process.

Figure 16:
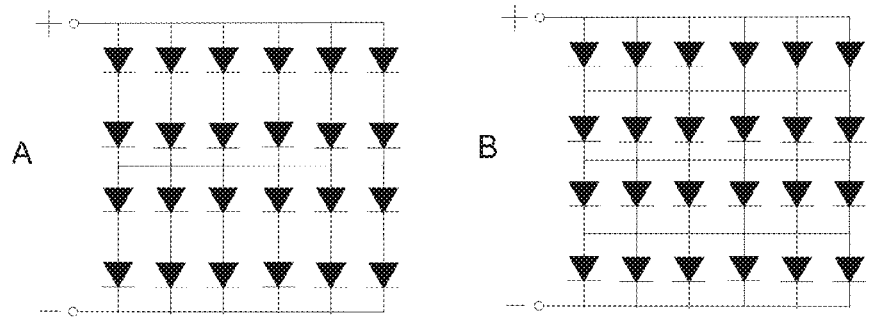
FIG. 16 is a schematic of examples of additional electrical configurations of arrays of LED in accordance with an embodiment of the invention.

Another approach to minimizing the impact of one or more non-operational LED units is to provide cross connection between parallel strings of LEDs as shown in FIG. 16. FIG. 16A shows one cross connection between all of the parallel strings of LED units, while FIG. 16B shows the most complete version of cross connection, in which every LED unit is cross connected. In the case corresponding to FIG. 16B, if one LED unit is non-operational, the current in the remaining LED units in that row will increase. In the example given above having 121 LED units, the current in the row comprising the non-operational LED unit may increase by about 10%. This may, for the light engine, result in an overall reduction in light output of about 0.11% and a reduction in luminous efficacy of about 0.26% respectively for one non-operational LED unit. The advantage of this approach is that it permits independent optimization of the configuration of the LED array for optimum electronics efficiency while achieving very low sensitivity to one or a few non-operational LED units.

Another aspect of an embodiment of the present invention is related to the etendue (etendue refers to how "spread out" the light is in area and angle) of the light emitting device. In a given lamp or fixture design, one can only capture all of the light from the light source if the etendue of the light source is below a certain value (that value depends on the optical design of the lamp or fixture). In other words, the smaller the etendue, or the more compact the light source, the easier it may be to use the light in an optical system and to minimize optical losses. In an embodiment of the present invention comprising a relatively compact light source, for example a monolithically fabricated light engine, the etendue of the light source may be relatively small, thus permitting easier, more efficient and more flexible use of such light source in lamps, fixtures and other lighting systems. For example a monolithically fabricated light engine of the present invention may have a light emitting area on the order of about 5 mm by about 5 mm which is relatively smaller and has a relatively smaller etendue than the light emitting area of tens of LEDs spread out over tens of centimeters of area of a circuit board or carrier in a conventional LED lamp.

Some embodiments of this aspect of the present invention may comprise a light sensor that communicates with the electronics driver to make relatively small adjustments to the drive current to the LED array to ensure a relatively narrow distribution in the total luminous intensity from light engine to light engine or lamp to lamp. For example, in an LED array designed to provide about 1000 lm, some light engines may produce about 950 lm and some may produce about 1050 lm. In the former case the electronics may increase the input power to provide a luminous flux of about 1000 lm, while in the latter case the electronics may decrease the input power to provide a luminous flux of about 1000 lm.

Accordingly several embodiments of a monolithically fabricated light engine of the present invention are described in further detail.

Figure 17:
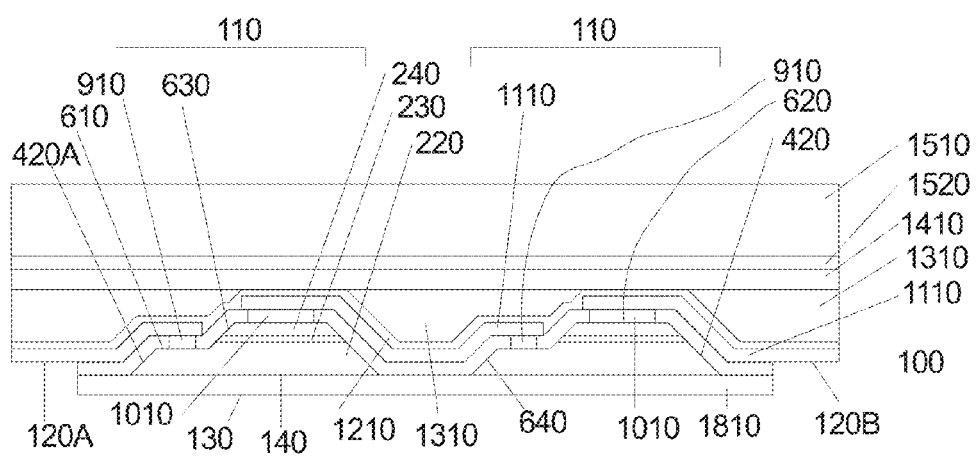
FIG. 17 is a cross-sectional view of a light emitting device made in accordance with a third embodiment of the invention taken along section line 17-17 of FIG. 18.

FIG. 17 is a cross-sectional view of a semiconductor structure 100 in accordance with an embodiment of the present invention. The semiconductor structure in FIG. 17 may be referred to as a monolithically formed light system or light engine. The monolithic light engine shown schematically in FIG. 17 comprises a carrier 1510, a plurality of LED units 110, a layer 1410 and a layer 1520 used to attach LED units 110 to carrier 1510, a filler material 1310, an optional light conversion material 1810, a layer 1210, a contact region 120A and a contact region 120B. Carrier 1510 may be referred to as a carrier, a substrate, a mechanical support, a heat sink or a first level heat sink. Layers 1410 and 1520 may be used to help attach LED units 110 to carrier 1510. LED units 110 may comprise a bottom confining region 220, an active region 230, a top confining region 240, a portion of layer 640, a bottom electrical contact 910, a top electrical contact 1010, a portion of interconnect layer 1110, a portion of filler material 1310 and a portion of layer 1210. Layer 1210 may be used to electrically isolate LED units from each other and from layers 1410, 1520 and carrier 1510.

Figure 18:
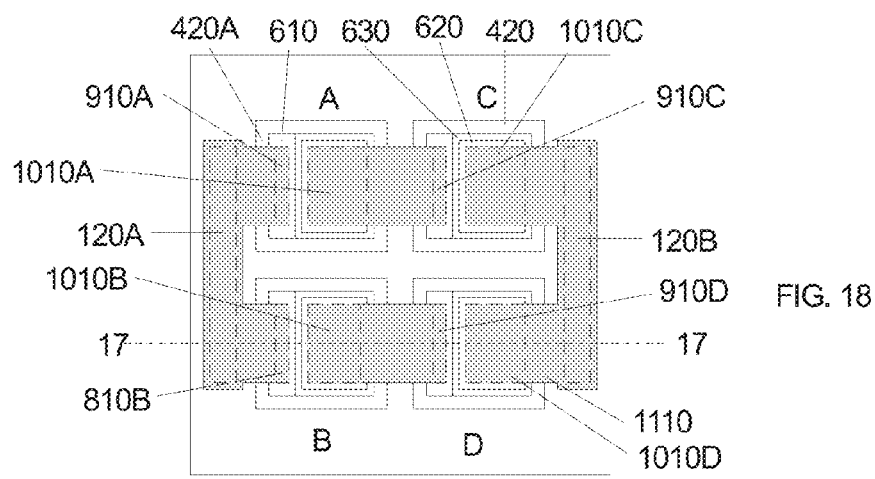
FIG. 18 is a view of the light emitting device of FIG. 17 from the side opposite the LED units.
Figure 19:
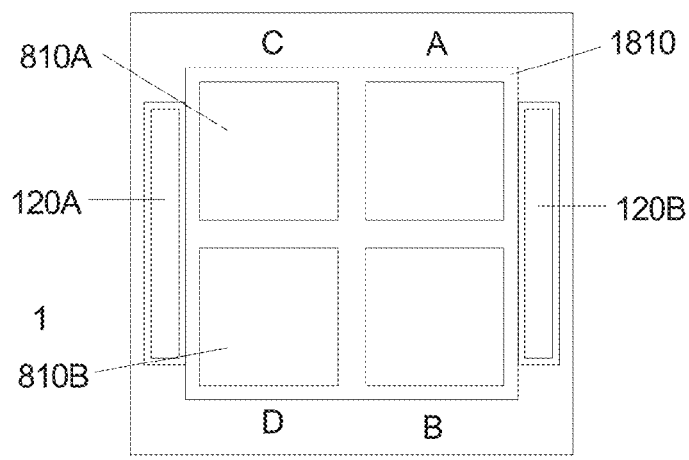
FIG. 19 is a view of the light emitting device of FIG. 17 from the side which emits light.

FIG. 18 is a view of the structure of FIG. 17 from the side of carrier 1510 opposite that of LED unit 110 in accordance with an embodiment of the present invention and FIG. 17 is a cross-sectional view taken along section line 17-17 of FIG. 18. In FIG. 18 carrier 1510, attachment layers 1520 and 1410, filler material 1310 and layer 1210 are not shown for clarity purposes. FIG. 19 is a view of the structure of FIG. 17 from the light emitting side, assuming for clarity purposes that light conversion material 1810 is transparent.

Figure 20:
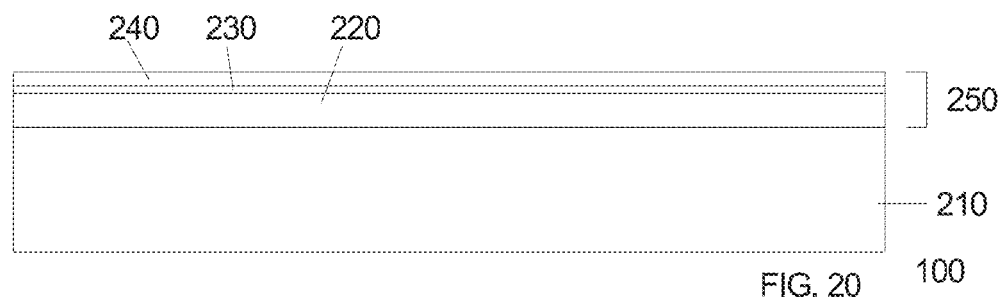
FIG. 20 is a cross-sectional view of a light emitting device at a beginning stage of manufacture in accordance with an embodiment of the invention.

Light is generated in active region 230 and exits LED unit 110 through surface 140 of bottom confining region 220, optional light conversion material 1810 and its surface 130. In some embodiments of the present invention light extraction features may be formed in or over surface 140 and/or surface 130 to improve the light extraction efficiency. In some embodiments of the present invention, light extraction features may comprise one or more anti-reflection coatings and/or surface roughening, texturing, patterning, imprinting or the like. In some examples such light extraction features may be formed in a regular periodic array, however this is not a limitation of the present invention and in other embodiments, light extraction features may be formed in a random or semi-random pattern. In some embodiments of the present invention light extraction features may be formed in or on the surface of substrate 210 (FIG. 20) on which layer structure 250 (FIG. 20) is to be formed, prior to formation of layer structure 250 (FIG. 20) or at the interface of substrate 210 (FIG. 20) and layer structure 250 (FIG. 20) or within layer structure 250 (FIG. 20) adjacent to substrate 210 (FIG. 20).

Some of the light generated in active region 230 may exit the active region into top confining region 240. Such light may be reflected from reflecting surfaces that reflect a wavelength of light emitted by the LED that are formed over portions of or all of top confining region 240. In some embodiments of the present invention reflecting surfaces may also be formed over portions of or all of active region 230 and bottom confining region 220. In some embodiments of the present invention, such reflecting surfaces may have a reflectivity greater than 80% to a wavelength of light emitted by the LED, or greater than 90% to a wavelength of light emitted by the LED, or greater than 95% to a wavelength of light emitted by the LED.

Optional light conversion material 1810 may comprise organic or inorganic phosphors or other materials capable of absorption of a portion or all of the light emitted from active region 230 and re-emitting it at a different wavelength. In some embodiments of the present invention light conversion material 1810 may comprise a down conversion material and in other embodiments light conversion material 1810 may comprise an up conversion material. In some embodiments of the present invention, optional light conversion material 1810 may be suspended or embedded in a second material (not shown), and in some embodiments the second material may comprise a material with an index of refraction between that of the material in layer structure 250 (FIG. 20) and air. In one example of this embodiment such second material may comprise for example an epoxy, gel, or resin with an index of refraction in the range of about 1.2 to about 1.7. Such a second material may act to reduce total internal reflection and increase the light extraction efficiency of the light engine.

LED units 110 are formed such that the heat-generating active regions 230 may be in close proximity to carrier/heat sink 1510, for example all or a portion of active regions 230 may be spaced less than 10 μm, or may be less than 5 μm, or may be less than 2 μm from the surface of carrier 1510 adjacent to attachment layer 1520. In other words, the combined thickness of attachment layer 1520, 1410, layer 1210, interconnect 1110, contact 1010 and top confining region 240 may be less than 10 μm, or may be less than 5 μm, or may be less than 2 μm.

Referring now to FIG. 18, FIG. 18 shows an example of semiconductor structure 100 comprising four (4) LED units 110. In FIG. 18 carrier 1510, attachment layers 1520 and 1410, filler material 1310 and layer 1210 are not shown, for clarity purposes, as discussed above. In this example the LED units 110 are configured as shown in FIG. 10A, comprising two parallel strings of LEDs, each string of LEDs comprising two LED units 110. In this example electrical connection to the negative polarity terminal of the light engine may be made through contact region 120A, which comprises a portion of interconnect layer 1110 that may be coupled to bottom electrical contact 910A and 910B of LED units A and B. Similarly, electrical connection to the positive polarity terminal of the light engine may be made through contact region 120B, which comprises a portion of interconnect layer 1110 that may be coupled to top electrical contact 1010C and 1010D of LED units C and D. Top electrical contacts 1010A and 1010B of LED units A and B respectively may be electrically coupled to bottom electrical contacts 810C and 810D of LED units C and D respectively through interconnect layer 1110. Note that in FIG. 18, all top electrical contacts 1010 and all bottom electrical contacts 910 are shown as dashed lines to indicate that they are underneath interconnect layer 1010.

FIG. 19 is a view of the structure of FIG. 18 from the light emitting side, assuming for clarity purposes that light conversion layer 1810 is transparent. The four LED units 110 (labeled A, B, C and D are visible, as are the contact regions 120A and 120B.

FIGS. 17 and 18 show an exemplary LED array with 4 LED units 110. However, the number of LED units 110 is not a limitation of the present invention and in some embodiments the LED array may comprise a larger numbers of LED units 110. In some embodiments of the present invention the number of LED units 110 in the array may be greater than 20, or may be greater than 50, or may be greater than 100 or may be greater than 250 or may be greater than 500.

FIG. 20 is a cross-sectional view of a semiconductor structure at a beginning stage of manufacture, in accordance with an embodiment of the present invention. FIG. 20 comprises substrate 210, bottom confining region 220 that may be formed over substrate 210, active region 230 that may be formed over bottom confining region 220 and top confining region 240 that may be formed over active region 230. FIG. 20 may be used as a starting wafer for the fabrication of semiconductor structures of the present invention. Substrate 210 may comprise a semiconductor material such as, for example, gallium arsenide (GaAs), gallium phosphide (GaP), indium phosphide (InP), sapphire, silicon carbide (SiC), aluminum nitride (AlN), ZnO, diamond, silicon or other semiconductors, and may be doped or undoped depending on the application, although the methods and apparatuses described herein are not limited in this regard. In other embodiments of the present invention, substrate 210 may comprise other materials such as, for example, glass, polymers or metals. Substrate 210 may have a thickness ranging from about 50 µm to about 2,000 µm, but this is not a limitation of the present invention and in other embodiments the substrate may have any thickness. The thickness of substrate 210 may be reduced through subsequent thinning processes in some embodiments. In some embodiments a portion or all of substrate 210 may be ultimately removed from the final structure. In some embodiments substrate 210 may comprise more than one material, for example a layer of one material formed over a second material. In one example such a substrate may comprise a zinc oxide layer (ZnO) layer formed over a non-crystalline substrate. Substrate 210 may be absorbing to or substantially transparent, or translucent at a wavelength of light generated by the light-emitting device.

Substrate 210 may have a diameter in the range of about 1" to more than about 12", however the diameter of substrate 210 is not a limitation of the present invention and in other embodiments substrate 210 may have any diameter. It may be desirable for substrate 210 to have a relatively large diameter, as this permits a larger number of LED arrays or light engines to be fabricated in a batch mode on a single substrate (at the wafer level). In some embodiments of the present invention substrate 210 may have a circular shape, like that often used for conventional semiconductor processing. However this is not a limitation of the present invention and in other embodiments substrate 210 may be square, rectangular or have any arbitrary shape.

In some embodiments bottom confining region 220 may be doped n-type and top confining region 240 may be doped p-type, but this is not a limitation of the present invention and in other embodiments each layer may be either n-type, p-type or undoped. In some embodiments bottom confining region 220 may have a thickness in the range of about 0.5 µm to about 10 µm. In some embodiments active region 230 may have a thickness in the range of about 5 angstrom (Å) to about 10,000 Å. In some embodiments top confining region 240 may have a thickness in the range of about 0.05 µm to about 5 µm. Together bottom confining region 220, active region 230 and top confining region 240 may be referred to as layer structure 250. In some embodiments of the present invention LED unit 110 may comprise a plurality of active regions 230 between confining layers 220 and 240. In some embodiments of the present invention, these separate active regions may emit at the same or different wavelengths.

In some embodiments of the present invention it may be desirable to minimize the thickness of layer structure 250. For example in some embodiments of the present invention, portions of layer structure 250 may be removed, resulting in steps in layer structure 250 and minimizing the thickness of layer structure 250 may simplify the processing steps, for example removal of portions of layer structure 250 and metallization over said steps, by reducing said step or steps height.

The structure shown in FIG. 20 comprises the layer structure 250 formed over substrate 210 and may be referred to as an LED epi wafer. Bottom confining region 220, top confining region 240 and/or active region 230 may each comprise one or more layers. Bottom confining region 220 and top confining region 240 may have a bandgap relatively larger than that of all or a portion of active region 230 or of the one or more layers comprising active region 230. In some embodiments of the present invention active region 230 may comprise one or more quantum wells and barriers. In some embodiments of the present invention active region 230 may comprise one or more layers of quantum dots, or quantum wires and barriers. As is well understood by those familiar with the art, additional layers may be present and this invention is not limited in this regard. Furthermore, the layers comprising layer structure 250 may be comprised of a wide range of materials, depending on the desired properties, and in particular, the emission wavelength of the LED.

In some embodiments of the present invention top confining region 240 may comprise a Distributed Bragg Reflector (DBR) (not shown) which may act as a mirror to light of a wavelength emitted by active region 230. In some embodiments of the present invention the DBR (not shown) may have a reflectivity of higher than about 70%, or higher than about 80%, or higher than about 90% to light of a wavelength emitted by active region 230 perpendicularly incident upon said DBR. In other embodiments of the present invention a DBR (not shown) may be formed over top confining region 240 or between top confining region 240 and active region 230.

In some embodiments of the present invention layer structure 250 may comprise epitaxial layers and be formed using techniques such as metal organic vapor phase epitaxy (MOVPE), molecular beam epitaxy (MBE), hydride vapor phase epitaxy (HVPE), liquid phase epitaxy (LPE), chemical vapor deposition (CVD) or the like. In some embodiments of the present invention layer structure 250 may comprise polycrystalline or amorphous layers and be formed using techniques such as chemical vapor deposition (CVD), evaporation, sputtering or the like. However this is not a limitation of the present invention and in other embodiments layer structure 250 may be formed by any means and may be single crystal, polycrystalline or amorphous.

In one example, in which the LED may emit red/orange/yellow light, substrate 210 may comprise GaAs, bottom confining region 220, active region 230 and top confining region 240 may comprise $Al_xIn_yGa_{1-x-y}P$, with x and y adjusted in each layer such that the bandgap of bottom confining region 220 and top confining region 240 are larger than the bandgap of the light emitting layer in active region 230. In some embodiments of this example substrate 210 may be doped n-type, bottom confining region 220 may be doped n-type and top confining region 240 may be doped p-type.

In another example, in which the LED may emit UV, blue or green light, substrate 210 may comprise sapphire, bottom confining region 220, active region 230 and top confining region 240 may comprise $Al_xIn_yGa_{1-x-y}N$, with x and y adjusted in each layer such that the bandgap of bottom confining region 220 and top confining region 240 are larger than the bandgap of the light emitting layer in active region 230. In some embodiments of this example substrate 210 may be doped n-type, bottom confining region 220 may be doped n-type and top confining region 240 may be doped p-type.

In another example, in which the LED may emit UV, blue or green light, substrate 210 may comprise Si, SiC, AlN, ZnO, diamond, glass or a polymer, bottom confining region 220, active region 230 and top confining region 240 may comprise $Al_xIn_yGa_{1-x-y}N$, with x and y adjusted in each layer such that the bandgap of bottom confining region 220 and top confining region 240 are larger than the bandgap of the light emitting layer in active region 230. In some embodiments of this example substrate 210 may be doped n-type, bottom confining region 220 may be doped n-type and top confining region 240 may be doped p-type.

In some embodiments of the present invention layer structure 250 may comprise one or more buffer layers (not shown in FIG. 20) formed between bottom confining region 220 and substrate 210, the purpose of which is to improve the quality of the subsequently formed bottom confining region 220, active region 230 and top confining region 240. In one example, in which the LED may emit UV, blue or green light and substrate 210 comprises sapphire, additional buffer layers may comprise a low temperature GaN or $Al_xGa_{1-x}N$ layer and a doped GaN layer. In some embodiments of this aspect of the present invention, layer structure 250 may further comprise an insulating layer (not shown) formed over a portion of the layers within layer structure 250 but below active region 230. Said insulating layer may result in process simplification because subsequent isolation of the individual LED units 110 by removal of a portion of layer structure 250 may only need to be done down to the optional insulating layer, thus reducing the step height in one or more steps formed in layer structure 250. Said insulating layer may comprise, for example, AlN or $Al_xGa_{1-x}N$, however this is not a limitation of the present invention and in other embodiments said insulating layer may comprise any material.

Figure 21:
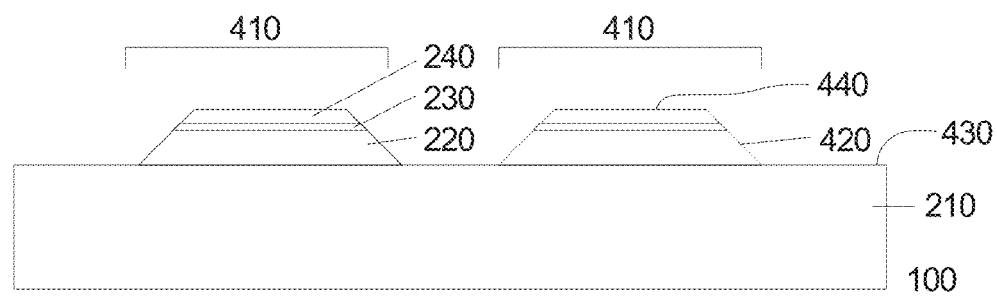
FIG. 21 is a cross-sectional view of the light emitting device of FIG. 17 at an early stage of manufacture and of an embodiment of the light emitting device of FIG. 20 at a later stage of manufacture and of a cross-sectional view of the light emitting device of FIG. 22 taken along section line 21-21 of FIG. 22.

FIG. 21 is a cross-sectional view of the structure of FIG. 20 at a later stage of manufacture. After formation of layer structure 250 (FIG. 20), layer structure 250 and substrate 210 may be patterned using photolithography and etching processes. Photolithography processes or operations involve the use of masks and may sometimes be referred to as masking operations or acts. The photolithography and etching may include forming a layer of a radiation-sensitive material, such as photoresist (not shown), over the semiconductor structure, then exposing the photoresist using, for example, ultraviolet ("UV") radiation, to form a mask, and then etching portions of layer structure 250 using an isotropic or anisotropic etch process such as, for example, wet chemical etching or a reactive ion etch ("RIE"), to form one or more mesas 410.

In some embodiments of the present invention one or more hard mask layer(s) (not shown) may be formed over layer structure 250 before patterning of layer structure 250. Since the photoresist over layer structure 250 is also etched as part of the etch used to etch portions of layer structure 250, a hard mask layer or layers may be used to prevent the undesired etching of the upper surface of layer structure 250 during the formation of mesa 410. One or more hard mask layers are optional, and in alternate embodiments, the photoresist layer may be made relatively thick such that it is not completely eroded during the formation process of mesa 410, and therefore, the photoresist may be used as a masking layer rather than using a hard mask layer. A hard mask layer may comprise, for example, a dielectric such as silicon dioxide ("SiO2") or silicon nitride ("Si3N4"), or a metal, such as nickel, titanium, aluminum, gold, chromium or the like.

Figure 22:
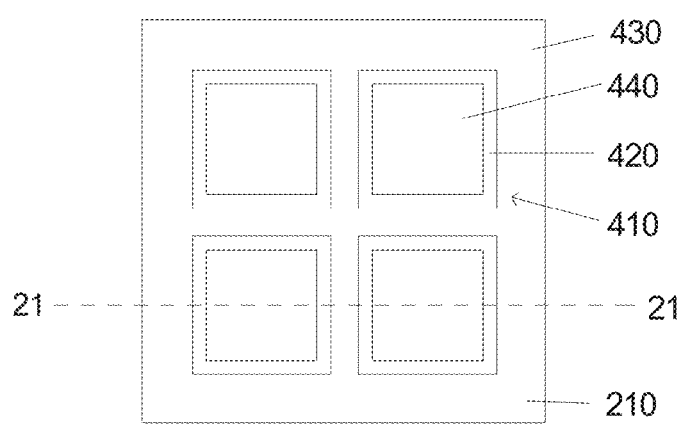
FIG. 22 is a top view of the light emitting device of FIG. 21.

Mesas 410 form LED units 110 as identified in FIGS. 17 and 18. FIG. 22 is a top view of the structure of FIG. 21 in accordance with an embodiment of the present invention and FIG. 21 is a cross-sectional view taken along section line 21-21 of FIG. 22. Referring to FIG. 22, mesas 410 are shown as having a square shape, however this is not a limitation of the present invention and in other embodiments mesa 410 may be rectangular, hexagonal, circular or any arbitrary shape. FIG. 22 shows all mesas 410 having the same shape, however this is not a limitation of the present invention and in other embodiments a plurality of shapes for mesa 410 may be employed. FIG. 22 shows each mesa 410 being spaced apart from adjacent mesas 410 an equal distance. However, this is not a limitation of the present invention and in other embodiments the spacing between mesas 410 may not be equal.

Mesas 410 have a top surface 440. In one example, mesa 410 may comprise a square and top surface 440 may have a length in the range of about 75 µm to about 1000 µm. In another embodiment mesa 410 may comprise a square and top surface 440 may have a length in the range of about 200 µm to about 500 µm. In some embodiments the spacing between mesas 410 may be uniform and be in the range of about 25 µm to about 10,000 µm. In another embodiment the spacing between mesas 410 may be uniform and be in the range of about 35 µm to about 200 µm.

In the example shown in FIG. 21, the etch depth (or the height of mesa 410) is equal to the thickness of layer structure 250. In other words, surface 430 is the same as the top surface of substrate 210. However this is not a limitation of the present invention and in other embodiments, the etch depth may be more or less than that of the thickness of layer structure 250. In an embodiment in which the etch depth is less than that of the thickness of layer structure 250, surface 430 may be formed on a portion of bottom confining region 220 or other optional layers as discussed above in reference to FIG. 20. In an embodiment in which the etch depth is more than that of the thickness of layer structure 250, surface 430 may be formed on a portion of substrate 210. As discussed above in reference to FIG. 20, it may be desirable to minimize the height of mesa 410 to simplify subsequent processing.

The sidewalls 420 of mesa 410 may be sloped as shown in FIG. 21 and have a slope in the range of about 20 degrees to about 75 degrees. However this is not a limitation of the present invention and in other embodiments sidewalls 420 of mesa 410 may have any angle with respect to surface 430, including perpendicular or substantially perpendicular to surface 430.

Figure 23:
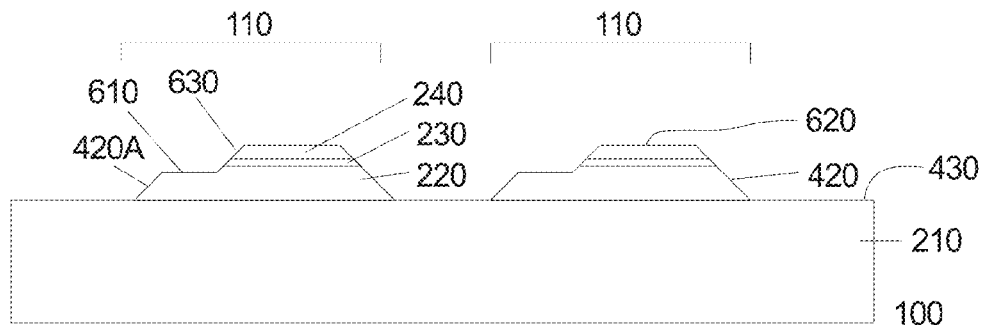
FIG. 23 is a cross-sectional view of the light emitting device of FIG. 21 at a later stage of manufacture, and a cross-sectional view of the light emitting device of FIG. 24 taken along section line 23-23 of FIG. 24.
Figure 24:
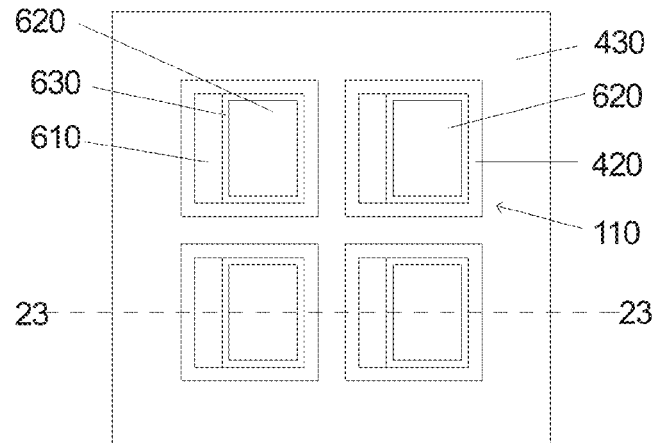
FIG. 24 is a top view of the light emitting device of FIG. 23.

FIG. 23 is a cross-sectional view of the semiconductor structure of FIG. 21 at a later stage of manufacture. FIG. 24 is a top view of the structure of FIG. 23 in accordance with an embodiment of the present invention and FIG. 23 is a cross-sectional view taken along section line 23-23 of FIG. 24. After formation of mesas 410 (FIG. 21), a portion of mesa 410 (FIG. 21) may be removed to expose a portion of bottom confining region 220 within mesa 410 (FIG. 21). As can be seen from FIG. 23, this results in surface region 610 of a portion of bottom confining region 220 and surface region 620 of a portion of top confining region 240. Surface region 620 may be formed from a portion of surface region 440 (FIG. 21) but this is not a limitation of the present invention and in other embodiments surface region 620 may not be formed from a portion of surface region 440 (FIG. 21). As is discussed above with respect to mesa 410 (FIG. 21), the removal of a portion of mesa 410 (FIG. 21) may be formed using photolithography and etching processes. At this stage of manufacture and in subsequent stages, mesa 410 may be referred to as LED unit 110 (FIG. 17).

Referring to FIG. 24, surface regions 610 and 620 are shown as having a rectangular shape, however this is not a limitation of the present invention and in other embodiments surface regions 610 and 620 may be square, hexagonal, circular or any arbitrary shape. As will be discussed later, the shape of mesa 410 (FIG. 21) and LED unit 110 and surface regions 610 and 620 may be configured for optimal device performance, particularly with respect to current spreading and light extraction. FIG. 24 shows all surface regions 610 having the same shape and all surface regions 620 having the same shape, however this is not a limitation of the present invention and in other embodiments a plurality of shapes for surface regions 610 and 620 may be employed. FIG. 24 shows each surface region 610 and 620 being positioned in the same location on LED unit 110, however this is not a limitation of the present invention and in other embodiments surface regions 610 and 620 may be positioned differently on different LED units 110. In some embodiments the area of surface region 620 may be larger than the area of surface region 610, however this is not a limitation of the present invention and in other embodiments the area of surface region 620 may be smaller than the area of surface region 610.

In some embodiments of the present invention LED unit 110 may comprise a plurality of surface regions 610 and/or surface regions 620. In some embodiments of the present invention different surface regions 610 and 620 may have the same or different shapes and areas within an individual LED unit 110. The number of surface regions 610 and 620 within mesa 410, as well as their shapes and areas may be configured to achieve optimal LED performance, for example to achieve relatively high current spreading uniformity or to achieve relatively high luminous intensity, and is not a limitation of the present invention. In some embodiments of the present invention, the LED array may comprise a plurality of LED units 110 where one or more LED units 110 may have different shapes and/or areas and/or different numbers of surface regions 610 and/or 620.

The difference in height between surface region 610 and surface region 620 is sufficient such that all of top confining region 240 and all or most of all of active region 220 may be removed over surface region 610. In one example surface region 610 is within bottom confining region 220.

A sidewall 630 is formed during the etching process. Sidewall 630 may be sloped as shown in FIG. 23 and have a slope in the range of about 20 degrees to about 75 degrees. However this is not a limitation of the present invention and in other embodiments sidewall 630 may have any angle with respect to surface 430, including perpendicular or substantially perpendicular to surface 430. In the example shown in FIG. 23, sidewall 630 is shown as having the same or substantially the same slope as sidewall 420, however this is not a limitation of the present invention and in other embodiments sidewall 630 may have a slope different from the slope of sidewall 420. After removal of a portion of mesa 410 (FIG. 21), a reduced portion of sidewall 420 may remain on a portion of mesa 410 (FIG. 21), hereinafter referenced as sidewall 420A.

After removal of a portion of mesa 410 (FIG. 21) and formation of surface regions 610 and 620, layer 640 may be formed over surface 430, sidewalls 420, 420A and 630 and surface regions 610 and 620. In some embodiments layer 640 may comprise an electrical insulator, however this is not a limitation of the present invention and in other embodiments layer 640 may comprise a conductor or a semiconductor. Layer 640 may comprise, for example, a dielectric material such as silicon dioxide or silicon nitride or a polymer material, for example polyimide or BCB. Layer 640 may have a thickness ranging from about 50 Å to about 10,000 Å. In other embodiments layer 640 may have a thickness ranging from about 100 Å to about 1,000 Å.

In some embodiments of the present invention layer 640 may be formed using techniques such as evaporation, sputtering, chemical vapor deposition (CVD), low pressure chemical vapor deposition (LPCVD), oxidation, spin deposition or the like.

Figure 25:
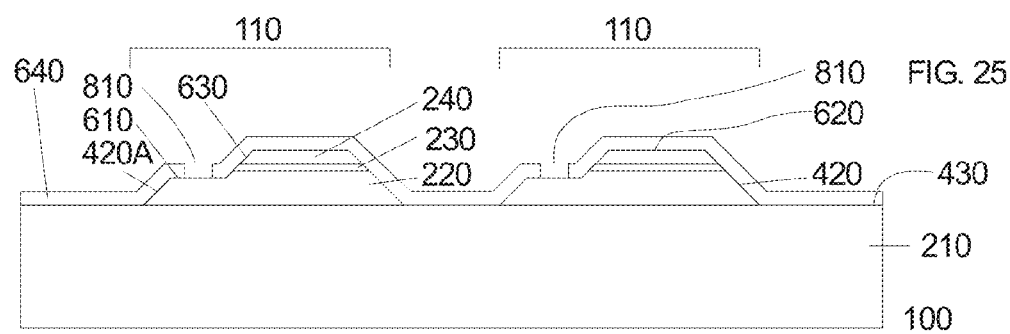
FIG. 25 is a cross-sectional view of the light emitting device of FIG. 23 at a later stage of manufacture.

FIG. 25 is a cross-sectional view of the semiconductor structure of FIG. 23 at a later stage of manufacture. After formation of layer 640, layer 640 may be patterned using photolithography and etching processes to form openings 810 in layer 640, exposing portions of bottom confining region 220. In some embodiments the width of openings 810 may be in the range of about 2 μm to about 25 μm, but this is not a limitation of the present invention and in other embodiments the width of opening 810 may be any width.

Figure 26:
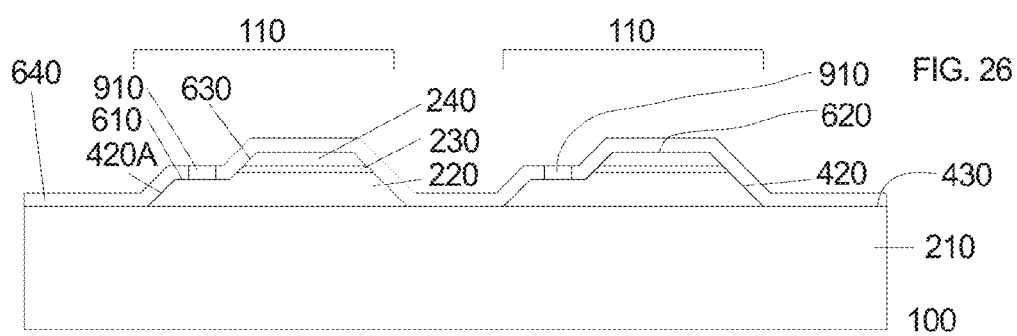
FIG. 26 is a cross-sectional view of the light emitting device of FIG. 25 at a later stage of manufacture.

FIG. 26 is a cross-sectional view of the semiconductor structure of FIG. 25 at a later stage of manufacture. After formation of openings 810, bottom electrical contact 910 to bottom confining region 220 may be formed in and/or over openings 810 using well-known semiconductor processes. Bottom electrical contact 910 may also be referred to as a bottom contact. For example, in some embodiments, bottom electrical contact 910 may be formed using a lift-off process in which the semiconductor structure of FIG. 25 is patterned using photolithography, the contact material comprising bottom electrical contact 910 is formed over the photoresist (not shown) and the portions of bottom confining region 220 exposed by openings 810 (FIG. 25), the photoresist is removed along with the contact material formed over the photoresist, leaving contact material only in openings 810, as shown in FIG. 24, thus forming bottom electrical contact 910. In another example, bottom electrical contact 910 may be formed by depositing the contact material comprising bottom electrical contact 910 over the entire semiconductor structure shown in FIG. 23, patterning the contact material using photolithography with a pattern that leaves the contact material in openings 810 (FIG. 25) covered with photoresist, removing the exposed contact material and removing the resist over the material of bottom electrical contact 910 in openings 810 (FIG. 25), thus forming bottom electrical contact 910. These examples are meant to be illustrative and other techniques for contact deposition may be used as well.

The example shown in FIG. 26 shows bottom electrical contact 910 formed only within opening 810 (FIG. 25). However, this is not a limitation of the present invention and in other embodiments bottom electrical contact 910 may extend beyond the edges of openings 810 (FIG. 25), or may not completely fill openings 810 (FIG. 25).

Bottom electrical contact 910 may comprise one or more layers. Bottom electrical contact 910 may comprise metals, silicides or other conductive materials. The specific material(s) used for bottom electrical contact 910 will depend on the specific semiconductors in layer structure 250 (FIG. 20). For example, where layer structure 250 (FIG. 20) may comprise GaAs- or GaP-based semiconductors, bottom electrical contact 910 may comprise Au, Au/Ge or Au/Ge/Ni. For example, where layer structure 250 (FIG. 20) may comprise GaN-based semiconductors, bottom electrical contact 910 may Ti/Al. In some embodiments the thickness of bottom electrical contact 910 may be in the range of about 500 Å to about 5000 Å, but this is not a limitation of the present invention and in other embodiments bottom electrical contact 910 may be any thickness. In some embodiments of the present invention bottom electrical contact 910 may be formed using techniques such as evaporation, sputtering, chemical vapor deposition (CVD), low pressure chemical vapor deposition (LPCVD), oxidation, spin deposition or the like.

Figure 27:
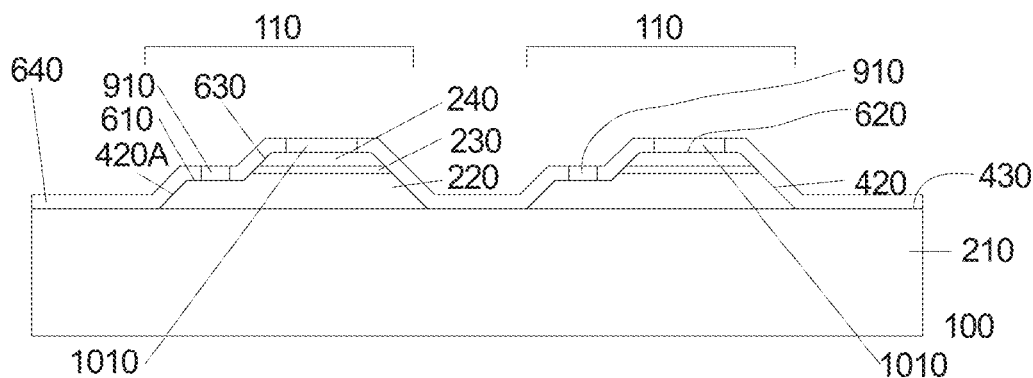
FIG. 27 is a cross-sectional view of the light emitting device of FIG. 26 at a later stage of manufacture.

FIG. 27 is a cross-sectional view of the semiconductor structure of FIG. 26 at a later stage of manufacture. After formation of bottom electrical contact 910, top electrical contact 1010 to top confining region 240 may be formed in a manner similar to that used to form bottom electrical contact 910 discussed above and using well-known semiconductor processes. In other words, layer 640 may be patterned using photolithography and etching processes to form openings (not shown) in layer 640, exposing portions of top confining region 240 and forming top electrical contact 1010 in the openings (not shown) in layer 640. Top electrical contact 1010 may also be referred to as a top contact.

The example shown in FIG. 27 shows top contact 1010 only within the opening in layer 640, however, this is not a limitation of the present invention and in other embodiments top contact 1010 may extend beyond the edges of the opening in layer 640, or may not completely fill the opening in layer 640.

As discussed above with respect to bottom electrical contact 910, top electrical contact 1010 may comprise one or more layers and may comprise metals, silicides or other conductive materials. The specific material(s) used for top electrical contact 1010 will depend on the specific semiconductors in layer structure 250 (FIG. 20). For example, in the example where layer structure 250 (FIG. 20) may comprise GaN-based semiconductors, top electrical contact 1010 may comprise Ni/Au. In some embodiments the thickness of top electrical contact 1010 may be in the range of about 200 Å to about 5000 Å, but this is not a limitation of the present invention and in other embodiments contact material 1010 may be any thickness. In some embodiments of the present invention top electrical contact 1010 may be formed using techniques such as evaporation, sputtering, chemical vapor deposition (CVD), low pressure chemical vapor deposition (LPCVD), oxidation, spin deposition or the like.

In the example shown in FIG. 27 bottom electrical contact 910 and top electrical contact 1010 are shown in the same location in each LED unit 110 (FIG. 17). However, this is not a limitation of the present invention and in other embodiments bottom electrical contact 910 and top electrical contact 1010 may each have different positions on all or some of LED units 110 (FIG. 17).

In the example shown in FIG. 27 bottom electrical contact 910 and top electrical contact 1010 are shown as having the same rectangular shape in each LED unit 110 (FIG. 17). However, this is not a limitation of the present invention and in other embodiments bottom electrical contact 910 and top electrical contact 1010 may each have different shapes, for example a square or circle or any arbitrary shape, or may each have different shapes on all or some of LED units 110 (FIG. 17). Furthermore, in some embodiments of the present invention, bottom electrical contact 910 and/or top electrical contact 1010 may have different geometries than that shown in FIG. 27 (rectangular), for example they may comprise a serpentine or annular geometry or one contact may enclose or partially be interleaved with another or any other geometry.

In some embodiments of the present invention LED unit 110 may comprise one bottom electrical contact 910 and one top electrical contact 1010. However, this is not a limitation of the present invention and in other embodiments LED unit 110 may comprise a plurality of bottom electrical contacts 910 and/or a plurality of top electrical contacts 1010. In some embodiments of the present invention, the number of bottom electrical contacts 910 may be less than, equal to or larger than the number of surfaces 610 within a single LED unit 110. In some embodiments of the present invention, the number of top electrical contacts 1010 may be less than, equal to or larger than the number of surfaces 620 within a single LED unit 110.

In some embodiments of the present invention in which LED unit 110 comprises a plurality of bottom electrical contacts 910 and/or a plurality of top electrical contacts 1010, each bottom electrical contact 910 and each top electrical contact 1010 may have the same shape, size and area. However this is not a limitation of the present invention and in other embodiments in which LED unit 110 comprises a plurality of bottom electrical contacts 910 and/or a plurality of top electrical contacts 1010, each bottom electrical contact 910 and/or each top electrical contact 1010 may have a different shape, size or area.

In some embodiments of the present invention, one or more heat treatments may be required to achieve acceptable ohmic contact between top electrical contact 1010 and top confining region 240 and between bottom electrical contact 910 and bottom confining region 220. Acceptable ohmic contact may mean a specific contact resistance of less than 1E−3 Ω-cm2, or less than 1E−4 Ω-cm2. Such heat treatments may be performed, for example, in a furnace, on a hot plate, in a rapid thermal anneal system or the like. Annealing temperatures may range from about 300° C. to about 800° C., however the method and time and temperature of the anneal process are not limitations of the present invention and in other embodiments, other annealing methods, temperatures or temperature profiles, or times may be used. In some embodiments of the present invention, the anneal process for bottom electrical contact 910 may be performed prior to the formation of top electrical contact 1010. In other embodiments of the present invention, top electrical contact 1010 may be formed and annealed before formation and anneal of bottom electrical contact 910. In all cases, it is important to note that the first-formed contact will also receive the anneal process from the second-formed contact. In some embodiments of the present invention, one anneal step may be carried out after formation of both bottom electrical contact 910 and top electrical contact 1010. Annealing may be done in an inert ambient, for example nitrogen, a reducing ambient, for example forming gas, or any other ambient; the annealing ambient is not a limitation of the present invention.

In some embodiments of the present invention, it may be desirable to minimize the annealing temperature and/or time or to eliminate the annealing altogether, for example when top contact 1010 and/or bottom contact 910 also act as a mirror (discussed below). In this example, reduced annealing temperatures and/or elimination of the annealing step or steps altogether may provide a higher reflectivity to a wavelength of light emitted by the light-emitting device.

In some embodiments of the present invention bottom electrical contact 910 and top electrical contact 1010 may be formed from the same material in the same series of process steps. For example, openings 810 (FIG. 25) in layer 640 (FIG. 25) for bottom electrical contact 910 (FIG. 26) and openings in layer 640 (not shown) for top electrical contact 1010 (FIG. 27) may be formed in one step, followed by formation of bottom electrical contact 910 and top electrical contact 1010 in one set of steps from the same material or materials.

Figure 28:
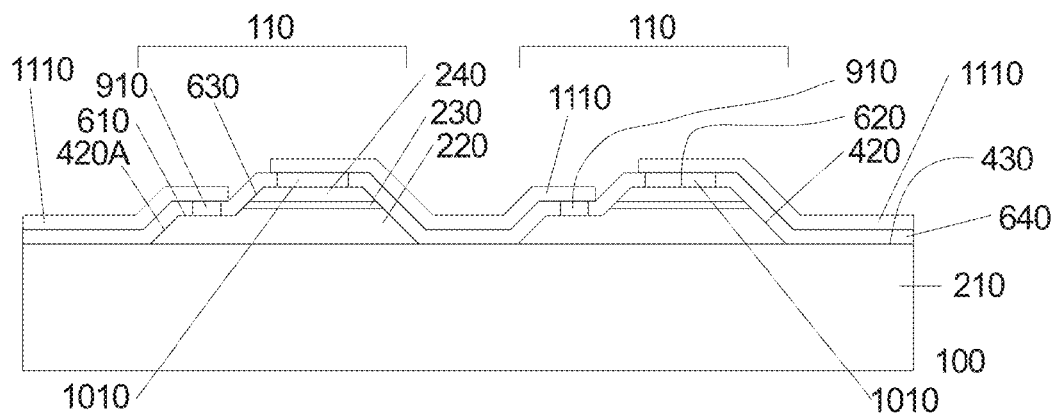
FIG. 28 is a cross-sectional view of the light emitting device of FIG. 27 at a later stage of manufacture.

FIG. 28 is a cross-sectional view of the semiconductor structure of FIG. 27 at a later stage of manufacture. After formation of top contact 1010, interconnect layer 1110 may be formed in a manner similar to that used to form bottom electrical contact 910 and top electrical contact 1010 discussed above and using well-known semiconductor processes. In other words, the material comprising interconnect layer 1110 may be patterned using photolithography and etching processes to couple top electrical contacts 1010 and bottom electrical contacts 910 as desired and to form terminals 120A (FIG. 17) and 120B (FIG. 17). Top contact 1010 and bottom contact 910 of individual LED units 110

(FIG. 17) may be coupled in any way, as was discussed previously; the connection topology is not a limitation of the present invention. For example, in some embodiments of the present invention, the individual LED units 110 (FIG. 17) may be coupled in series as shown in FIG. 10C, in parallel as shown in FIG. 10B or a combination of series and parallel connections as shown in FIG. 10D. In some embodiments, a portion or all of the individual LED units 110 (FIG. 17) may be coupled anode to cathode as shown in FIGS. 10A to 10D while in other embodiments contact regions 120A and 120B may each have both one or more anodes and one or more cathodes of individual LED units 110 (FIG. 17) coupled to them as shown in FIG. 10E, and in other embodiments, a combination of these types of couplings may be utilized. In the example shown in FIG. 17, the LED light engine comprises two strings of individual LED units 110 coupled in parallel, with each string comprising two individual LED units 110 coupled in series as shown in FIG. 10A.

In some embodiments of the present invention interconnect 1110 may be formed using techniques such as evaporation, sputtering, chemical vapor deposition (CVD), low pressure chemical vapor deposition (LPCVD), oxidation, spin deposition or the like. In some embodiments of the present invention interconnect 1110 may comprise more than one layer. Interconnect 1110 may have a thickness in the range of about 0.05 µm to about 1.0 µm, however this is not a limitation of the present invention and in other embodiments, layer 1110 may have any thickness.

In some embodiments of the present invention bottom electrical contact 910 and/or top electrical contact 1010 may comprise a material that also acts as a mirror for light of a wavelength generated by the LED to which it is attached, reflecting light back from the contacts and out through surface 140 (FIG. 17). In yet additional alternative embodiments, bottom electrical contact 910 and/or top electrical contact 1010 may comprise a material that acts as a mirror and one or more additional mirror layers (not shown) may be formed over all of or portions of back electrical contact 910 and/or top electrical contact 1010. In these embodiments, the additional mirror may extend beyond bottom electrical contact 910 and top electrical contact 1010 and cover portions of or all of the additional surfaces of individual LED units 110 and the regions between individual LED units 110. In some embodiments interconnect 1110 may comprise a material that also acts as a mirror for light of a wavelength generated by the LED to which it is attached. In some embodiments, materials that act as a mirror for light of a wavelength generated by the LED to which it is attached may be formed over portions of or all or substantially all surfaces of LED units 110 and all regions in between LED units 110. In some embodiments of the present invention, all or portions of the material comprising top electrical contact 1010 and/or bottom electrical contact 910 may be left in place outside of openings 810 (FIG. 25) and the opening for top electrical contact 1010 (not shown) to form a mirror over all or portions of the semiconductor structure.

Mirrors envisioned for use in the embodiments of the present invention comprise a reflective surface that reflects light of a wavelength emitted by the LED. In embodiments where the mirror is not formed by bottom electrical contact 910 and/or top electrical contact 1010 and/or interconnect 1110, exemplary mirrors may comprise a Bragg reflector, or may comprise a metal or metal alloy thin film, for example made up of one or more of the following materials: Au, Ag, Pt, Pd, Ti, and/or Ni, or alloys thereof. However, it should be recognized that numerous methods and materials can be used to make satisfactory mirrors, and these examples do not represent limitations on the invention.

Figure 29:
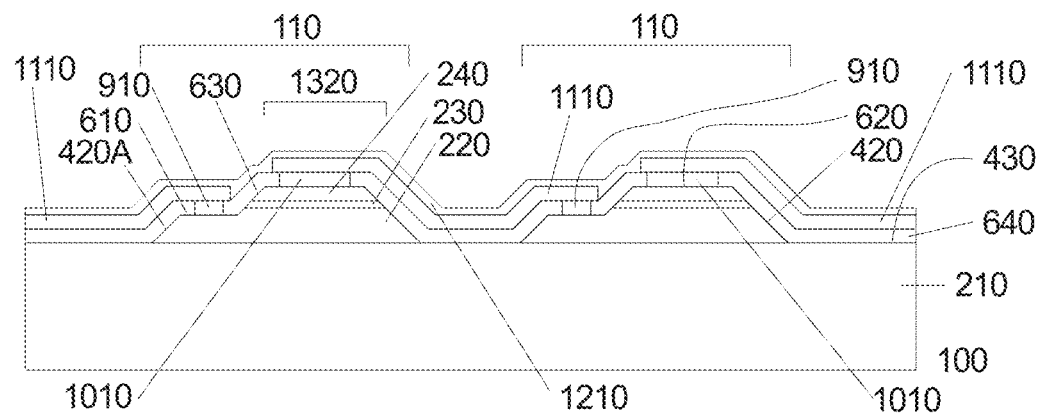
FIG. 29 is a cross-sectional view of the light emitting device of FIG. 28 at a later stage of manufacture.

FIG. 29 is a cross-sectional view of the semiconductor structure of FIG. 28 at a later stage of manufacture. After formation of interconnect layer 1110, layer may be formed over interconnect layer 1110 and portions of layer 640. Layer 1210 may be an insulator and may be used to provide electrical isolation between various portions of interconnect layer 1110 and subsequently formed layers 1410, 1520 and carrier 1510 (FIG. 17). Layer 1210 may comprise, for example, a dielectric, for example silicon dioxide or silicon nitride, a semiconductor, for example AlN, SiC, silicon, polysilicon or diamond, or a polymer, for example polyimide or benzocyclobutene (BCB). In some embodiments of the present invention, layer 1210 may be chosen to have a relatively high thermal conductivity and/or a relatively high resistivity. For example, in some embodiments of the present invention layer 1210 may have a resistivity higher than 1E4 Ω-cm, or higher than 1E5 Ω-cm, or higher than 1E6 Ω-cm. However, this is not a limitation of the present invention and in other embodiments layer 1210 may be semiconducting or conductive. In some embodiments of the present invention layer 1210 may have a thermal conductivity higher than 0.01 W/cm-K, or higher than 0.1 W/cm-K, or higher than 1 W/cm-K. Layer 1210 may be formed using a variety of techniques such as evaporation, sputtering, plating, CVD, or LPCVD. The formation process of layer 1210 is not a limitation of the present invention and in other embodiments any method of forming layer 1210 may be used. In some embodiments layer 1210 may have a relatively small thickness, to provide a small thermal resistance and/or electrical resistance between LED units 110 (FIG. 17) and layer 1410 (FIG. 17). In some examples, layer 1210 may have a thickness less than 200 nm, or less than 100 nm or less than 50 nm. In the example shown in FIG. 29, layer 1210 covers all of the top surface of semiconductor structure 100. However, this is not a limitation of the present invention and in other embodiments of the present invention, layer 1210 may cover only portions of the top surface of semiconductor structure 100 at the stage shown in FIG. 29, for example in some embodiments layer 1210 may only cover the surface of region 1320 of LED unit 110 (FIG. 30).

Figure 30:
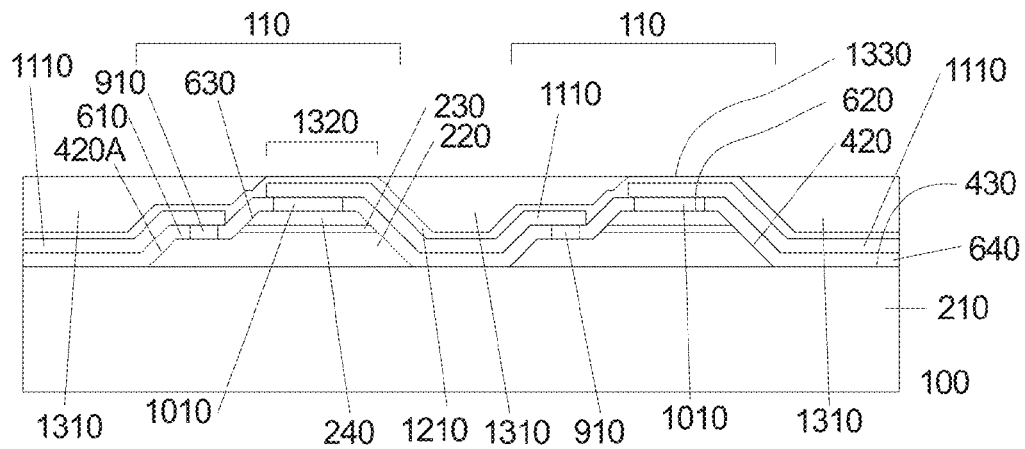
FIG. 30 is a cross-sectional view of the light emitting device of FIG. 29 at a later stage of manufacture.

FIG. 30 is a cross-sectional view of the semiconductor structure of FIG. 29 at a later stage of manufacture. After formation of layer 1210, filler material 1310 may be formed over layer 1210. One purpose of filler material 1310 may be to provide mechanical support for LED units 110 (FIG. 17) and or portions of interconnect 1110 during optional subsequent removal of substrate 210 and to fill gaps between LED units 110 (FIG. 17) and subsequently mounted carrier 1510 (FIG. 17) and associated attachment layers 1520 (FIG. 17) and 1410 (FIG. 17). Filler material 1310 may comprise, for example, a dielectric, for example silicon dioxide or silicon nitride, a semiconductor, for example AlN, SiC, silicon, polysilicon or diamond, or a polymer, for example polyimide or BCB. In some embodiments of the present invention, filler material 1310 may be chosen to have a relatively high thermal conductivity and/or a relatively high resistivity. For example, in some embodiments of the present invention filler material 1310 may have a resistivity higher than 1E4 Ω-cm, or higher than 1E5 Ω-cm, or higher than 1E6 Ω-cm, however this is not a limitation of the present invention and in other embodiments filler material 1310 may be semiconducting or conductive. In some embodiments of the present invention, filler material 1310 may act as an electrical conductor and provide one or more pathways for power and/or signals to LED units 110. In some embodiments of the present invention filler material 1310 may have a thermal conductivity higher than 0.01 W/cm-K, or higher than 0.1 W/cm-K, or higher than 1 W/cm-K. Filler material 1310 may be formed using a variety of techniques such as spin deposition, evaporation, sputtering, plating, CVD, or LPCVD. The formation process of filler material 1310 is not a limitation on the present invention and in other embodiments any method of forming filler material 1310 may be used.

FIG. 30 shows the top surface of filler material 1310 as coplanar with the surface 1330 of portion 1320 of LED unit 110. In other words, surface 1330 of portion 1320 of LED unit 110 is exposed and not covered by filler material 1310. In this example filler material 1310 may be formed and patterned for selective removal over surface 1330 of portion 1320 of LED unit 110. In other embodiments filler material 1310 may be formed using a technique such that it acts to planarize the top surface of structure 100, but does not cover surface 1330 of portion 1320 of LED unit 110. In such an embodiment filler material 1310 may be formed, for example, using a spin deposition process or formed over the entire surface of semiconductor structure 100, for example by evaporation, sputtering, spin deposition, CVD or LPCVD, followed by polishing or planarizing using, for example chemical mechanical polishing (CMP) to expose surface 1330 of portion 1320 of LED unit 110.

FIG. 30 shows the top surface of filler material 1310 as coplanar with surface 1330 of portion 1320 of LED unit 110, however this is not a limitation of the present invention. In some embodiments of the present invention filler material 1310 may have a top surface that is above or below surface 1330 of portion 1320 of LED unit 110. In some embodiments of the present invention, layer 1210 and filler material 1310 may be the same material. In some embodiments filler material 1310 may be relatively soft or compliant, for example filler material 1310 may comprise a polymer, and filler material 1310 may act to reduce stress in semiconductor structure 100 after subsequent attachment to carrier 1510 (FIG. 17). In some embodiments of the present invention, layer 1210 and/or filler material 1310 may be optional. In some embodiments of the present invention all or some layers may be chosen on the basis of their properties to improve overall device yield and/or performance. In some embodiments of the present invention layers that are provided in an example as a single material may comprise a plurality of materials chosen on the basis of their properties to improve overall device yield and/or performance. For example, in some embodiments of the present invention layer 1210 and filler material 1310 may comprise a plurality of layers of different materials to reduce the overall strain and/or to increase the mechanical strength of semiconductor structure 100. In another embodiment of the present invention, layer 1210, filler material 1310 and attachment layers 1410 (FIG. 17) and 1520 (FIG. 17) may comprise a plurality of layers of different materials that may provide increased transfer of heat from LED units 110 to carrier 1510 (FIG. 17).

In the example shown in FIG. 30, filler material 1310 is shown as being present between all LED units 110. However, this is not a limitation of the present invention and in other embodiments of the present invention filler material 1310 may only be present between a portion of LED units 110.

Figure 31:
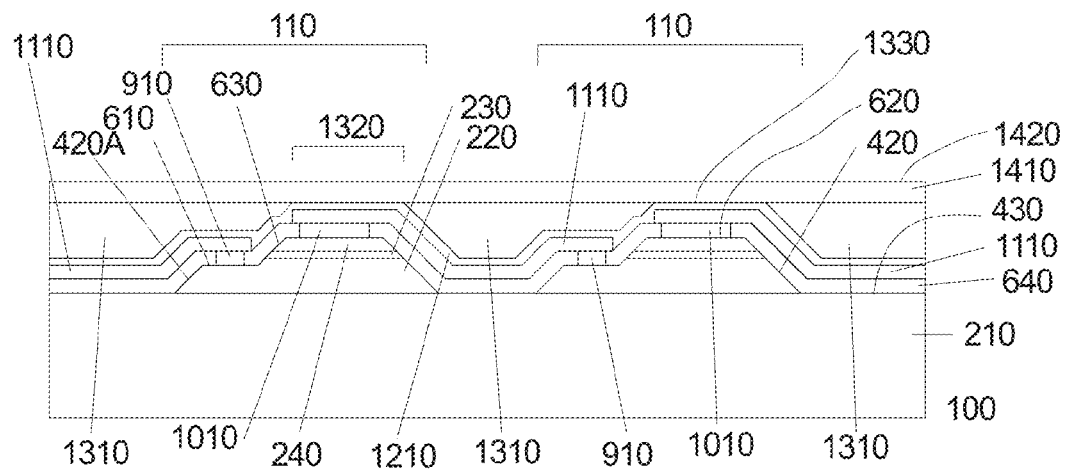
FIG. 31 is a cross-sectional view of the light emitting device of FIG. 30 at a later stage of manufacture.
Figure 32:
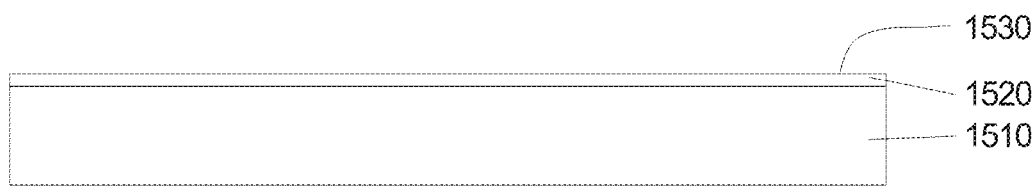
FIG. 32 is a cross-sectional view of a carrier in accordance with an embodiment of the invention.

In a subsequent step the semiconductor structure of FIG. 30 may be attached to a carrier 1510 which is shown in FIG. 32. FIG. 31 is a cross-sectional view of the semiconductor structure of FIG. 30 at a later stage of manufacture. After formation of filler material 1310, attachment layer 1410 may be formed over filler material 1310 and surfaces 1330 of portion 1320 of LED unit 110. Referring now to FIG. 32, FIG. 32 is a cross-sectional view of carrier 1510 with attachment layer 1520 formed over carrier 1510. Attachment layer 1520 (FIG. 32) and 1420 (FIG. 31) may be used to attach the semiconductor structure of FIG. 29 to carrier 1510 (FIG. 32).

In one example attachment layer 1410 may comprise a solder, for example an Au/Sn solder, an In solder or an In/Sn solder. The number of elements in the solder and the composition of the solder are not a limitation of the present invention and in other embodiments, attachment layer 1410 may comprise any type of solder or composition of solder. In other embodiments of the present invention, attachment layer 1410 may comprise a glue or adhesive; the type of glue or adhesive is not a limitation of the present invention and in other embodiments attachment layer 1410 may comprise any type of glue or adhesive. In the example where attachment layer 1410 may comprise a solder, for example an Au/Sn solder, attachment layer 1520 may comprise a layer to which a solder may form a suitable bond, for example a metal such as Au, Sn, or other metals. In some embodiments of the present invention attachment layer 1410 and/or attachment layer 1520 may be formed using, for example, evaporation, plating, sputtering, CVD, LPCVD, screen printing, dispensing or other techniques. In some embodiments of the present invention attachment layer 1410 and/or attachment layer 1520 may each have a thickness in the range of about 5 nm to about 5 μm. In some embodiments of the present invention attachment layer 1410 and/or attachment layer 1520 may each have a thickness in the range of about 0.25 μm to about 3 μm.

In some embodiments of the present invention, attachment layer 1410 and/or attachment layer 1520 may have a relatively high thermal conductivity and may provide a pathway for heat removal from active regions 230 of LED units 110. In some embodiments of the present invention attachment layer 1410 and/or attachment layer 1520 may have a thermal conductivity higher than 0.5 W/cm-K, or higher than 1 W/cm-K. In some embodiments of the present invention, attachment layer 1410 and/or attachment layer 1520 may have a relatively high resistivity, for example higher than 1E4 Ω-cm, or higher than 1E5 Ω-cm, or higher than 1E6 Ω-cm, however this is not a limitation of the present invention and in other embodiments attachment layer 1410 and/or attachment layer 1520 may be semiconducting or conductive. In some examples of this embodiment, layer 1210 may be optional.

In some embodiments of the present invention, attachment layer 1410 and/or attachment layer 1520 may each comprise a plurality of layers. In some embodiments of the present invention, only one attachment layer may be utilized and this may be formed over either semiconductor structure 100 or over carrier 1510.

After the deposition of attachment layer 1410 (FIG. 31) and/or attachment layer 1520 (FIG. 32) and prior to the attachment of semiconductor structure 100 (FIG. 31) to carrier 1510 (FIG. 32), attachment layer 1410 (FIG. 31) and/or attachment layer 1520 (FIG. 32) may be polished or planarized using, for example, chemical mechanical polishing (CMP), to form a relatively high quality bond during the attachment step.

In the example shown in FIG. 31, attachment layer 1410 is shown as covering filler material 1310 and surfaces 1330 of portion 1320 of LED unit 110, in other words attachment layer 1410 is shown as covering the entire surface of semiconductor structure 100 as shown in FIG. 31. However, this is not a limitation of the present invention and in other embodiments of the present invention attachment layer 1410 may cover only portions of filler material 1310 and surfaces 1330 of portion 1320 of LED unit 110. In some embodiments of the present invention, attachment layer 1410 may act as an electrical conductor and provide one or more pathways for power and/or signals to LED units 110.

Referring now to FIG. 32, FIG. 32 is a cross-sectional view of carrier 1510 with attachment layer 1520 formed over carrier 1510. Carrier 1510 may comprise an insulator, a semiconductor or a conductor. Carrier 1510 may comprise, for example a semiconductor such as AlN, SiC, silicon, polysilicon, GaAs, GaP, InP, sapphire, diamond or other semiconductors and may be doped or undoped depending on the application, although the methods and apparatuses described herein are not limited in this regard. In other embodiments of the present invention, carrier 1510 may comprise other materials such as, for example, glass, polymers or metals. Carrier 1510 may have a thickness ranging from about 50 micron (μm) to about 2,000 μm, but this is not a limitation of the present invention and in other embodiments the substrate may have any thickness. The thickness of carrier 1510 may be reduced through subsequent thinning processes in some embodiments. In some embodiments of the present invention carrier 1510 may comprise more than one material, for example a layer of a first material formed over a second material. In one example such a carrier may comprise an electrical insulator formed over an electrical conductor. Carrier 1510 may be absorbing to or substantially transparent at a wavelength of light generated by the light-emitting device.

Carrier 1510 may have a diameter in the range of about 1" to over 12", however the diameter of carrier 1510 is not a limitation of the present invention and in other embodiments carrier 1510 may have any diameter. It may be desirable for carrier 1510 to have a diameter the same as, or substantially the same as substrate 210 (FIG. 31) however this is not a limitation of the present invention and in other embodiments, carrier 1510 may have a diameter larger than or smaller than the diameter of substrate 210 (FIG. 31).

In some embodiments of the present invention carrier 1510 may have a circular shape, like that often used for conventional semiconductor processing. However this is not a limitation of the present invention and in other embodiments carrier 1510 may be square, rectangular or have any arbitrary shape. In some embodiments of the present invention the shape and size of carrier 1510 may be the same as, or substantially the same as that of substrate 210 (FIG. 31). However this is not a limitation of the present invention and in other embodiments carrier 1510 and substrate 210 may have different shapes and sizes.

In some embodiments of the present invention, carrier 1510 may have a relatively high thermal conductivity and may provide a pathway for heat removal from active regions 230 of LED units 110. In some embodiments of the present invention carrier 1510 may have a thermal conductivity higher than 0.15 W/cm-K, or higher than 0.5 W/cm-K, or higher than 1 W/cm-K. In some embodiments of the present invention, carrier 1510 may have a relatively high resistivity, for example greater than 1E4 Ω-cm, or greater than 1E5 Ω-cm, or greater than 1E6 Ω-cm, however this is not a limitation of the present invention and in other embodiments carrier 1510 may be semiconducting or conductive.

In the example shown in FIG. 32 attachment layer 1520 is shown as covering the entire surface of carrier 1510. However, this is not a limitation of the present invention and in other embodiments of the present invention, attachment layer 1520 may cover only portions of carrier 1510. In some embodiments of the present invention, attachment layer 1520 may act as an electrical conductor and provide one or more pathways for power and/or signals to LED units 110.

Figure 33:
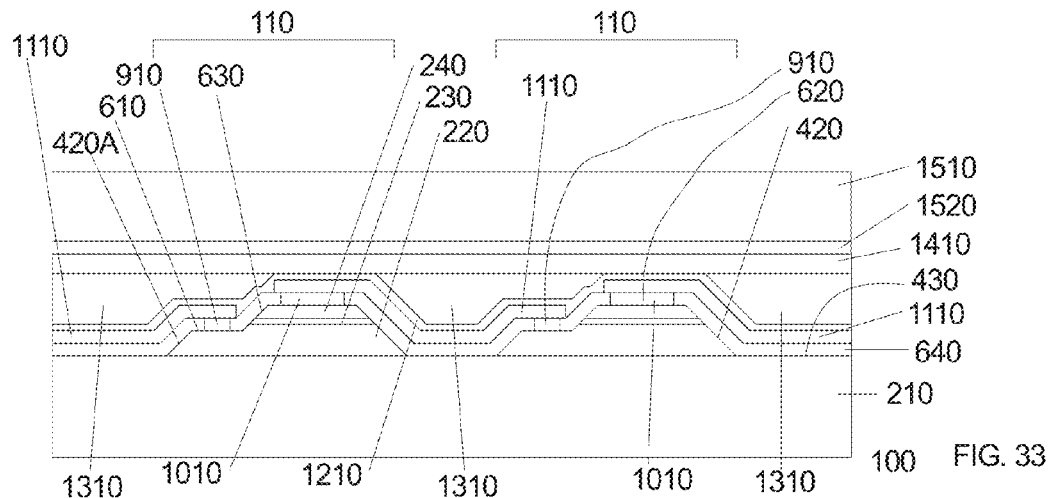
FIG. 33 is a cross-sectional view of the light emitting device of FIG. 31 at a later stage of manufacture.

FIG. 33 is a cross-sectional view of the semiconductor structure of FIG. 31 at a later stage of manufacture. After formation of attachment layer 1410, and formation of attachment layer 1520 over carrier 1510 (FIG. 32), surface 1420 of the semiconductor structure of FIG. 31 and surface 1530 of the carrier of FIG. 32 may be joined or attached, as shown in FIG. 33. The method of joining depends on the materials used for attachment layers 1410 and 1520. In some embodiments, the joining may be performed using thermocompression bonding, wafer bonding, adhesive, glue, solder or the like. In the example where attachment layer 1410 comprises an Au/Sn solder and attachment layer 1520 comprises Au, joining may be accomplished using a combination of heat and pressure, in other words using thermocompression bonding. In the case where attachment layer 1420 and/or attachment layer 1510 comprise a glue or adhesive, joining may be accomplished by mating surface 1420 (FIG. 31) and surface 1530 (FIG. 32) and the optional application of pressure and/or heat.

Figure 34:
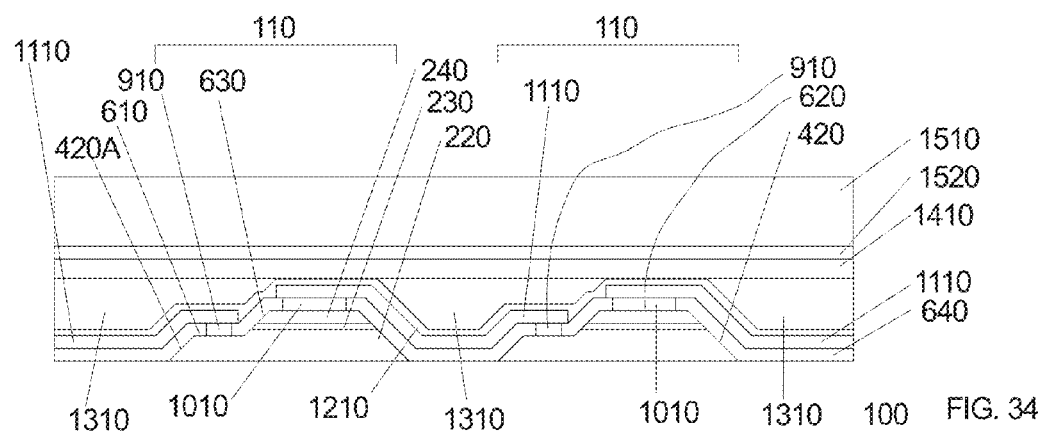
FIG. 34 is a cross-sectional view of the light emitting device of FIG. 33 at a later stage of manufacture.

FIG. 34 is a cross-sectional view of the semiconductor structure of FIG. 33 at a later stage of manufacture. After joining surface 1420 of the semiconductor structure of FIG. 31 and surface 1530 of the carrier of FIG. 32, a portion or all of substrate 210 may be optionally removed. In the example shown in FIG. 32, all of substrate 210 is removed. Substrate 210 may be removed using techniques such as lapping and polishing, CMP, wet chemical etching, reactive ion etching (RIE), laser lift-off or the like. In some embodiments of the present invention, removal of substrate 210 may comprise more than one step.

Figure 35:
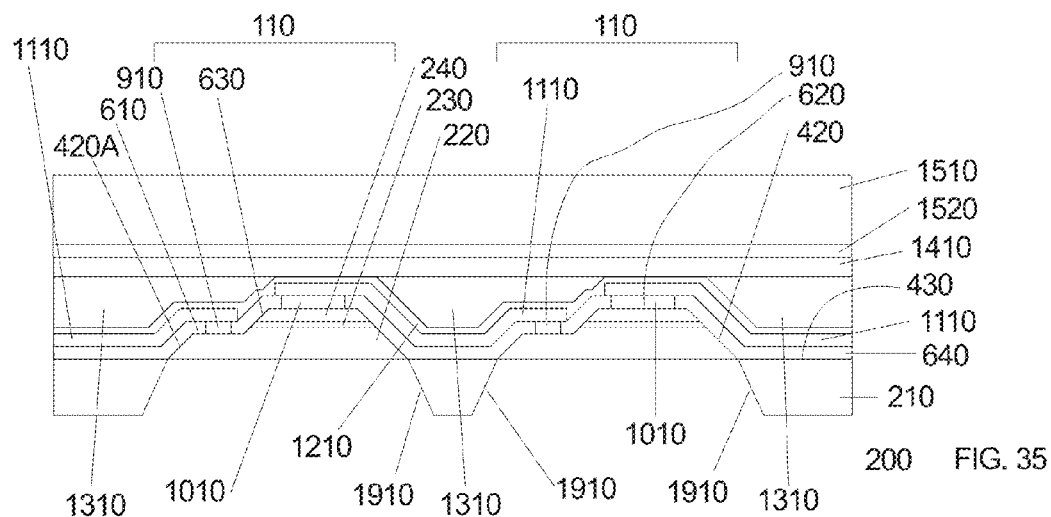
FIG. 35 is a cross-sectional view of a light emitting device made in accordance with a fourth embodiment of the invention.

In some embodiments of the present invention a portion of substrate 210 may be removed. FIG. 35 shows an example semiconductor structure 200 in which a portion of substrate 210 has been removed. Such an approach may be used when substrate 210 is either absorbing or substantially transparent at a wavelength of light generated by the light-emitting device. In some embodiments of the present invention semiconductor structure 200 may be formed from the semiconductor structure of FIG. 33.

In some embodiments of the present invention in which a portion of substrate 210 may be removed, as shown in FIG. 35, a material reflective to a wavelength of light emitted by LED unit 110 may be optionally formed over all of or portions of sidewalls 1910. Such a reflective material may be especially applicable when substrate 210 may comprise a material that may be absorbing to a wavelength of light emitted by LED unit 110. In some embodiments of the present invention such reflective material may comprise a Bragg reflector, or may comprise a metal or metal alloy thin film, for example made up of one or more of the following materials: Au, Ag, Pt, Pd, Ti, and/or Ni, or alloys thereof. However, it should be recognized that numerous methods and materials can be used to make satisfactory mirrors, and these examples do not represent limitations on the invention.

In some embodiments of the present invention in which substrate 210 (FIG. 20) may comprise a material that may be transparent and or translucent to a wavelength of light emitted by LED unit 110, all of substrate 210 (FIG. 20) may be left in place and the light emitted by LED units 110 may be transmitted from LED units 110 through substrate 210 (FIG. 20). In some embodiments of the present invention wherein substrate 210 (FIG. 20) may be transparent to a wavelength of light emitted by LED unit 110, light extraction features may be formed in substrate 210 (FIG. 20) and/or at the interface of substrate 210 (FIG. 20) and layer structure 250 (FIG. 20) or within a region of layer structure 250 (FIG. 20) adjacent to substrate 210 (FIG. 20 to improve the light extraction efficiency. In some embodiments of the present invention, light extraction features may comprise one or more anti-reflection coatings and/or surface roughening, texturing, patterning, imprinting or the like. In some examples such light extraction features may be formed in a regular periodic array, however this is not a limitation of the present invention and in other embodiments, light extraction features may be formed in a random or semi-random pattern.

Figure 5:
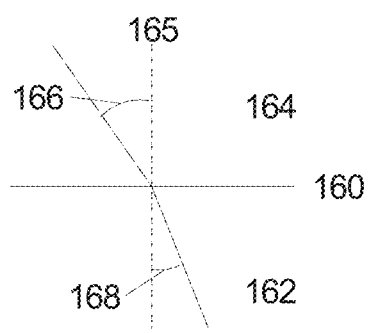
FIG. 5 is a diagram of light incident on an interface.

Removal of substrate 210 (FIG. 20) may be desirable to provide increased light extraction from LED units 110. If substrate 210 is left in place, then an interface between two materials with potentially different indices of refraction (substrate 210 and layer structure 250) may exist, causing a reduction in light extraction due to TIR and additional absorption, as discussed with respect to FIG. 5. Removal of substrate 210 and formation of an index matched layer over LED units 110 or the entire light engine may result in increased light extraction and thus luminous efficacy.

Figure 36:
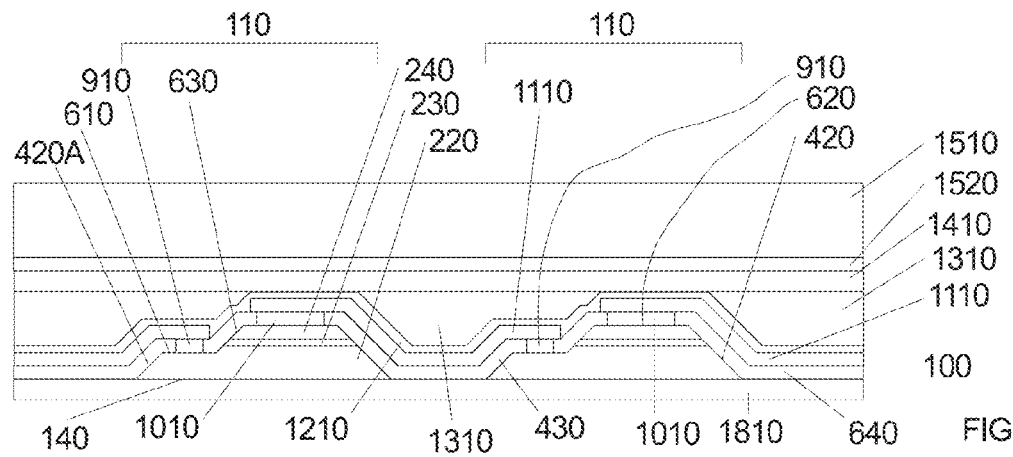
FIG. 36 is a cross-sectional view of the light emitting device of FIG. 34 at a later stage of manufacture.

FIG. 36 is a cross-sectional view of the semiconductor structure of FIG. 34 at a later stage of manufacture. After optional removal of portions of or all of substrate 210, optional light conversion material 1810 may be formed over surface 140 (inclusive or exclusive of the exposed portions of layer 640). Optional light conversion material 1810 may comprise organic or inorganic phosphors or other materials capable of absorption of all of or a portion of the light emitted from active region 230 and re-emitting it at a different wavelength. In some embodiments of the present invention light conversion material 1810 may comprise a down conversion material and in other embodiments light conversion material 1810 may comprise an up conversion material.

In some embodiments of the present invention light conversion material may be formed by evaporation, screen printing, ink jet printing, other printing methods, CVD, spin deposition or the like. In some embodiments of the present invention, optional light conversion material 1810 may be suspended or embedded in a second material (not shown), and in some embodiments the second material may comprise a material with an index of refraction between that of the material in layer structure 250 (FIG. 20) and air. In one example of this embodiment such second material may comprise an epoxy, gel or resin with an index of refraction in the range of about 1.2 to about 1.7. Such a second material may act to reduce total internal reflection and increase the light extraction efficiency of the light engine.

In FIG. 36, light conversion material 1810 is shown as being formed over the entirety of surface 140, however this is not a limitation of the present invention and in other embodiments light conversion material 1810 may be formed over a portion of surface 140, and in particular may be formed over portions of surface 140 under LED units 110. In some embodiments of the present invention light conversion material 1810 may be formed over portions of LED units 110, such that a portion of the light emitted by active region 230 exits LED unit 110 directly and a portion of the light emitted by active region 230 is absorbed in and then re-emitted by light conversion material 1810.

In some embodiments of the present invention light conversion material 1810 may comprise a plurality of layers or a mixture of different types of light conversion materials. In some embodiments of the present invention, a first light conversion material may be formed over a first portion of LED units 110 and a second light conversion material may be formed over a second portion of LED units 110. In one example, a first portion of LED units 110 may be covered with a first light conversion material 1810 that when mixed with the light emitted from the first portion of LED units 110 produces a warm white color and a second portion of LED units 110 may be covered with a second light conversion material 1810 that when mixed with the light emitted from the second portion of LED units 110 produces a cool white color. In one example of this embodiment, the LED units associated with the first and second light conversion materials may be separately addressable, and thus a light having either warm or cool properties may be created by separately turning on LED units 110 associated with either the warm or cool light conversion materials respectively. In this example two sub-arrays of LED units 110 and two types of light conversion materials 1810 are discussed, however this is not a limitation of the present invention and other embodiments may comprise three or more sub-arrays of LED units 110 and three or more different light conversion materials 1810. In this example two types of white light, cool and warm are discussed, however this is not a limitation of the present invention and in other embodiments multiple colors may be produced using this approach.

Figure 37:
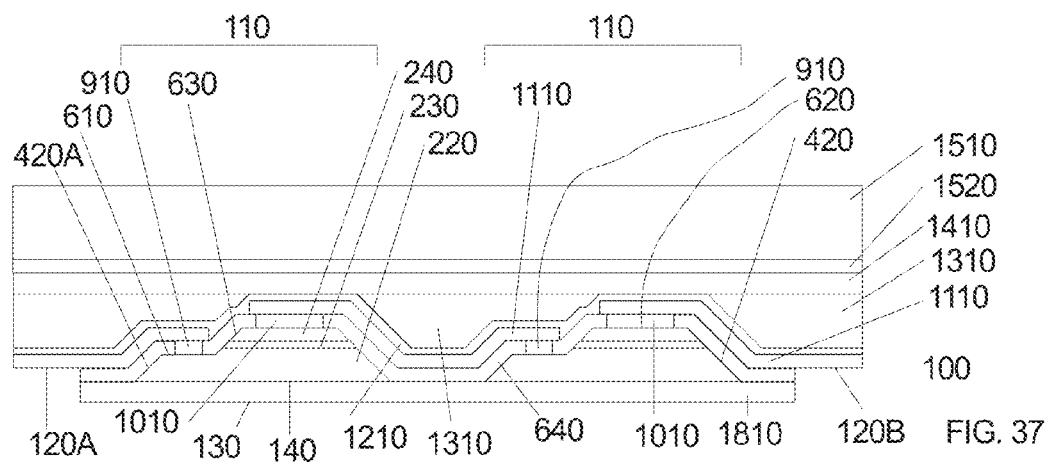
FIG. 37 is a cross-sectional view of the light emitting device of FIG. 36 at a later stage of manufacture.

Referring now to FIG. 37, FIG. 37 is a cross-sectional view of the semiconductor structure of FIG. 36 at a later stage of manufacture. After optional formation of light conversion material 1810, a portion of optional light conversion material 1810 and a portion of layer 640 may be removed, exposing portions of interconnect layer 1110, herein identified in FIGS. 37, 17 and 18 as contact regions 120A and 120B. Optional filler material 1310 may provide mechanical support to contact areas 120A and 120B. Portions of light conversion material 1810 and layer 640 may be removed using, for example, patterning and etching techniques discussed previously. Connection to the light engine may be made through contact regions 120A and 120B.

Figure 38:
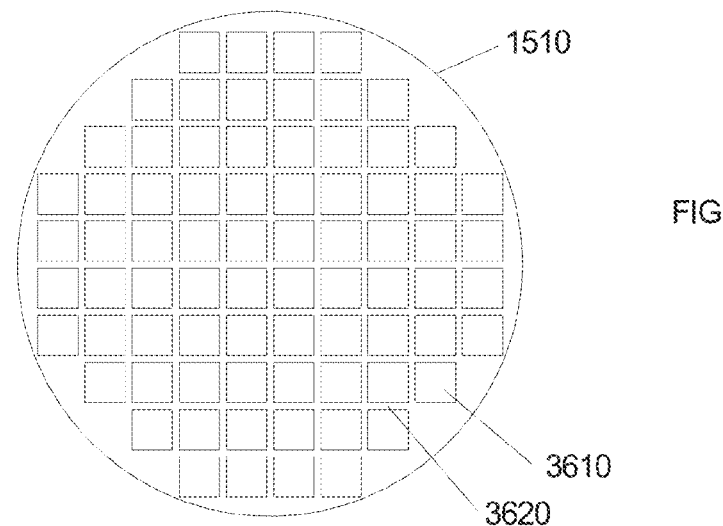
FIG. 38 is a top view of an entire wafer of light emitting devices made in accordance with an embodiment of the invention.

At this point in the manufacture of the semiconductor structure shown in FIG. 37, a plurality of complete light engines is formed on carrier 1510. FIGS. 17-37 have shown a process flow for manufacturing one embodiment of the light engine of the present invention; a schematic of the entire wafer at this stage of manufacture is shown in FIG. 38. FIG. 38 shows a top view of the entire wafer at this stage of manufacture, comprising carrier 1510 and a plurality light engines 3610 formed on carrier 1510 spaced apart from each other by streets 3620. Streets 3620 may have a width in the range of about 5 µm to about 500 µm. However this is not a limitation of the present invention and in other embodiments, streets 3620 may have any width.

After removal of portion of light conversion material 1810 and a portion of layer 640 and exposing portions of interconnect layer 1110, individual light engines 2210 may be separated from the semiconductor structure of FIG. 38. In other words, the semiconductor structure of FIG. 38 comprises a wafer of light engines and the light engines are separated or singulated from the wafer to form separate light engines as shown in FIG. 17. Singulation may be performed using methods such as laser cutting, laser scribing, mechanical scribe and break or dicing. However, this is not a limitation of the present invention and in other embodiments other methods of separation or singulation may be used.

FIG. 38 shows all light engines 3610 formed on carrier 1510 as having the same size. However this is not a limitation of the present invention and in other embodiments, more than one size light engine may be formed on carrier 1510. In some embodiments of the present invention, different light engines formed on carrier 1510 may have different characteristics. For example they may have a different size, a different number of LED units, a different color or spectral distribution and the characteristics and variation of the characteristics of the light engines on carrier 1510 are not a limitation of the present invention.

Figure 39:
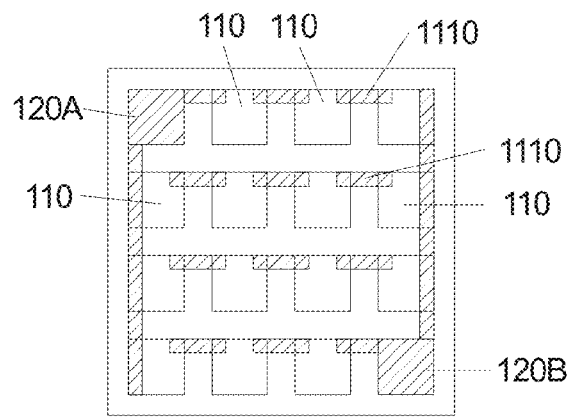
FIG. 39 is a top view of a light emitting device made in accordance with a fifth embodiment of the invention.

FIG. 17 shows contact regions 120A and 120B positioned adjacent to the array of LED units 110. However, this is not a limitation of the present invention and in other embodiments, contact regions 120A and 120B may have any shape, size or position. For example, FIG. 39 is a schematic of an embodiment of the present invention in which two LED units 110 are replaced by contact regions 120A and 120B. FIG. 17 shows one contact region 120A and one contact region 120B. However this is not a limitation of the present invention and in other embodiments the light engine (semiconductor structure 100) may comprise a plurality of contact regions 120A and/or a plurality of contact regions 120B.

Figure 40:
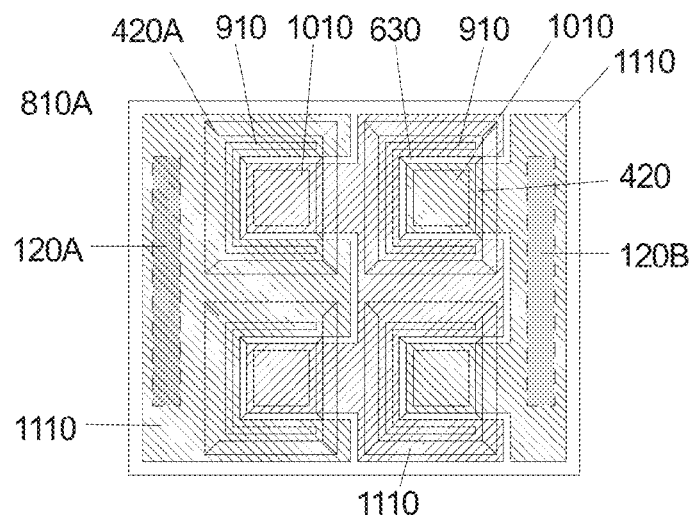
FIG. 40 is a top view of a light emitting device made in accordance with a sixth embodiment of the invention.

FIG. 40 is a top view of an embodiment of the present invention comprising bottom electrical contact 910 that extend around substantially three sides of top electrical contact 1010. As can be seen in FIG. 40 current must flow from bottom electrical contact 910 laterally through bottom confining region 220 and then up and out of LED unit 110 through active region 230, to confining region 240 and top electrical contact 1010. Extending bottom electrical contacts 910 around more of top electrical contact 1010 may result in improved current spreading and reduced forward voltage. The example in FIG. 40 shows bottom electrical contact 910 extending around substantially three sides of top electrical contact 1010. However this is not a limitation and in other embodiments bottom electrical contact 910 may extend a lesser or greater portion of top electrical contact 1010 than shown in FIG. 40. In some embodiments of the present invention bottom electrical contact 910 may extend around all of or substantially all of top contact 1010.

Another aspect of the semiconductor structure of FIG. 40 is that segments of interconnect 1110 cover a relatively large portion or substantially all of the surface. In some embodiments of the present invention bottom electrical contact 910 and/or top electrical contact 1010 and/or interconnect 1110 may be reflective to a wavelength of light emitted by LED unit 110 and thus act to reflect light emitted by LED unit 110 back through all or portions of layer structure 250 within LED unit 110 and out of the light engine. In some embodiments of the present invention interconnect 1110 may comprise a Bragg reflector, or may comprise a metal or metal alloy thin film, for example made up of one or more of the following materials: Au, Ag, Pt, Pd, Ti, and/or Ni, or alloys thereof. However, it should be recognized that numerous methods and materials can be used to make a reflective interconnect and/or contact, and these examples do not represent limitations on the invention.

Figure 41:
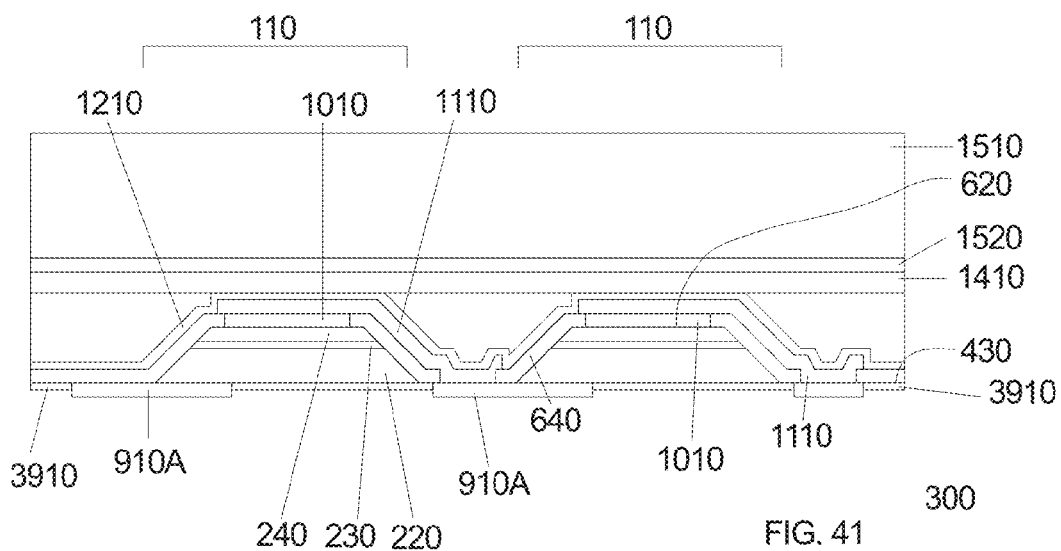
FIG. 41 is a cross-sectional view of a light emitting device made in accordance with a seventh embodiment of the invention.

In the example shown in FIGS. 17-40, bottom electrical contact 910 is shown as being formed on a portion of bottom confining region 220 opposite substrate 210. However, this is not a limitation of the present invention and in other embodiments bottom electrical contact 910 may be formed on the opposite side of bottom confining region 220. For example, FIG. 41 is a schematic of an embodiment of the present invention in which semiconductor structure 300 is at a stage of manufacture after removal of substrate 210 but before formation of optional light conversion material 1810. In the example shown in FIG. 41, contact to bottom confining region 220, identified as 910A, couples bottom confining region 220 to a portion of interconnect layer 1110, thus electrically coupling top electrical contact 1010 of a first LED unit 110 and bottom electrical contact 910A of a second LED unit 110A. In the example shown in FIG. 41, an optional layer 3910 is formed over the surface exposed after removal of substrate 210 but before formation of bottom electrical contacts 910A. In some embodiments of the present invention layer 3910 may comprise a current spreading layer to aid in uniform distribution of current from contact 910A to bottom confining region 220. In some embodiments of the present invention layer 3910 may comprise a protection layer to aid in protection of the underlying light engine. In some embodiments of the present invention layer 3910 may comprise a plurality of layers. In some embodiments of the present invention layer 3910 may comprise a current spreading layer and a protection layer. Examples of current spreading layers may include ITO or other transparent conductive oxides, very thin layers of metal such as Ni or Au, or the like. Examples of protection layers may include silicon dioxide, silicon nitride or other such dielectric materials or other materials transparent to a wavelength of light emitted by LED unit 110. However, this is not a limitation of the present invention and in other embodiments, layer 3910 may be omitted. In some embodiments of the present invention, layer 3910 may be formed before bottom contact 910A and in some embodiments of the present invention layer 3910 may be formed after bottom contact 910A. In some embodiments of the present invention layer 3910 may overlap bottom contact 910A. In some embodiments of the present invention bottom contact 910A may overlap layer 3910.

In the example shown in FIG. 41, bottom electrical contact 910A is shown as coupling bottom confining region 220 and interconnect layer 1110. However, in other examples, bottom electrical contact 910A may be formed only over a portion of bottom confining region 220 and a separate conductor may couple bottom contact 910A to interconnect layer 1110. In some embodiments of this example, contact regions 120A (FIG. 17) and 120B (FIG. 17) may be formed from a portion of bottom contacts 910A and/or a portion of interconnect 1110. In other embodiments of this example, an additional patterning and metallization step may be utilized for formation of contact regions 120A (FIG. 17) and 120B (FIG. 17). Note that in this embodiment of the present invention, only one mesa formation step may be required. This may result in a larger light emitting area of LED unit 110 for a given overall size of LED unit 110.

Figure 42:
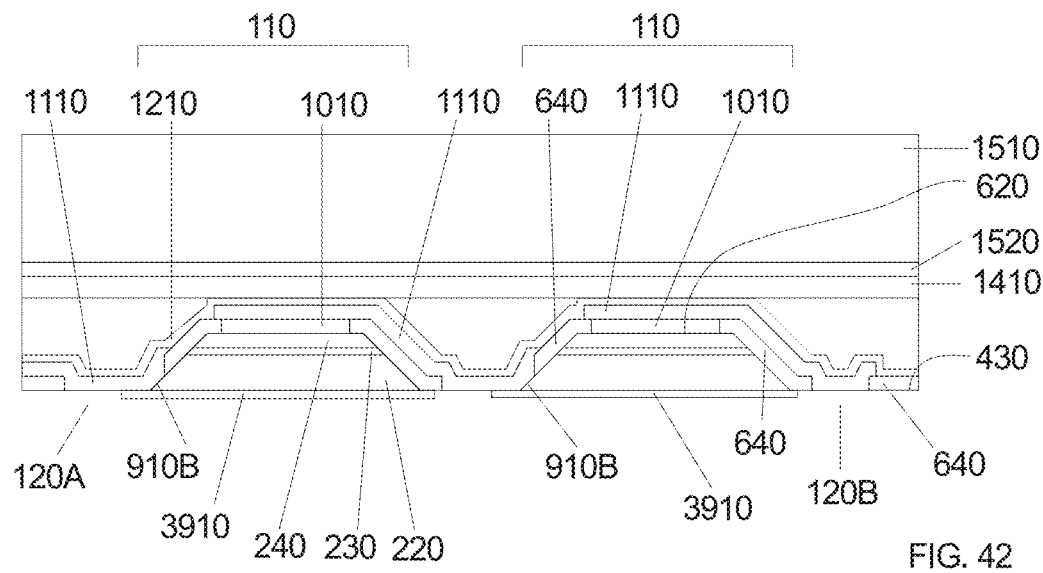
FIG. 42 is a cross-sectional view of a light emitting device made in accordance with an eighth embodiment of the invention.

FIG. 42 shows a cross-sectional view of a variation of the semiconductor structure of FIG. 41. In the structure shown in FIG. 42 bottom electrical contact to bottom confining region 220 may be made on the sidewall of the mesa defining each LED unit 110, and is identified in FIG. 42 as 910B. In FIG. 42 bottom electrical contact 910B is shown as comprising the same material as interconnect 1110, however this is not a limitation of the present invention and in other embodiments a separate contact to bottom confining region 220 may be formed (not shown) and electrically coupled to interconnect 1110. In FIG. 42 contact area 120A and 120B are shown as comprising the same material as interconnect 1110, however this is not a limitation of the present invention and in other embodiments a separate layer may be formed for contact area 120A and 120B (not shown) and electrically coupled to interconnect 1110. In FIG. 42 layer 3910 is shown as covering all of the exposed portion of bottom confining region 220, however this is not a limitation of the present invention and in other embodiments layer 3910 may cover only a portion of the exposed portion of bottom confining region 220. Note that in FIG. 42 layer 3910 is coupled to bottom contact 910B to provide improved current spreading through bottom confining region 220.

The structures shown in FIGS. 41 and 42 may have several advantages over the structure shown in FIG. 17 including fewer processing steps, higher manufacturing yield, lower manufacturing cost, a larger light emitting area resulting in an increased light output and a larger p contact and associated mirror or reflective surface leading to improved current spreading and light extraction and thus an improved luminous efficacy and improved current spreading over bottom confining region 220 leading to an improved luminous efficacy. In some embodiments of the present invention the mirrors or reflective surfaces associated with the p-contact in the structures shown in FIGS. 41 and 42 may be less sensitive to degradation than the p-mirrors shown in FIG. 17.

Figure 43:
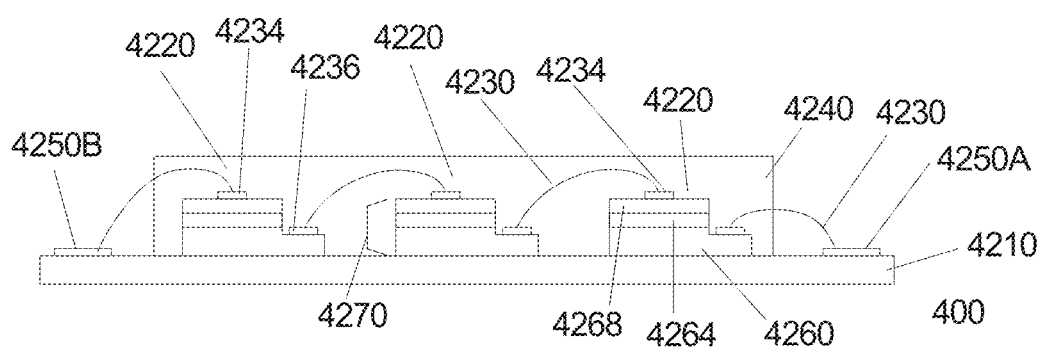
FIG. 43 is a cross-sectional view of a light emitting device made in accordance with a ninth embodiment of the invention taken along section line 43-43 of FIG. 44.
Figure 44:
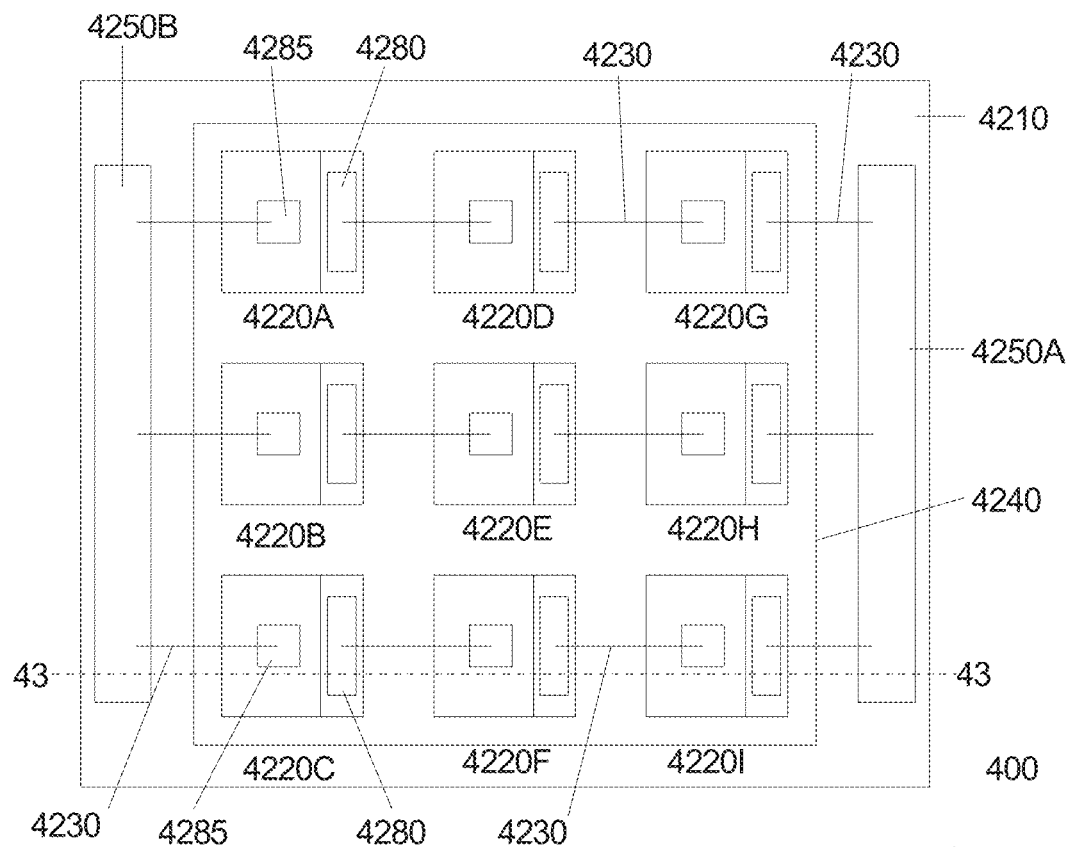
FIG. 44 is a top view of the light emitting device of FIG. 43.

FIG. 44 is a top view of structure 400 of FIG. 43 in accordance with another embodiment of the present invention and FIG. 43 is a cross-sectional view taken along section line 43-43 of FIG. 44. Referring to FIG. 43, structure 400 comprises a plurality of LED units 4220 formed over substrate or carrier 4210, conductive elements 4230 and contact areas 4250A and 4250B. LED units 4220 comprise a bottom confining region 4260 formed over substrate 4210, an active region 4264 formed over bottom confining region 4260 and a top confining region 4268 formed over active region 4264. Bottom confining region 4260, active region 4264 and top confining region 4268 comprise layer structure 4270. A top contact 4234 may be formed over a portion of top confining region 4268 and a bottom contact 4236 may be formed over a portion of bottom confining region 4260. Conductive elements 4230 electrically couple LED units 4220 to each other and to contact areas 4250A and 4250B. In contrast to the structure shown in FIG. 17, structure 400 may emit light from the top, sides and, if substrate or carrier 4210 is transparent, the bottom.

In some embodiments of the present invention, the structure shown in FIG. 20 may serve as a starting point for the manufacture of structure 400 of FIG. 43 and the process up to FIG. 23 may be the same as that used to manufacture the structure in FIG. 17. After formation of the structure in FIG. 23, top contact 4234 and bottom contact 4236 may be formed in a manner similar to that described previously, for example using deposition and etching or liftoff techniques. In some embodiments of the present invention, the dimensions of and material comprising top contact 4234 and bottom contact 4236 may be the same as discussed with reference to the structure in FIG. 17. Referring now to FIG. 44, LED units 4220 are shown in this example as being electrically coupled in a configuration similar to that of FIG. 10D. However this is not a limitation of the present invention and in other embodiments other configurations may be used.

LED units 4220 are shown in FIGS. 43 and 44 as being electrically coupled using bonding wire, for example Au bonding wire, but this is not a limitation of the present invention and in other embodiments other methods of electrical coupling may be used, for example air bridge, metallization lines, or the like.

LED units 4220 are shown in FIGS. 43 and 44 as being completely covered by optional light conversion material 4240. However this is not a limitation of the present invention and in other embodiments light conversion material 4240 may cover only a portion of LED units 4220, or may cover only portions of each LED unit 4220. In some embodiments of the present invention wherein substrate 4210 comprises a transparent substrate, light conversion material 4240 may be formed over the side of substrate 4210 opposite LED units 4220.

Bottom confining region 4260, top confining region 4268 and/or active region 4264 may each comprise one or more layers. Bottom confining region 4260 and top confining region 4268 may have a bandgap relatively larger than that of all or a portion of active region 4264 or of the one or more layers comprising active region 4264. In some embodiments of the present invention active region 4264 may comprise one or more quantum wells and barriers. In some embodiments of the present invention active region 4264 may comprise one or more layers of quantum dots, or quantum wires and barriers. As is well understood by those familiar with the art, additional layers may be present and this invention is not limited in this regard. Furthermore, the layers comprising bottom confining region 4260, top confining region 4268 and active region 4264 may be comprised of a wide range of materials, depending on the desired properties, and in particular, the emission wavelength, of the LED.

In one example in which the LED may emit UV, blue or green light, substrate 4210 may comprise sapphire, bottom confining region 4260, active region 4264 and top confining region 4268 may comprise $Al_xIn_yGa_{1-x-y}N$, with x and y adjusted in each layer such that the bandgap of bottom confining region 4260 and top confining region 4268 are larger than the bandgap of the light emitting layer in active region 4264. In some embodiments of this example bottom confining region 4260 may be doped n-type and top confining region 4268 may be doped p-type. However, this is not a limitation of the present invention and in other embodiments bottom confining region 4260, top confining region 4268 and active region 4264 may comprise other materials and have other conductivity types.

Figure 45:
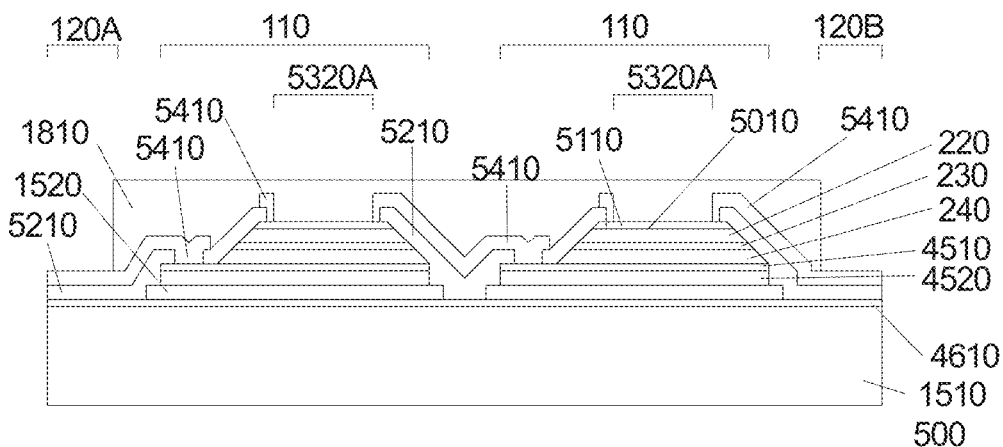
FIG. 45 is a cross-sectional view of a light emitting device made in accordance with a tenth embodiment of the invention taken along section line 45-45 of FIG. 46.
Figure 46:
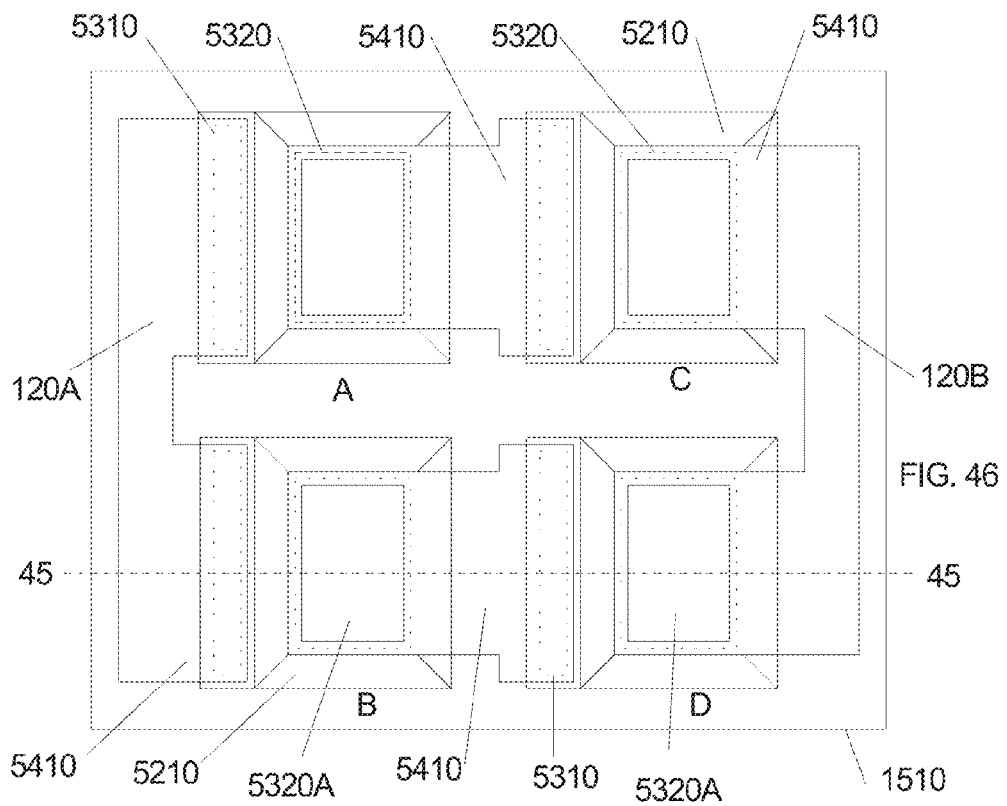
FIG. 46 is a view from the light emitting side of the light emitting device of FIG. 45.

FIG. 45 is a cross-sectional view of structure 500 in accordance with another embodiment of the present invention. The semiconductor structure in FIG. 45 may be referred to as a monolithically formed light system or light engine. FIG. 46 is a view of the structure of FIG. 45 from the light emitting side of structure 500, that is side of carrier 1510 over which LED units 110 may be formed and FIG. 44 is a cross-sectional view taken along section line 45-45 of FIG. 46. In FIG. 45 optional light conversion material 1810 is not shown, and opening 5310 and 5320 are shown as dotted lines to indicate that they are under layer 5410.

The monolithic light engine shown schematically in FIG. 45 comprises a carrier 1510, a plurality of LED units 110, layers 1520, 4610 and 4520 used to attach LED units 110 to carrier 1510, optional light conversion material 1810, a layer 5210, a layer 5410 and contact regions 120A and 120B. Carrier 1510 may be referred to as a carrier, a substrate, a mechanical support, a heat sink or a first level heat sink. Layers 1520 and 4520 may be used to help attach LED units 110 to carrier 1510. LED unit 110 may comprise a bottom confining region 220, an active region 230, a top confining region 240, a portion of layer 5410, a portion of layer 5210 and a portion of top contact layer 4510.

Light is generated in active region 230 and exits LED unit 110 through opening 5320A. In some embodiments of the present invention light extraction features 5010 may be formed in or on a portion of LED unit 110 to improve the light extraction efficiency. In some embodiments of the present invention, light extraction features may comprise one or more anti-reflection coatings and/or surface roughening, texturing, patterning, imprinting or the like. In some examples such light extraction features may be formed in a regular periodic array, however this is not a limitation of the present invention and in other embodiments, light extraction features may be formed in a random or semi-random pattern.

Some of the light generated in active region 230 may exit the active region into top confining region 240. Such light may be reflected from reflecting surfaces that reflect a wavelength of light emitted by the LED that are formed over portions of or all of top confining region 240, for example on the side of top confining region 240 adjacent to carrier 1510. In some embodiments of the present invention reflecting surfaces may also be formed over portions of or all of active region 230 and bottom confining region 220, in particular on all or a portion of the sidewalls of active region 230 and bottom confining region 220. In some embodiments of the present invention, such reflecting surfaces may have a reflectivity greater than 80% to a wavelength of light emitted by the LED, or greater than 90% to a wavelength of light emitted by the LED, or greater than 95% to a wavelength of light generated in active region 230.

Optional light conversion material 1810 may comprise organic or inorganic phosphors or other materials capable of absorption of a portion of the light emitted from active region 230 and re-emitting it at a different wavelength. In some embodiments of the present invention light conversion material 1810 may comprise a down conversion material and in other embodiments light conversion material 1810 may comprise an up conversion material. In some embodiments of the present invention, optional light conversion material 1810 may be suspended or embedded in a second material (not shown), and in some embodiments the second material may comprise a material with an index of refraction between that of the material in layer structure 250 (FIG. 20) and air. In one example of this embodiment such second material may comprise for example an epoxy, gel, or resin with an index of refraction in the range of about 1.2 to about 1.7. Such a second material may act to reduce total internal reflection and increase the light extraction efficiency of the light engine.

LED unit 110 may be formed such that the heat-generating active region 230 may be in close proximity to carrier/heat sink 1510, for example all or a portion of active region 230 may be spaced less than 10 µm, or may be less than 5 µm, or may be less than 2 µm from the surface of carrier 1510 adjacent to attachment layer 1520. In other words, the combined thickness of layer 4610, 1520, 4520, 4510 and top confining region 240 may be less than 10 µm, or may be less than 5 µm, or may be less than 2 µm.

Referring now to FIG. 46, FIG. 46 shows a top view example of semiconductor structure 500 comprising four (4) LED units 110. In FIG. 46 optional light conversion material 1810 is not shown, and opening 5310 and 5320 are shown as dotted lines to indicate that they are under layer 5410, as discussed above. In this example the LEDs are configured as shown in FIG. 10A, comprising two parallel strings of LEDs, each string of LEDs comprising two LED units 110. In this example electrical connection to the positive polarity terminal of the light engine may be made through contact region 120A, which comprises a portion of layer 5410 that may be coupled to the top confining region 240 of LED units 110 A and B through top contact layer 4510. Similarly, electrical connection to the negative polarity terminal of the light engine may be made through contact region 120B, which comprises a portion of layer 5410 that may be coupled to bottom confining region 220 of LED units C and D. Bottom confining region 220 of LED units A and B may be electrically coupled to top confining region 240 of LED units C and D respectively through a portion of layer 5410.

In the example shown in FIG. 46, LED units 110 are configured as shown schematically in FIG. 10A. However this is not a limitation of the present invention and in other embodiments LED units may be connected in any other configuration; the connection topology is not a limitation of the present invention. For example, in some embodiments of the present invention, the individual LED units may be coupled in series as shown in FIG. 10C, in parallel as shown in FIG. 10B or a combination of series and parallel connections as shown in FIG. 10D. In some embodiments, a portion or all of the individual LED units 110 may be coupled anode to cathode as shown in FIGS. 10A to 10D while in other embodiments contact regions 120A and 120B may each have both one or more anodes and one or more cathodes of individual LED units 110 coupled to them as shown in FIG. 10E, and in other embodiments, a combination of these types of couplings may be utilized.

FIGS. 45 and 46 show an exemplary LED array with 4 LED units 110. However, the number of LED units 110 is not a limitation of the present invention and in some embodiments the LED array may comprise a larger numbers of LED units 110. In some embodiments of the present invention the number of LED units 110 in the array may be greater than 20, or may be greater than 50, or may be greater than 100 or may be greater than 250 or may be greater than 500.

FIG. 20 is a cross-sectional view of a semiconductor structure at a beginning stage of manufacture that may be used as a starting structure for the semiconductor structure of FIG. 45, in accordance with an embodiment of the present invention. FIG. 20 comprises substrate 210, bottom confining region 220 that may be formed over substrate 210, active region 230 that may be formed over bottom confining region 220 and top confining region 240 that may be formed over active region 230.

Substrate 210 may comprise a semiconductor material such as, for example, gallium arsenide (GaAs), gallium phosphide (GaP), indium phosphide (InP), sapphire, silicon carbide (SiC), aluminum nitride (AlN), ZnO, diamond, silicon or other semiconductors, and may be doped or undoped depending on the application, although the methods and apparatuses described herein are not limited in this regard. In other embodiments of the present invention, substrate 210 may comprise other materials such as, for example, glass, polymers or metals. Substrate 210 may have a thickness ranging from about 50 µm to about 2,000 µm, but this is not a limitation of the present invention and in other embodiments the substrate may have any thickness. The thickness of substrate 210 may be reduced through subsequent thinning processes in some embodiments. In some embodiments a portion or all of substrate 210 may be ultimately removed from the final structure. In some embodiments substrate 210 may comprise more than one material, for example a layer of one material formed over a second material. In one example such a substrate may comprise a zinc oxide layer (ZnO) layer formed over a non-crystalline substrate. Substrate 210 may be absorbing to or substantially transparent, or translucent at a wavelength of light generated by the light-emitting device.

Substrate 210 may have a diameter in the range of about 1" to more than about 12", however the diameter of substrate 210 is not a limitation of the present invention and in other embodiments substrate 210 may have any diameter. It may be desirable for substrate 210 to have a relatively large diameter, as this permits a larger number of LED arrays or light engines to be fabricated in a batch mode on a single substrate (at the wafer level). In some embodiments of the present invention substrate 210 may have a circular shape, like that often used for conventional semiconductor processing. However this is not a limitation of the present invention and in other embodiments substrate 210 may be square, rectangular or have any arbitrary shape.

In some embodiments bottom confining region 220 may be doped n-type and top confining region 240 may be doped p-type, but this is not a limitation of the present invention and in other embodiments each layer may be either n-type, p-type or undoped. In some embodiments bottom confining region 220 may have a thickness in the range of about 0.5 µm to about 10 µm. In some embodiments active region 230 may have a thickness in the range of about 5 angstrom (Å) to about 10,000 Å. In some embodiments top confining region 240 may have a thickness in the range of about 0.05 µm to about 5 µm. Together bottom confining region 220, active region 230 and top confining region 240 may be referred to as layer structure 250. In some embodiments of the present invention LED unit 110 may comprise a plurality of active regions 230 between confining layers 220 and 240. In some embodiments of the present invention, these separate active regions may emit at the same or different wavelengths.

In some embodiments of the present invention it may be desirable to minimize the thickness of layer structure 250. For example in some embodiments of the present invention, portions of layer structure 250 may be removed, resulting in steps in layer structure 250 and minimizing the thickness of layer structure 250 may simplify the processing steps, for example removal of portions of layer structure 250 and metallization over said steps, by reducing said step or steps height.

The structure shown in FIG. 20 comprises the layer structure 250 formed over substrate 210 and may be referred to as an LED epi wafer. Bottom confining region 220, top confining region 240 and/or active region 230 may each comprise one or more layers. Bottom confining region 220 and top confining region 240 may have a bandgap relatively larger than that of all or a portion of active region 230 or of the one or more layers comprising active region 230. In some embodiments of the present invention active region 230 may comprise one or more quantum wells and barriers. In some embodiments of the present invention active region 230 may comprise one or more layers of quantum dots, or quantum wires and barriers. As is well understood by those familiar with the art, additional layers may be present and this invention is not limited in this regard. Furthermore, the layers comprising layer structure 250 may be comprised of a wide range of materials, depending on the desired properties, and in particular, the emission wavelength of the LED.

In some embodiments of the present invention top confining region 240 may comprise a Distributed Bragg Reflector (DBR) (not shown) which may act as a mirror to light of a wavelength emitted by active region 230. In some embodiments of the present invention the DBR (not shown) may have a reflectivity of higher than about 70%, or higher than about 80%, or higher than about 90% to light of a wavelength emitted by active region 230 perpendicularly incident upon said DBR. In other embodiments of the present invention a DBR (not shown) may be formed over top confining region 240 or between top confining region 240 and active region 230.

In some embodiments of the present invention layer structure 250 may comprise epitaxial layers and be formed using techniques such as metal organic vapor phase epitaxy (MOVPE), molecular beam epitaxy (MBE), hydride vapor phase epitaxy (HVPE), liquid phase epitaxy (LPE), chemical vapor deposition (CVD) or the like. In some embodiments of the present invention layer structure 250 may comprise polycrystalline or amorphous layers and be formed using techniques such as chemical vapor deposition (CVD), evaporation, sputtering or the like. However this is not a limitation of the present invention and in other embodiments layer structure 250 may be formed by any means and may be single crystal, polycrystalline or amorphous.

In one example, in which the LED may emit red/orange/yellow light, substrate 210 may comprise GaAs, bottom confining region 220, active region 230 and top confining region 240 may comprise $Al_xIn_yGa_{1-x-y}P$, with x and y adjusted in each layer such that the bandgap of bottom confining region 220 and top confining region 240 are larger than the bandgap of the light emitting layer in active region 230. In some embodiments of this example substrate 210 may be doped n-type, bottom confining region 220 may be doped n-type and top confining region 240 may be doped p-type.

In another example, in which the LED may emit UV, blue or green light, substrate 210 may comprise sapphire, bottom confining region 220, active region 230 and top confining region 240 may comprise $Al_xIn_yGa_{1-x-y}N$, with x and y adjusted in each layer such that the bandgap of bottom confining region 220 and top confining region 240 are larger than the bandgap of the light emitting layer in active region 230. In some embodiments of this example substrate 210 may be doped n-type, bottom confining region 220 may be doped n-type and top confining region 240 may be doped p-type.

In another example, in which the LED may emit UV, blue or green light, substrate 210 may comprise Si, SiC, AlN, ZnO, diamond, glass or a polymer, bottom confining region 220, active region 230 and top confining region 240 may comprise $Al_xIn_yGa_{1-x-y}N$, with x and y adjusted in each layer such that the bandgap of bottom confining region 220 and top confining region 240 are larger than the bandgap of the light emitting layer in active region 230. In some embodiments of this example substrate 210 may be doped n-type, bottom confining region 220 may be doped n-type and top confining region 240 may be doped p-type.

In some embodiments of the present invention layer structure 250 may comprise one or more buffer layers (not shown in FIG. 20) formed between bottom confining region 220 and substrate 210, the purpose of which is to improve the quality of the subsequently formed bottom confining region 220, active region 230 and top confining region 240. In one example, in which the LED may emit UV, blue or green light and substrate 210 comprises sapphire, additional buffer layers may comprise a low temperature GaN or $Al_xGa_{1-x}N$ layer and a doped GaN layer. In some embodiments of this aspect of the present invention, layer structure 250 may further comprise an insulating layer (not shown) formed over a portion of the layers within layer structure 250 but below active region 230. Said insulating layer may result in process simplification because subsequent isolation of the individual LED units 110 by removal of a portion of layer structure 250 may only need to be done down to the optional insulating layer, thus reducing the step height in one or more steps formed in layer structure 250. Said insulating layer may comprise, for example, AlN or $Al_xGa_{1-x}N$, however this is not a limitation of the present invention and in other embodiments said insulating layer may comprise any material.

Figure 47:
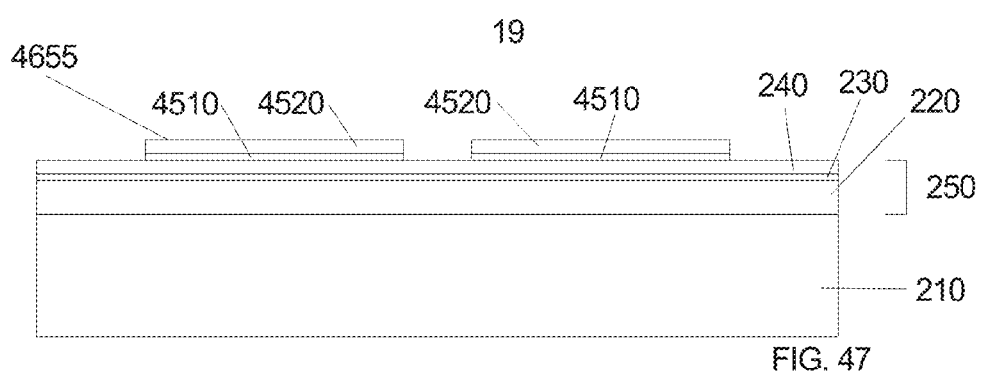
FIG. 47 is a cross-sectional view of the light emitting device of FIG. 45 at an early stage of manufacture and of an embodiment of the light emitting device of FIG. 20 at a later stage of manufacture.

FIG. 47 is a cross-sectional view of the structure of FIG. 20 at a later stage of manufacture. After formation of layer structure 250 (FIG. 20), top contact 4510 may be formed over top confining region 220 and attachment layer 4520 may be formed over top contact 4510 using well known semiconductor processes. Top contact 4510 may also be referred to as a top electrical contact. For example, in some embodiments, top electrical contact 4510 and attachment layer 4520 may be formed using a lift-off process in which the semiconductor structure of FIG. 20 is patterned using photolithography, the material comprising top electrical contact 4510 is formed over the photoresist (not shown) and the portions of top confining region 240 exposed by openings in said photoresist (not shown), the material comprising attachment layer 4520 is formed over the material forming top electrical contact 4510, removing the photoresist along with the material comprising top electrical contact 4510 and attachment layer 4520 formed over the photoresist, leaving attachment layer 4520 formed over top contact material 4510 only in open regions (not covered by photoresist), thus forming attachment layer 4520 over top electrical contact 4510, which is formed over top confining layer 240 as shown in FIG. 47.

In another example, the material comprising top electrical contact 4510 may be formed over the entire semiconductor structure shown in FIG. 20, the material comprising attachment layer 4520 may be formed over the material comprising top electrical contact 4510, patterning the material comprising attachment layer 4520 and the material comprising underlying top electrical contact 4510 using photolithography with a pattern that leaves attachment layer 4520 covered with photoresist, removing the exposed material comprising attachment layer 4520 and the material comprising top electrical contact layer 4510, and removing the remaining resist, thus forming attachment layer 4520 over top electrical contact 4510, as shown in FIG. 47. These examples are meant to be illustrative and other techniques for formation of the structure of FIG. 47 may be used as well.

In FIG. 47 attachment layer 4520 is shown as the same size as top contact 4510. However this is not a limitation of the present invention and in other embodiments attachment layer 4520 may be smaller than top contact 4510. In some embodiments of the present invention attachment layer 4520 may be smaller than top contact 4510 to prevent shorting of adjacent LED units 110 if the attachment material flows beyond the dimensions of top contact 4510 and, for example, contacts an adjacent LED unit 110.

Top electrical contact 4510 may comprise one or more layers. Top electrical contact 4510 may comprise metals, silicides or other conductive materials. The specific material(s) used for top electrical contact 4510 will depend on the specific semiconductors in layer structure 250 (FIG. 20). For example, in the case where layer structure 250 (FIG. 20) may comprise GaAs- or GaP-based semiconductors, top electrical contact 4510 may comprise Au, Au/Ge or Au/Ge/Ni. In the example where layer structure 250 (FIG. 20) may comprise GaN-based semiconductors, top electrical contact 4510 may comprise Ni/Au. In some embodiments the thickness of top electrical contact 4510 may be in the range of about 100 Å to about 5000 Å, but this is not a limitation of the present invention and in other embodiments contact material 4510 may be any thickness. In some embodiments of the present invention top electrical contact 4510 may be formed using techniques such as evaporation, sputtering, chemical vapor deposition (CVD), low pressure chemical vapor deposition (LPCVD), oxidation, spin deposition or the like.

In some embodiments of the present invention, one or more heat treatments may be required to achieve acceptable ohmic contact between top electrical contact 4510 and top confining region 240 and between interconnect layer 5410 (FIG. 45) and bottom confining region 220. Acceptable ohmic contact may mean a specific contact resistance of less than $1E-3$ $\Omega$-cm2, or less than $1E-4$ $\Omega$-cm2. Such heat treatments may be performed, for example, in a furnace, on a hot plate, in a rapid thermal anneal system or the like. Annealing temperatures may range from about 300° C. to about 800° C., however the method and time and temperature of the anneal are not limitations of the present invention and in other embodiments, other annealing methods, temperatures or temperature profiles, or times may be used. In some embodiments of the present invention, the anneal for top electrical contact 4510 may be performed prior to the formation of interconnect layer 5410. In other embodiments of the present invention, top electrical contact 4510 may be formed and annealed before formation and anneal of the bottom contact to bottom confining region 220. In all cases, it is important to note that the first-formed contact will also receive the anneal process from the second-formed contact. In some embodiments of the present invention, one anneal step may be carried out after formation of both the bottom electrical contact and top electrical contact 4510. Annealing may be done in an inert ambient, for example nitrogen, a reducing ambient, for example forming gas, or any other ambient; the annealing ambient is not a limitation of the present invention.

In some embodiments of the present invention, it may be desirable to minimize the annealing temperature and/or time or to eliminate the annealing altogether, for example when top contact 4510 and/or bottom contact to bottom confining region 220 also act as a mirror (discussed below).

In this example, reduced annealing temperatures and/or elimination of the annealing step or steps altogether may provide a higher reflectivity to a wavelength of light emitted by the light-emitting device.

Attachment layer 4520 may be used to attach the semiconductor structure of FIG. 47 to carrier 1510 (FIG. 48) in conjunction with attachment layer 1520. In one example attachment layer 4520 may comprise a solder, for example an Au/Sn solder, an In solder or an In/Sn solder. The number of elements in the solder and the composition of the solder are not a limitation of the present invention and in other embodiments, attachment layer 4520 may comprise any type of solder or composition of solder. In other embodiments of the present invention, attachment layer 4520 may comprise a glue or adhesive; the type of glue or adhesive is not a limitation of the present invention and in other embodiments attachment layer 4520 may comprise any type of glue or adhesive. In the example where attachment layer 4520 may comprise a solder, for example an Au/Sn solder, attachment layer 1520 may comprise a layer to which a solder may form a suitable bond, for example a metal such as Au, Sn, or other metals. In some embodiments of the present invention attachment layer 4520 and/or attachment layer 1520 may be formed using, for example, evaporation, plating, sputtering, CVD, LPCVD, screen printing, dispensing or other techniques. In some embodiments of the present invention attachment layer 4520 and/or attachment layer 1520 may each have a thickness in the range of about 5 nm to about 5 µm. In some embodiments of the present invention attachment layer 4520 and/or attachment layer 1520 may each have a thickness in the range of about 0.25 µm to about 3 µm.

In some embodiments of the present invention, attachment layer 4520 and/or attachment layer 1520 may have a relatively high thermal conductivity and may provide a pathway for heat removal from active regions 230 of LED units 110. In some embodiments of the present invention attachment layer 4520 and/or attachment layer 1520 may have a thermal conductivity higher than 0.5 W/cm-K, or higher than 1 W/cm-K. In some embodiments of the present invention, attachment layer 4520 and/or attachment layer 1520 may have a relatively high resistivity, for example higher than 1E4 Ω-cm, or higher than 1E5 Ω-cm, or higher than 1E6 Ω-cm, however this is not a limitation of the present invention and in other embodiments attachment layer 4520 and/or attachment layer 1520 may be semiconducting or conductive.

In some embodiments of the present invention, attachment layer 4520 and/or attachment layer 1520 may each comprise a plurality of layers. In some embodiments of the present invention, only one attachment layer may be utilized and this may be formed over the semiconductor structure of FIG. 47 or over carrier 1510 (FIG. 48).

After the deposition of attachment layer 4520 and/or attachment layer 1520 and prior to the attachment of the semiconductor structure of FIG. 47 to carrier 1510 (FIG. 48), attachment layer 4520 (FIG. 47) and/or attachment layer 1520 (FIG. 48) may be polished or planarized using, for example, chemical mechanical polishing (CMP), to form a relatively high quality bond during the attachment step.

Figure 48:
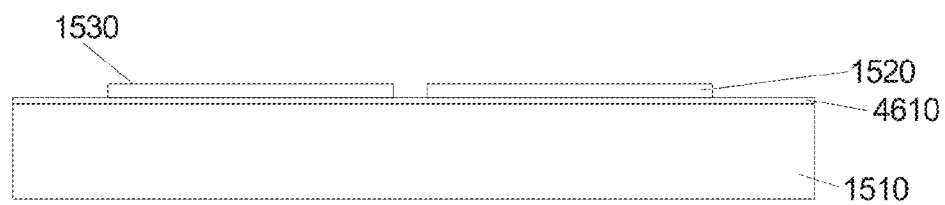
FIG. 48 is a cross-sectional view of a second carrier in accordance with an embodiment of the invention.

Referring now to FIG. 48, FIG. 48 is a cross-sectional view of carrier 1510 comprising optional insulating layer 4610 formed over carrier 1510 and attachment layer 1520 formed over optional insulating layer 4610. Carrier 1510 may comprise an insulator, a semiconductor or a conductor. Carrier 1510 may comprise, for example a semiconductor such as AlN, SiC, silicon, polysilicon, GaAs, GaP, InP, sapphire, diamond or other semiconductors and may be doped or undoped depending on the application, although the methods and apparatuses described herein are not limited in this regard. In other embodiments of the present invention, carrier 1510 may comprise other materials such as, for example, glass, polymers or metals. Carrier 1510 may have a thickness ranging from about 50 μm to about 2,000 μm, but this is not a limitation of the present invention and in other embodiments the substrate may have any thickness. The thickness of carrier 1510 may be reduced through subsequent thinning processes in some embodiments. In some embodiments of the present invention carrier 1510 may comprise more than one material, for example a layer of a first material formed over a second material. Carrier 1510 may be absorbing to or substantially transparent at a wavelength of light generated by the light-emitting device. Carrier 1510 may have a diameter in the range of about 1" to over 12", however the diameter of carrier 1510 is not a limitation of the present invention and in other embodiments carrier 1510 may have any diameter. It may be desirable for carrier 1510 to have a diameter the same as, or substantially the same as substrate 210 (FIG. 47) however this is not a limitation of the present invention and in other embodiments, carrier 1510 may have a diameter larger than or smaller than the diameter of substrate 210 (FIG. 47).

In some embodiments of the present invention carrier 1510 may have a circular shape, like that often used for conventional semiconductor processing. However this is not a limitation of the present invention and in other embodiments carrier 1510 may be square, rectangular or have any arbitrary shape. In some embodiments of the present invention the shape and size of carrier 1510 may be the same as, or substantially the same as that of substrate 210 (FIG. 47). However this is not a limitation of the present invention and in other embodiments carrier 1510 and substrate 210 may have different shapes and sizes.

In some embodiments of the present invention, carrier 1510 may have a relatively high thermal conductivity and may provide a pathway for heat removal from active regions 230 of LED units 110. In some embodiments of the present invention carrier 1510 may have a thermal conductivity higher than 0.15 W/cm-K, or higher than 0.5 W/cm-K, or higher than 1 W/cm-K. In some embodiments of the present invention, carrier 1510 may have a relatively high resistivity, for example greater than 1E4 Ω-cm, or greater than 1E5 Ω-cm, or greater than 1E6 Ω-cm, however this is not a limitation of the present invention and in other embodiments carrier 1510 may be semiconducting or conductive.

Attachment layer 1520 may comprise a material compatible with and used in conjunction with attachment layer 4520 to join attachment layer 4520 to attachment layer 1520. For example, in the example where attachment layer 4520 may comprise a solder, for example a Au/Sn solder, attachment layer 1520 may comprise a layer to which a solder may form a suitable bond, for example a metal such as Au, Sn, or other metals. In some embodiments of the present invention attachment layer 1520 may be formed using, for example, evaporation, plating, sputtering, CVD, LPCVD, screen printing, dispensing or other techniques. In some embodiments of the present invention attachment layer 1520 may have a thickness in the range of about 50 nm to about 5 μm. In some embodiments of the present invention attachment layer 1520 may have a thickness in the range of about 0.25 μm to about 3 μm.

In some embodiments of the present invention attachment layer 1520 may be patterned using standard processing techniques as shown in FIG. 48. Patterning may be used to electrically isolate each LED unit 110 from the other LED units 110 in the case where attachment layer 1520 may be electrically conductive. If attachment layer 1520 is not electrically conductive, or if top electrical contact 4510 of each LED unit 110 is electrically isolated from all other top electrical contacts 4510 of the other LED units 110, attachment layer 1520 may not need to be patterned. In some embodiments of the present invention attachment layer 1520 and/or attachment layer 4510 may be patterned and provide electrical coupling between all or a portion of LED units comprising the light engine.

Optional insulating layer 4610 may comprise, for example, silicon dioxide, silicon nitride, sapphire, high resistivity polysilicon, aluminum nitride, silicon carbide or the like. Optional insulating layer 4610 may be used to provide electrical isolation between attachment layer 1520 and carrier 1510, or between top contact 4510 and carrier 1510. In some embodiments of the present invention, optional insulating layer 4610 may be used in conjunction with carrier 1510 that is electrically conductive. In some embodiments of the present invention insulating layer 4610 may be formed using, for example, oxidation, evaporation, plating, sputtering, CVD, LPCVD, screen printing, spin deposition, dispensing or other techniques. In some embodiments of the present invention carrier 1510 may comprise silicon and insulating layer 4610 may comprise silicon dioxide formed by oxidation of a portion of the surface of carrier 1510. In some embodiments of the present invention insulating layer 4610 may have a thickness in the range of about 2 nm to about 5 μm. In some embodiments of the present invention insulting layer 4610 may have a thickness in the range of about 0.05 μm to about 0.5 μm. However the thickness of insulating layer 4610 is not a limitation of the present invention and in other embodiments, insulating layer 4610 may have any thickness or be formed by any means.

In the example shown in FIG. 48 optional insulating layer 4610 is shown as covering the entire surface of carrier 1510. However, this is not a limitation of the present invention and in other embodiments of the present invention, optional insulating layer 4610 may cover only portions of carrier 1510. In some embodiments of the present invention, attachment layer 1520 may act as an electrical conductor and provide one or more pathways for power and/or signals to LED units 110.

In some embodiments of the present invention, attachment layer 4520 (FIG. 47) and/or optional insulating layer 4610 and/or attachment layer 1520 may have a relatively high thermal conductivity and may provide a pathway for heat removal from active regions 230 of LED units 110. In some embodiments of the present invention attachment layer 4520 (FIG. 47) and/or optional insulating layer 4610 and/or attachment layer 1520 may have a thermal conductivity higher than 0.5 W/cm-K, or higher than 1 W/cm-K. In some embodiments of the present invention, attachment layer 4520 (FIG. 47) and/or optional insulating layer 4610 and/or attachment layer 1520 may have a relatively high resistivity, for example higher than 1E4 Ω-cm, or higher than 1E5 Ω-cm, or higher than 1E6 Ω-cm, however this is not a limitation of the present invention and in other embodiments attachment layer 4520 (FIG. 47) and/or optional insulating layer 4610 and/or attachment layer 1520 may be semiconducting or conductive.

In some embodiments of the present invention, attachment layer 4520 (FIG. 47) and/or optional insulating layer 4610 and/or attachment layer 1520 may each comprise a plurality of layers. In some embodiments of the present invention, only one attachment layer may be utilized and this may be formed over either the semiconductor structure of FIG. 47 or over carrier 1510 (FIG. 48). In the example shown in FIGS. 47 and 48, attachment layer 4520 comprised a solder, glue adhesive or other like materials and attachment layer 1520 comprised a material compatible with and to be used in conjunction with attachment layer 4520, however this is not a limitation of the present invention and in other embodiments, the roles of attachment layers 1520 and 4520 may be reversed.

After the formation of attachment layer 1520 (FIG. 48) and/or attachment layer 4520 (FIG. 47) and prior to the attachment or mating of these layers, attachment layer 4520 (FIG. 47) and/or attachment layer 1520 (FIG. 48) may be polished or planarized using, for example, chemical mechanical polishing (CMP), to form a relatively high quality bond during the attachment step.

Figure 49:
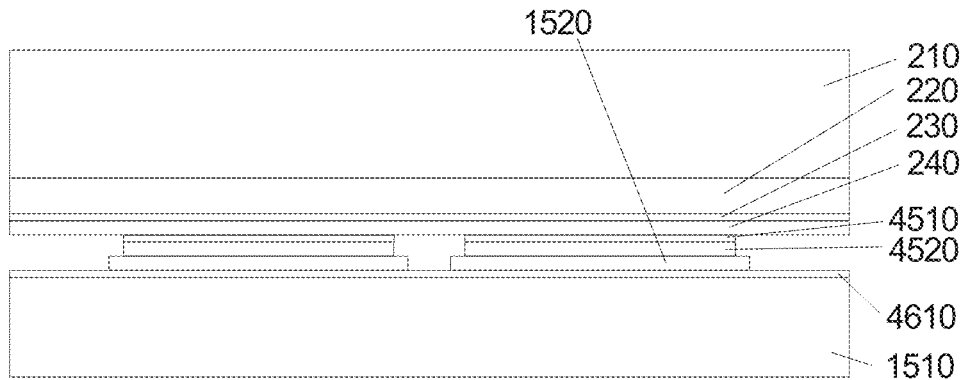
FIG. 49 is a cross-sectional view of the light emitting device of FIG. 47 at a later stage of manufacture.

FIG. 49 is a cross-sectional view of the semiconductor structure of FIG. 47 at a later stage of manufacture. After formation of attachment layer 4520 (FIG. 47) and formation of attachment layer 1520 (FIG. 48), surface 4655 of the semiconductor structure of FIG. 47 and surface 1530 of the carrier of FIG. 48 may be joined or attached, as shown in FIG. 49. The method of joining depends on the materials used for attachment layers 4520 and 1520. In some embodiments, the joining may be performed using thermocompression bonding, wafer bonding, adhesive, glue, solder or the like. In the example where attachment layer 4520 comprises an Au/Sn solder and attachment layer 1520 comprises Au, joining may be accomplished using a combination of heat and pressure, in other words using thermocompression bonding. In the case where attachment layer 4520 and/or attachment layer 1510 comprise a glue or adhesive, joining may be accomplished by mating surface 4655 (FIG. 47) and surface 1530 (FIG. 48) and the optional application of pressure and/or heat.

Figure 50:
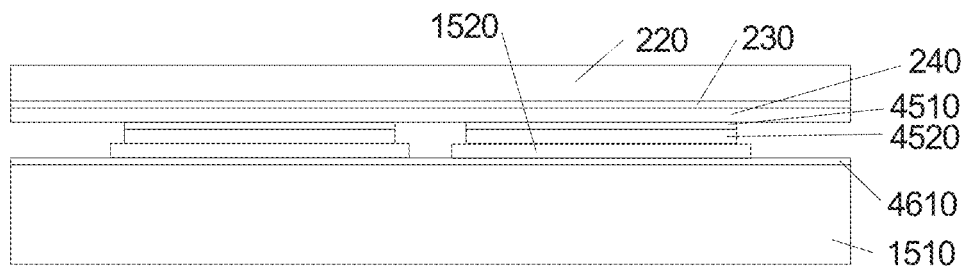
FIG. 50 is a cross-sectional view of the light emitting device of FIG. 49 at a later stage of manufacture.

FIG. 50 is a cross-sectional view of the semiconductor structure of FIG. 49 at a later stage of manufacture. After joining surface 4655 of the semiconductor structure of FIG. 47 and surface 1530 of the carrier of FIG. 48, a portion or all of substrate 210 may be optionally removed. In the example shown in FIG. 50, all of substrate 210 is removed. Substrate 210 may be removed using techniques such as lapping and polishing, CMP, wet chemical etching, reactive ion etching (RIE), laser lift-off or the like. In some embodiments of the present invention, removal of substrate 210 may comprise more than one step.

Figure 51:
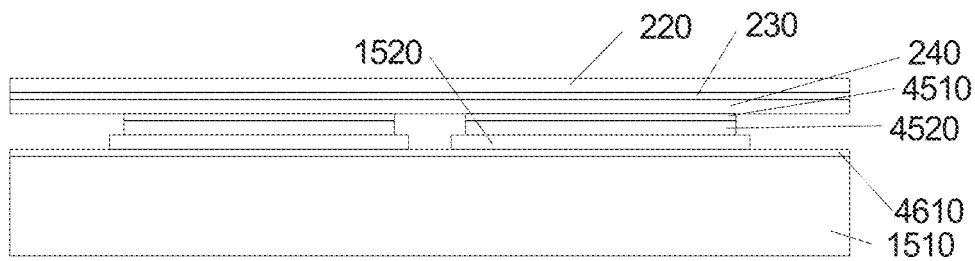
FIG. 51 is a cross-sectional view of the light emitting device of FIG. 50 at a later stage of manufacture.

FIG. 51 is a cross-sectional view of the semiconductor structure of FIG. 50 at a later stage of manufacture. After removal of substrate 210, a portion of bottom confining region 220 may be optionally removed. A portion of bottom confining region 220 may be removed using techniques such as lapping and polishing, CMP, wet chemical etching, reactive ion etching (RIE) or the like. In some embodiments of the present invention, removal of a portion of bottom confining region 220 may comprise more than one step.

In some embodiments of the present invention the amount of bottom confining region 220 remaining after removal may be in the range of about 0.05 μm to about 2 μm, however this is not a limitation of the present invention and in other embodiments any amount of bottom confining region may be left remaining, including all of bottom confining region 220 or none of bottom confining region 220. In some embodiments of the present invention it may be desirable to optimize the amount of bottom confining region 220 remaining with respect to current spreading, process simplification and light absorption. Current spreading may be improved with a relatively thicker remaining bottom confining region 220. However, processing may be easier because of the ease of photolithography and metallization and general processing over regions with relatively smaller step heights and light absorption may be less with a relatively thinner remaining bottom confining region 220.

In some embodiments of the present invention layer structure 250 (FIG. 20) may comprise an etch stop layer having a high selectivity to removal or etching compared to the material comprising bottom confining region 220. Such an etch stop layer may act as an aide to controlling the thickness of the remaining portion of bottom confining region 220 during the previous steps. In some embodiments of the present invention said etch stop layer may be formed between bottom confining region 220 and substrate 210, however this is not a limitation of the present invention and in other embodiments said etch stop layer may be formed within bottom confining region 220 or anywhere within layer structure 250 (FIG. 20).

In some embodiments of the present invention characteristics of the etch process, for example the spectral characteristics of the gas in a RIE type etch process, or the chemical constituents of the removal process, for example dry or wet etching, may be used as a marker to determine when to terminate the removal process of portions or all of bottom confining region 220. In some embodiments of the present invention layer structure 250 (FIG. 20) may comprise a marker layer for said purpose. In some embodiments of the present invention said marker layer may be formed between bottom confining region 220 and substrate 210, however this is not a limitation of the present invention and in other embodiments said marker layer may be formed within bottom confining region 220 or anywhere within layer structure 250 (FIG. 20).

Figure 52:
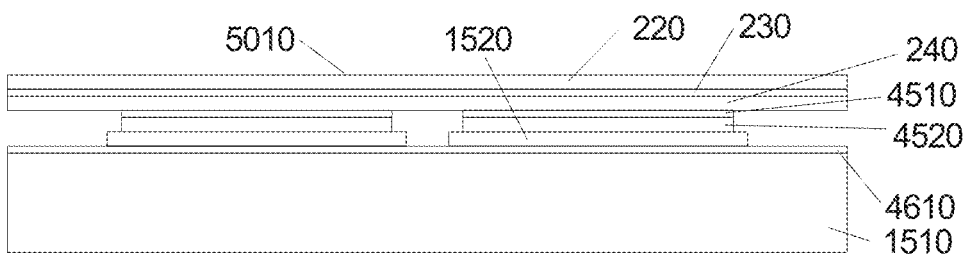
FIG. 52 is a cross-sectional view of the light emitting device of FIG. 51 at a later stage of manufacture.

FIG. 52 is a cross-sectional view of the semiconductor structure of FIG. 51 at a later stage of manufacture. After optional removal of a portion of bottom confining region 220, light extraction features 5010 may be formed in all or a portion of or on the surface of bottom confining region 220, and/or optionally in all or portions of active region 230 and top confining region 240 to improve the light extraction efficiency. In some embodiments of the present invention, light extraction features 5010 may comprise one or more anti-reflection coatings and/or surface roughening, texturing, patterning, imprinting or the like. In some examples light extraction features 5010 may be formed in a regular periodic array, however this is not a limitation of the present invention and in other embodiments, light extraction features 5010 may be formed in a random or semi-random pattern.

Figure 53:
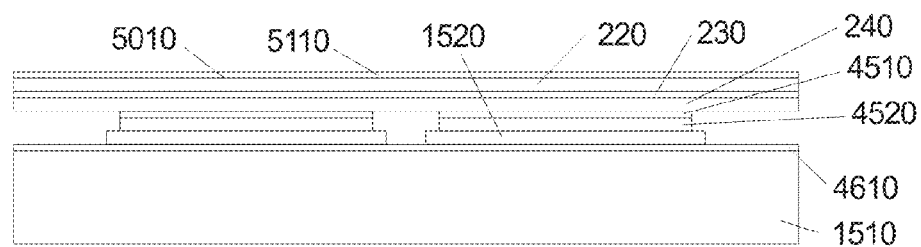
FIG. 53 is a cross-sectional view of the light emitting device of FIG. 52 at a later stage of manufacture.

FIG. 53 is a cross-sectional view of the semiconductor structure of FIG. 52 at a later stage of manufacture. After formation of light extraction features 5010, layer 5110 may be optionally formed over bottom confining region 220 and light extraction features 5010. Layer 5110 may comprise a conductive coating that is relatively transparent to a wavelength of light emitted by LED unit 110. Layer 5110 may act to improve current spreading in and across bottom confining region 220. Interconnect 5410 (FIG. 44) may make contact with the layer 5010 and bottom confining region 220 at the periphery of region 5320A (FIG. 44). The addition of layer 5110 may relatively improve the spread of current through bottom confining region 220 and active region 230, thus providing more even light generation across region 5320A (FIG. 44) and an improved LED luminous efficacy.

Layer 5110 may comprise a transparent conductive oxide, for example indium tin oxide (ITO), ZnO, AlN, SiC, conductive polymers, carbon nanotubes, thin metal layers or the like. In some embodiments of the present invention, layer 5110 may comprise a relatively thin layer of metal, such that the transparency of the metal is relatively high. Such a metal may comprise, for example, Au, Ni, Cr, Ru, or Rh. The thickness of such a metal layer may be in the range of about 0.1 nm to about 10 nm. The material comprising layer 5110 is not a limitation of the present invention.

Figure 54:
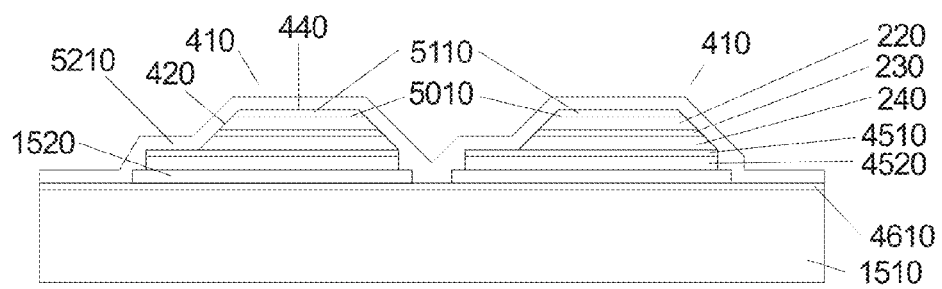
FIG. 54 is a cross-sectional view of the light emitting device of FIG. 53 at a later stage of manufacture.

FIG. 54 is a cross-sectional view of the semiconductor structure of FIG. 53 at a later stage of manufacture. After formation of layer 5110, layer 5110 and light extraction features 5010, layer structure 250 may be patterned using photolithography and etching processes to form one or more mesas 410. In some embodiments of the present invention layer 4510, layer 4520 and layer 1520 may also be patterned during this step. An isotropic or anisotropic etch process such as, for example, wet chemical etching or a reactive ion etch ("RIE"), may be used to form one or more mesas 410. In some embodiments, mesa 410 may be formed in one etch process or step, however this is not a limitation of the present invention and in other embodiments more than one etch process or step may be used to form mesa 410.

In some embodiments one or more hard mask layer(s) (not shown) may be formed over layer 5110 before patterning. Since the photoresist over layer 5110 is also etched as part of the etch used to etch portions of layer 5110, light extraction features 5010 and layer structure 250, a hard mask layer or layers may be used to prevent the undesired etching of the upper surface of layer 5110 during the formation of mesa 410. One or more hard mask layers are optional, and in alternate embodiments, the photoresist layer may be made relatively thick such that it is not completely eroded during the formation process of mesa 410, and therefore, the photoresist may be used as a masking layer rather than using a hard mask layer. A hard mask layer may comprise, for example, a dielectric such as silicon dioxide ("SiO2") or silicon nitride ("Si3N4"), or a metal, such as nickel, titanium, aluminum, gold, chromium or the like.

Mesas 410 form LED units 110 as identified in FIG. 45. Referring to FIG. 46, LED units 110 are shown as having a square shape, however this is not a limitation of the present invention and in other embodiments LED unit 110, and thus mesa 410 may be rectangular, hexagonal, circular or any arbitrary shape. FIG. 46 shows all LED units 110 having the same shape, however this is not a limitation of the present invention and in other embodiments a plurality of shapes for LED units 110, and thus mesa 410, may be employed. FIG. 46 shows each LED unit 110 being spaced apart from adjacent LED units 110 an equal distance. However, this is not a limitation of the present invention and in other embodiments the spacing between LED units 110 and thus mesas 410 may not be equal.

Mesas 410 have a top surface 440. In one example, mesa 410 may comprise a square and top surface 440 may have a length in the range of about 75 µm to about 1000 µm. In another embodiment mesa 410 may comprise a square and top surface 440 may have a length in the range of about 200 µm to about 500 µm. In some embodiments the spacing between mesas 410 may be uniform and be in the range of about 15 µm to about 10,000 µm. In another embodiment the spacing between mesas 410 may be uniform and be in the range of about 25 µm to about 200 µm.

In the example shown in FIG. 54, the etch depth (or the height of mesa 410) is equal to the thickness of layer structure 250 plus the thickness of layer 5110 and light extraction features 5010. In other words, all of layer structure 250 (FIG. 20) is removed outside of the region of mesa 410. However this is not a limitation of the present invention and in other embodiments, the etch depth may be less than that of the thickness of layer structure 250, in other words leaving all or a portion of top confining region 240 and/or all or a portion of active region 230.

The sidewalls 420 of mesa 410 may be sloped as shown in FIG. 54 and have a slope in the range of about 20 degrees to about 75 degrees. However this is not a limitation of the present invention and in other embodiments sidewalls 420 of mesa 410 may have any angle with respect to surface 440, including perpendicular or substantially perpendicular to surface 440.

After formation of mesa 410, layer 5210 may be formed over mesa 410, a portion of top contact 4510, a portion of attachment layer 4520, layer 1520 and a portion of layer 4610. Layer 5210 may comprise an insulating layer and may provide electrical isolation between mesa 410, a portion of top contact 4510 and a portion of attachment layer 4520 and/or 1520 and the subsequently formed overlying interconnect layer 5410 (FIG. 45). Layer 5210 may comprise, for example, silicon dioxide, silicon nitride, sapphire, high resistivity polysilicon, aluminum nitride, silicon carbide or the like. In some embodiments of the present invention layer 5210 may be formed using, for example, evaporation, sputtering, CVD, LPCVD, screen printing, spin deposition, dispensing or other techniques. In some embodiments of the present invention layer 5210 may have a thickness in the range of about 50 nm to about 1 µm. In some embodiments of the present invention layer 5210 may have a thickness in the range of about 0.1 µm to about 0.5 µm. However the thickness of layer 5210 is not a limitation of the present invention and in other embodiments, layer 5210 may have any thickness or be formed by any means.

Figure 55:
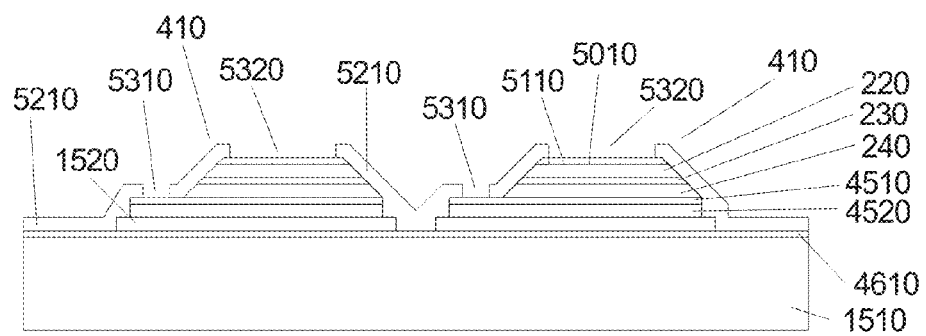
FIG. 55 is a cross-sectional view of the light emitting device of FIG. 54 at a later stage of manufacture.

FIG. 55 is a cross-sectional view of the semiconductor structure of FIG. 54 at a later stage of manufacture. After formation of layer 5210, layer 5210 may be patterned using photolithography and etching processes to form one or more openings 5310 and one or more openings 5320. Opening 5310 in layer 5210 may expose a portion of top contact layer 4510 and opening 5320 in layer 5210 may expose a portion of layer 5110 in mesa 410. Portions of layer 5210 may be removed to form opening 5310 and 5320 using for example etching techniques, for example isotropic or anisotropic etch process such as, for example, wet chemical etching or a reactive ion etch ("RIE").

Figure 56:
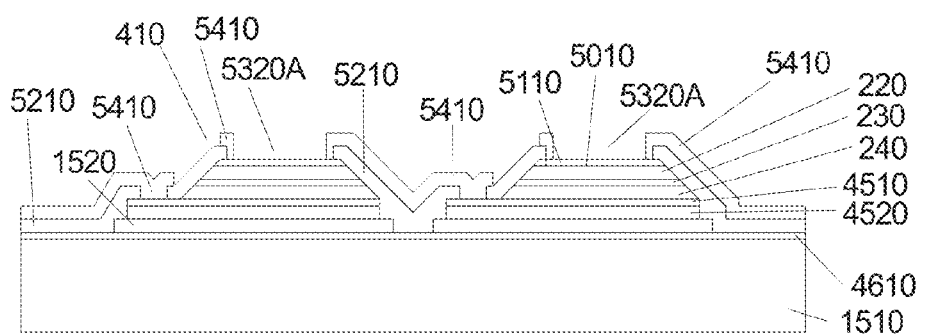
FIG. 56 is a cross-sectional view of the light emitting device of FIG. 55 at a later stage of manufacture.

FIG. 56 is a cross-sectional view of the semiconductor structure of FIG. 55 at a later stage of manufacture. After formation of one or more openings 5310 (FIG. 55) and one or more openings 5320 (FIG. 55), layer 5410 may be formed over layer 5210, opening 5310 and opening 5320 and patterned. Layer 5410 may serve several purposes. In some embodiments of the present invention a portion of layer 5410 may, through all or a portion of opening 5320, form an electrical or ohmic contact with a portion of bottom confining region 220 directly if layer 5110 is not present, or may form an electrical or ohmic contact to layer 5110 which may be electrically coupled with bottom confining region 220. In some embodiments of the present invention a portion of layer 5410 may form an electrical contact with a portion of layer 4510 through opening 5310. In some embodiments of the present invention a first portion of layer 5410 may, through a portion of opening 5320, form an electrical or ohmic contact with a portion of bottom confining region 220 directly if layer 5110 is not present, or may form an electrical or ohmic contact to layer 5110 which may be electrically coupled with bottom confining region 220 and a second portion of layer 5410 may form an electrical contact with a portion of layer 4510 through opening 5310.

In some embodiments of the present invention layer 5410 may completely cover opening 5310 as shown in FIG. 55, however this is not a limitation of the present invention and in other embodiments layer 5410 may only partially cover opening 5310 (FIG. 55). In some embodiments of the present invention layer 5410 may only partially cover opening 5320 (FIG. 54) as shown in FIG. 55, leaving opening 5320A that is not covered with layer 5410 and permitting light to escape LED unit 110 through opening 5320A. However this is not a limitation of the present invention and in other embodiments layer 5410 may completely cover opening 5320 (FIG. 55). In some embodiments of the present invention, as shown in FIGS. 56 and 45, layer 5410 may cover a portion of opening 5320 (FIG. 55) near the periphery of opening 5320 (FIG. 55), for example layer 5410 may extend about 0.25 μm to about 10 μm from the edge of opening 5320 (FIG. 55).

Referring now to FIGS. 45 and 46, in some embodiments of the present invention a first portion of layer 5410 may form contact area 120A and a second portion of layer 5410 may form contact area 120B. As discussed above, contact areas 120A and 120B may be used to provide electrical contact to the light engine. In FIG. 45, layer 5410 is shown as one layer. However this is not a limitation of the present invention and in other embodiments, layer 5410 may comprise a plurality of layers and/or materials. In FIG. 45, layer 5410 is shown as forming both a contact to contact layer 4510 and to either layer 5110 or bottom confining layer 220. However this is not a limitation of the present invention and in other embodiments an additional optional contact layer (not shown) may be formed, prior to formation of layer 5410, over all or a portion of opening 5320, thus forming an electrical or ohmic contact with a portion of bottom confining region 220 directly if layer 5110 is not present, or may form an electrical or ohmic contact to layer 5110 which may be electrically coupled with bottom confining region 220. In this embodiment, layer 5410 may then make electrical contact with the additional contact layer (not shown).

In some embodiments of the present invention, one or more heat treatments may be required to achieve acceptable ohmic contact between a portion of layer 5410 and a portion of bottom confining region 220 if layer 5110 is not present, or between a portion of layer 5410 and a portion of layer 5110 which may be electrically coupled with bottom confining region 220.

Acceptable ohmic contact may mean a specific contact resistance of less than 1E−3 Ω-cm2, or less than 1E−4 Ω-cm2. Such heat treatments may be performed, for example, in a furnace, on a hot plate, in a rapid thermal anneal system or the like. Annealing temperatures may range from about 300° C. to about 800° C., however the method and time and temperature of the anneal process are not limitations of the present invention and in other embodiments, other annealing methods, temperatures or temperature profiles, or times may be used. It is important to note that the contact between contact layer 4510 and top confining region 240 will also receive the anneal from an anneal of the contact to bottom confining region 220. In some embodiments of the present invention, one anneal step may be carried out after formation of both contacts. Annealing may be done in an inert ambient, for example nitrogen, a reducing ambient, for example forming gas, or any other ambient; the annealing ambient is not a limitation of the present invention.

In some embodiments of the present invention, it may be desirable to minimize the annealing temperature and/or time or to eliminate the annealing altogether, for example when top contact layer 4510 also act as a mirror. In this example, reduced annealing temperatures and/or elimination of the annealing step or steps altogether may provide a higher reflectivity to a wavelength of light emitted by the light-emitting device.

Layer 5410 may comprise one or more layers and may comprise metals, silicides or other conductive materials, for example metals such as gold, silver, aluminum, Au/Ge, Au/Ge/Ni and the like. The specific material(s) used for layer 5410 will depend on the specific semiconductors in layer structure 250 (FIG. 20). In some embodiments the thickness of layer 5410 may be in the range of about 200 Å to about 5 μm, but this is not a limitation of the present invention and in other embodiments layer 5410 may be any thickness. In some embodiments of the present invention layer 5410 may be formed using techniques such as evaporation, sputtering, chemical vapor deposition (CVD), low pressure chemical vapor deposition (LPCVD), oxidation, spin deposition or the like.

In the example shown in FIG. 46, openings 5310 are shown as having a rectangular shape, however this is not a limitation of the present invention and in other embodiments 5310 may be square, hexagonal, circular or any arbitrary shape.

In the example shown in FIG. 46, openings 5320 are shown as having a rectangular shape, however this is not a limitation of the present invention and in other embodiments 5320 may be square, hexagonal, circular or any arbitrary shape.

In the example shown in FIGS. 46 and 55 bottom opening 5310 and opening 5320 are shown in the same location in each LED unit 110. However, this is not a limitation of the present invention and in other embodiments opening 5310 and opening 5320 may each have different positions on all or some of LED units 110.

In some embodiments of the present invention LED unit 110 (FIGS. 45 and 46) may comprise one bottom electrical contact and one top electrical contact. However, this is not a limitation of the present invention and in other embodiments LED unit 110 may comprise a plurality of bottom electrical contacts and/or a plurality of top electrical contacts.

In some embodiments of the present invention all or some layers may be chosen on the basis of their properties to improve overall device yield and/or performance. In some embodiments of the present invention layers that are provided in an example as a single material may comprise a plurality of materials chosen on the basis of their properties to improve overall device yield and/or performance. For example, in some embodiments of the present invention attachment layer 1520 and or attachment layer 4520 may comprise a plurality of layers of different materials to reduce the overall strain and/or to increase the mechanical strength of semiconductor structure 500.

FIG. 45 is a cross-sectional view of the semiconductor structure of FIG. 56 at a later stage of manufacture. After formation of interconnect layer 5410, optional light conversion material 1810 may be formed over LED units 110 and all or portions of interconnect layer 5410. Optional light conversion material 1810 may comprise organic or inorganic phosphors or other materials capable of absorption of a portion of or all of the light emitted from active region 230 and re-emitting it at a different wavelength. In some embodiments of the present invention light conversion material 1810 may comprise a down conversion material and in other embodiments light conversion material 1810 may comprise an up conversion material.

In some embodiments of the present invention light conversion material may be formed by evaporation, screen printing, ink jet printing, other printing methods, CVD, spin deposition or the like. In some embodiments of the present invention, optional light conversion material 1810 may be suspended or embedded in a second material (not shown), and in some embodiments the second material may comprise a material with an index of refraction between that of the material in layer structure 250 (FIG. 20) and air. In one example of this embodiment such second material may comprise an epoxy, gel or resin with an index of refraction in the range of about 1.2 to about 1.7. Such a second material may act to reduce total internal reflection and increase the light extraction efficiency of the light engine.

In FIG. 45, light conversion material 1810 is shown as being formed over the LED units 110. However, this is not a limitation of the present invention and in other embodiments light conversion material 1810 may be formed over portions of LED units 110, such that a portion of the light emitted by active region 230 may exit LED unit 110 directly and a portion of the light emitted by active region 230 may be absorbed in and then re-emitted by light conversion material 1810. In some embodiments of the present invention a portion of the light emitted by active region 230 may be transmitted through light conversion material 1810 and a portion of light emitted by active region 230 may be absorbed in and then re-emitted by light conversion material 1810.

In some embodiments of the present invention light conversion material 1810 may comprise a plurality of layers or a mixture of different types of light conversion materials. In some embodiments of the present invention, a first light conversion material may be formed over a first portion of LED units 110 and a second light conversion material may be formed over a second portion of LED units 110. In one example, a first portion of LED units 110 may be covered with a first light conversion material 1810 that when mixed with the light emitted from the first portion of LED units 110 produces a warm white color and a second portion of LED units 110 may be covered with a second light conversion material 1810 that when mixed with the light emitted from the second portion of LED units 110 produces a cool white color. In one example of this embodiment, the LED units associated with the first and second light conversion materials may be separately addressable, and thus a light having either warm or cool properties may be created by separately turning on LED units 110 associated with either the warm or cool light conversion materials respectively. In this example both the first and second portions of LED units 110 may be turned on creating a neutral white color, in between that of cool white and warm white. By varying the intensity of light from said first and/or second portions of LED units 110, various color temperatures may be achieved. In this example two sub-arrays of LED units 110 and two types of light conversion materials 1810 are discussed, however this is not a limitation of the present invention and other embodiments may comprise three or more sub-arrays of LED units 110 and three or more different light conversion materials 1810. In this example two types of white light, cool and warm are discussed, however this is not a limitation of the present invention and in other embodiments multiple colors may be produced using this approach.

At this point in the manufacture of the semiconductor structure shown in FIG. 45, a plurality of complete light engines is formed on carrier 1510. FIGS. 45-56 have shown one light engine; a schematic of the entire wafer at this stage of manufacture is shown in FIG. 38. FIG. 38 shows a top view of the entire wafer at this stage of manufacture, comprising carrier 1510 and a plurality light engines 3610 formed on carrier 1510 spaced apart from each other by streets 3620. Streets 3620 may have a width in the range of about 5 μm to about 500 μm. However this is not a limitation of the present invention and in other embodiments, streets 3620 may have any width.

After removal of portion of light conversion material 1810 if necessary and exposing portions of interconnect layer 5410, individual light engines 3610 may be separated from the semiconductor structure of FIG. 38. In other words, the semiconductor structure of FIG. 38 comprises a wafer of light engines and the light engines are separated or singulated from the wafer to form separate light engines as shown in FIG. 45. Singulation may be performed using methods such as laser cutting, laser scribing, mechanical scribe and break or dicing. However, this is not a limitation of the present invention and in other embodiments other methods of separation or singulation may be used.

FIG. 38 shows all light engines 3610 formed on carrier 1510 as having the same size. However this is not a limitation of the present invention and in other embodiments, more than one size light engine may be formed on carrier 1510. In some embodiments of the present invention, different light engines formed on carrier 1510 may have different characteristics. For example they may have a different size, a different number of LED units, a different color or spectral distribution and the characteristics and variation of the characteristics of the light engines on carrier 1510 are not a limitation of the present invention.

Figure 57:
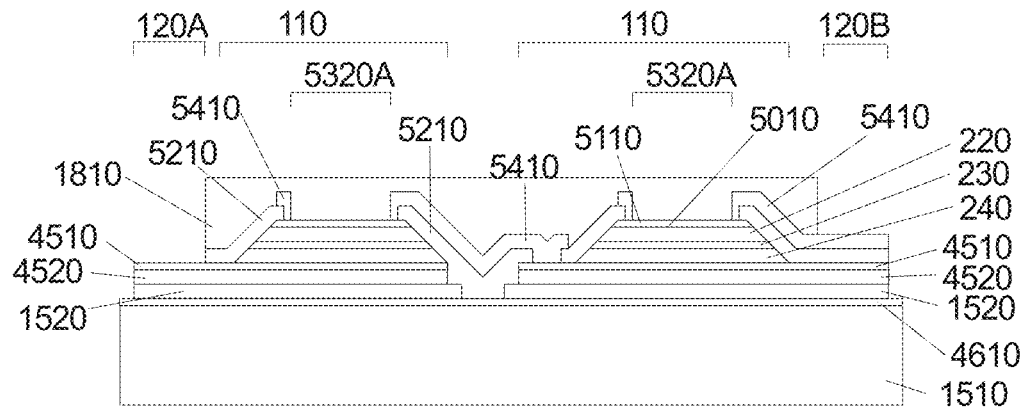
FIG. 57 is a cross-sectional view of a light emitting device made in accordance with an eleventh embodiment of the invention.

FIG. 57 shows a cross-sectional view of another embodiment of the semiconductor structure of FIG. 45. In the structure shown in FIG. 57, layer 1520 may be patterned to provide electrical isolation between LED units 110 and to form a portion of contact region 120A and a portion of contact region 120B and layer 4520 and layer 4510 may be patterned to form a portion of contact region 120A and a portion of contact region 120B. In the structure shown in FIG. 57, electrical contact to top confining region 240 may be made through layer 4510 directly from contact region 120A, in contrast to FIG. 45 where contact to top confining region 240 may be made through layer 5410 and layer 4510. In some embodiments of this aspect of the present invention, layer 4520 and/or layer 1520 may act as a parallel shunt to layer 4510 and may decrease the lateral resistance from contact region 120A to top confining region 120A. In some embodiments of this aspect of the present invention layer 1520 and/or layer 4520 and/or layer 4510 may be patterned such that they do not extend into or do not extend substantially into contact region 120B and in contact region 120B layer 5210 may be formed over carrier 1510 without one or more of the intermediate layers (layers 4610, 1520, 4520 and 4510) in between layer 5210 and carrier 1510 in contact region 120B.

Figure 58:
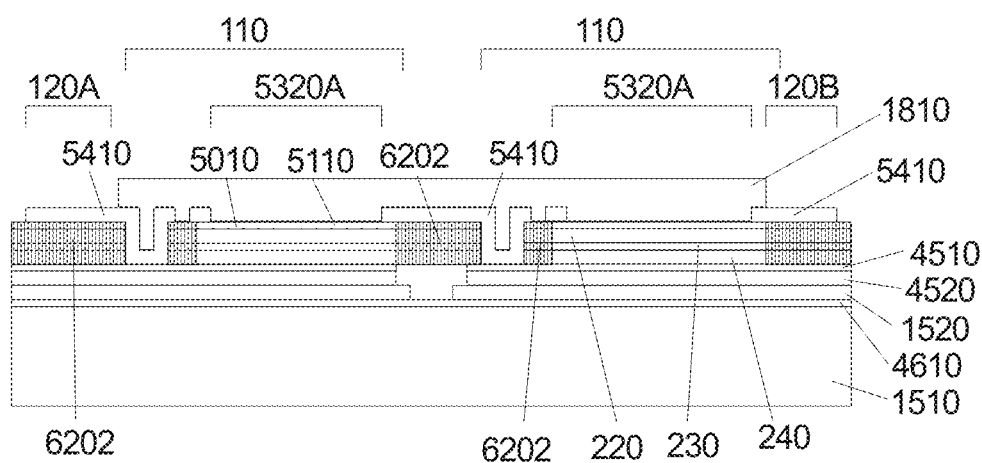
FIG. 58 is a cross-sectional view of a light emitting device made in accordance with a twelfth embodiment of the invention taken along section line 58-58 of FIG. 59.
Figure 59:
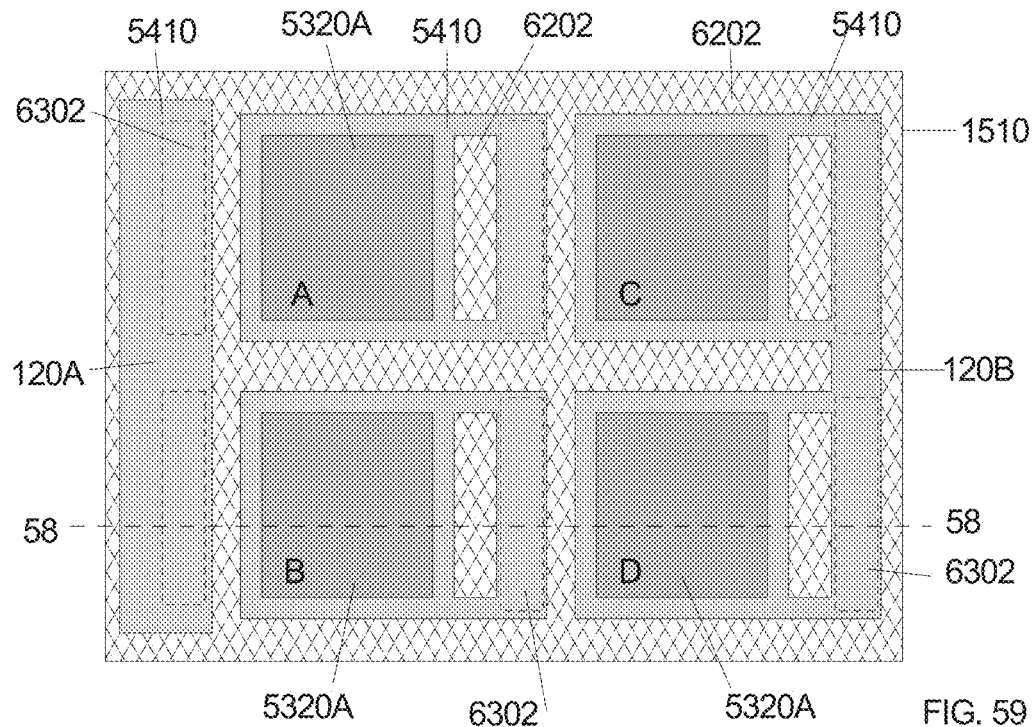
FIG. 59 is a view from the light emitting side of the semiconductor structure of FIG. 58.

FIG. 58 is a cross-sectional view of structure 600 in accordance with another embodiment of the present invention. The semiconductor structure in FIG. 58 may be referred to as a monolithically formed light system or light engine. FIG. 59 is a view of the structure of FIG. 58 from the light emitting side of structure 600, that is side of carrier 1510 over which LED units 110 may be formed and FIG. 58 is a cross-sectional view taken along section line 58-58 of FIG. 59. In FIG. 59 optional light conversion material 1810 is not shown, and opening 6302 are shown as dotted lines to indicate that they are under layer 5410.

The monolithic light engine shown schematically in FIG. 58 comprises carrier 1510, a plurality of LED units 110, layers 1520, 4610 and 4520 used to attach LED units 110 to carrier 1510, optional light conversion material 1810, interconnect layer 5410, contact regions 120A and 120B and photonic crystal regions 6202. Carrier 1510 may be referred to as a carrier, a substrate, a mechanical support, a heat sink or a first level heat sink. Layers 1520 and 4520 may be used to help attach LED units 110 to carrier 1510. LED unit 110 may comprise a bottom confining region 220, an active region 230, a top confining region 240, a portion of layer 541, a portion of top contact layer 4510 and a portion of photonic crystal region 6202.

Figure 60:
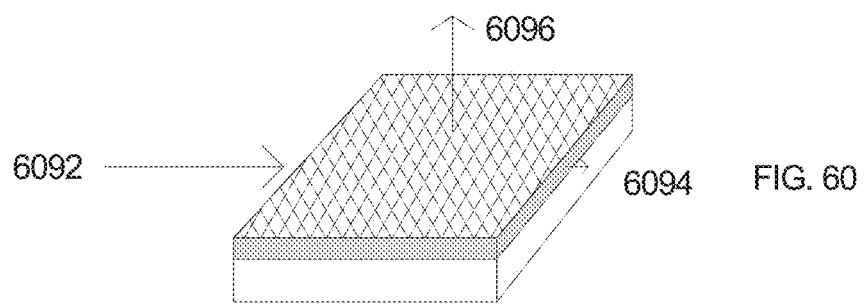
FIG. 60 is a schematic of a photonic crystal.

A photonic crystal may be used to change the direction of light impinging on it. Referring now to FIG. 60, 6902 may represent light incident upon the photonic crystal, 6906 may represent a relatively large portion of the incident light that has been caused to be emitted in a direction perpendicular to the surface of the material in which the photonic crystal is formed and 6904 may represent a relatively small portion of the incident light that is transmitted through the photonic crystal. In some prior-art LEDs a photonic crystal may be used as a method to increase light extraction and thus increase the luminous efficacy. However one problem with the prior-art use of photonic crystals is that they may cause the material from which they are formed to become non-conductive. Thus a photonic crystal that penetrates through the active region may cause a prior-art LED to be open circuited, at least in the region of the photonic crystal, thus reducing or eliminating the light generating area of the prior-art LED. In prior-art LEDs this effect may be eliminated by forming the photonic crystal only in a portion of the epitaxial layer structure above the active region, thus eliminating the possibility of open-circuiting the LED. The problem with this approach is that the photonic crystal becomes relatively much less effective. For example, consider layer structure 250 (FIG. 20). If the photonic crystal structure penetrates through the entire layer structure, then optical modes in bottom confining region 220, active region 230 and top confining region 240 (FIG. 20) may all impinge on the photonic crystal and may be directed out of the plane of layer structure 250 (FIG. 20). However if the photonic crystal structure penetrates only partially into top confining region 240 (FIG. 20), then only optical modes within top confining region 240 may impinge on the photonic crystal structure, resulting in only a portion of light within the entire layer structure 250 (FIG. 20) being directed out of the plane of layer structure 250 (FIG. 20). However, in some embodiments of the present invention, as will be discussed later, it is advantageous for photonic crystal region 6202 to be non-conductive and thus in some embodiments of the present invention photonic crystal region 6202 may penetrate all of or substantially all of layer structure 250 (FIG. 20), resulting in a high efficiency of directing light out perpendicular to the surface of the light engine. In other words, photonic crystal region 6202 may penetrate all or substantially all of layer structure 250 (FIG. 20) and cause light directed parallel to the surface of layer structure 250 (FIG. 20) to be directed out of each LED unit 110 in a direction perpendicular to the surface of the light engine, thus increasing the light extraction efficiency and the luminous efficacy.

In some embodiments of this aspect of the invention, formation of photonic crystal region 6202 may cause the portions of layer structure 250 (FIG. 20) in which photonic crystal region 6202 may be formed to be non-conductive, or insulating. In some embodiments of this aspect of the invention, formation of a plurality of closely spaced small voids or holes through or substantially through layer structure 250 (FIG. 20) may result in surface depletion regions on the surfaces of the photonic crystal region 6202, wherein said surface depletion regions may fully deplete the remaining material comprising photonic crystal region 6202, thus rendering photonic crystal region 6202 non-conductive. A non-conductive photonic crystal region 6202 leads to a reduction in the number of steps and layers in the structure and ultimately a reduction in the cost of the light engine. For example, in some embodiments of this aspect of the invention, interconnect 5410 may be formed directly on photonic crystal region 6202 because it is non-conductive, eliminating an isolation layer that may be required in other embodiments of the present invention. In another example non-conductive photonic crystal region 6202 may isolate a portion of interconnect 5410 acting as contact area 120B from the underlying top contact 4510.

Light is generated in active region 230 and exits LED unit 110 through opening 5320A. Note that in this configuration the light emitting region (opening 5320A) may be larger than in other embodiments of the present invention because in this embodiment the regions adjacent to the light emitting area may be smaller than in some other embodiments of the present invention.

In some embodiments of the present invention light extraction features 5010 may be formed in or on a portion of LED unit 110 to improve the light extraction efficiency. In some embodiments of the present invention, light extraction features may comprise one or more anti-reflection coatings and/or surface roughening, texturing, patterning, imprinting or the like. In some examples such light extraction features may be formed in a regular periodic array, however this is not a limitation of the present invention and in other embodiments, light extraction features may be formed in a random or semi-random pattern.

Some of the light generated in active region 230 may exit the active region into top confining region 240. Such light may be reflected from reflecting surfaces that reflect a wavelength of light emitted by the LED that are formed over portions of or all of top confining region 240, for example on the side of top confining region 240 adjacent to carrier 1510. In some embodiments of the present invention reflecting surfaces may also be formed over portions of or all of active region 230 and bottom confining region 220, in particular on all or a portion of the sidewalls of active region 230 and bottom confining region 220. In some embodiments of the present invention, such reflecting surfaces may have a reflectivity greater than 80% to a wavelength of light emitted by the LED, or greater than 90% to a wavelength of light emitted by the LED, or greater than 95% to a wavelength of light generated in active region 230.

Optional light conversion material 1810 may comprise organic or inorganic phosphors or other materials capable of absorption of a portion of the light emitted from active region 230 and re-emitting it at a different wavelength. In some embodiments of the present invention light conversion material 1810 may comprise a down conversion material and in other embodiments light conversion material 1810 may comprise an up conversion material. In some embodiments of the present invention, optional light conversion material 1810 may be suspended or embedded in a second material (not shown), and in some embodiments the second material may comprise a material with an index of refraction between that of the material in layer structure 250 (FIG. 20) and air. In one example of this embodiment such second material may comprise for example an epoxy, gel, or resin with an index of refraction in the range of about 1.2 to about 1.7. Such a second material may act to reduce total internal reflection and increase the light extraction efficiency of the light engine.

LED unit 110 may be formed such that the heat-generating active region 230 may be in close proximity to carrier/heat sink 1510, for example all or a portion of active region 230 may be spaced less than 10 µm, or may be less than 5 µm, or may be less than 2 µm from the surface of carrier 1510 adjacent to attachment layer 1520. In other words, the combined thickness of layer 4610, 1520, 4520, 4510 and top confining region 240 may be less than 10 µm, or may be less than 5 µm, or may be less than 2 µm. Note that in this embodiment of the present invention, the combination of thin layer structure 250 (FIG. 20) and non-conductive photonic crystal 6202 may lead to a relatively planar surface with relatively small step heights, thus leading to a relatively more simple and less costly manufacturing process.

Referring now to FIG. 59, FIG. 59 shows a top view example of semiconductor structure 500 comprising four (4) LED units 110. In FIG. 59 optional light conversion material 1810 is not shown, and openings 6302 are shown as dotted lines to indicate that they are under layer 5410. In this example LED units 110 are configured as shown in FIG. 10A, comprising two parallel strings of LEDs, each string of LEDs comprising two LED units 110. In this example electrical connection to the positive polarity terminal of the light engine may be made through contact region 120A, which comprises a portion of layer 5410 that may be coupled to the top confining region 240 of LED units 110 A and B through top contact layer 4510. Similarly, electrical connection to the negative polarity terminal of the light engine may be made through contact region 120B, which comprises a portion of layer 5410 that may be coupled to bottom confining region 220 of LED units C and D. Bottom confining region 220 of LED units A and B may be electrically coupled to top confining region 240 of LED units C and D respectively through a portion of layer 5410. In the example shown in FIG. 59, LED units 110 are configured as shown schematically in FIG. 10A. However this is not a limitation of the present invention and in other embodiments LED units may be connected in any other configuration; the connection topology is not a limitation of the present invention. For example, in some embodiments of the present invention, the individual LED units may be coupled in series as shown in FIG. 10C, in parallel as shown in FIG. 10B or a combination of series and parallel connections as shown in FIG. 10D. In some embodiments, a portion or all of the individual LED units 110 may be coupled anode to cathode as shown in FIGS. 10A to 10D while in other embodiments contact regions 120A and 120B may each have both one or more anodes and one or more cathodes of individual LED units 110 coupled to them as shown in FIG. 10E, and in other embodiments, a combination of these types of couplings may be utilized.

FIGS. 58 and 59 show an exemplary LED array with 4 LED units 110. However, the number of LED units 110 is not a limitation of the present invention and in some embodiments the LED array may comprise a larger numbers of LED units 110. In some embodiments of the present invention the number of LED units 110 in the array may be greater than 20, or may be greater than 50, or may be greater than 100 or may be greater than 250 or may be greater than 500.

Figure 61:
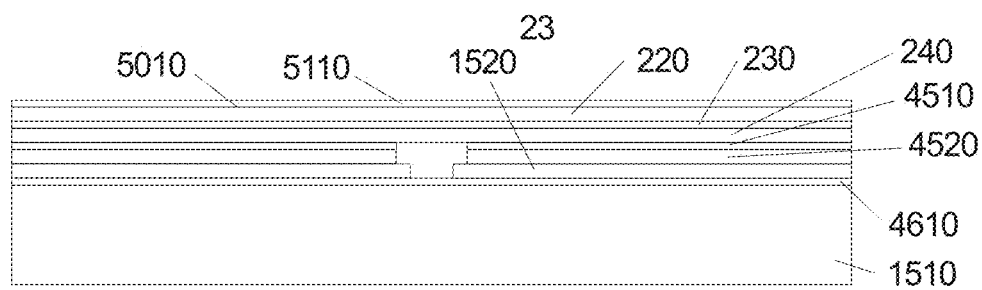
FIG. 61 is a cross-sectional view of the light emitting device of FIG. 58 at an early stage of manufacture.

FIG. 61 is a cross-sectional view of a semiconductor structure at an intermediate stage of manufacture that may be used for the further manufacture of the semiconductor structure of FIG. 59, in accordance with an embodiment of the present invention. FIG. 61 is very similar to FIG. 53 as discussed with respect to semiconductor structure 500, however, the patterning of layers 4610, 1520, 4520 and 4510 may be different. As shown in FIG. 61, as compared to FIG. 53, layers 4610, 1520, 4520 and 4510 may not be removed near the edge of the light engine periphery.

Figure 62:
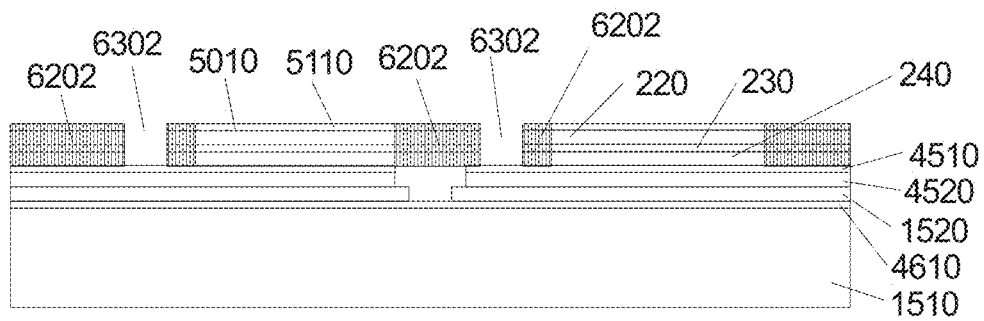
FIG. 62 is a cross-sectional view of the light emitting device of FIG. 61 at a later stage of manufacture.

Following the stages of manufacture prior to FIG. 61, layer 5110, light extraction features 5010 and layer structure 250 may be patterned using photolithography and etching processes to form one or more openings 6302 and one or more photonic crystal regions 6202 as shown in FIG. 62. Openings 6302 may expose a portion of top contact 4510. An isotropic or anisotropic etch process such as, for example, wet chemical etching or a reactive ion etch ("RIE"), may be used to form one or more openings 6302 and one or more photonic crystal regions 6202. In some embodiments, one or more openings 6302 and one or more photonic crystal regions 6202 may be formed in one etch process or step, however this is not a limitation of the present invention and in other embodiments more than one etch process or step may be used to form one or more openings 6302 and one or more photonic crystal regions 6202.

Figure 63:
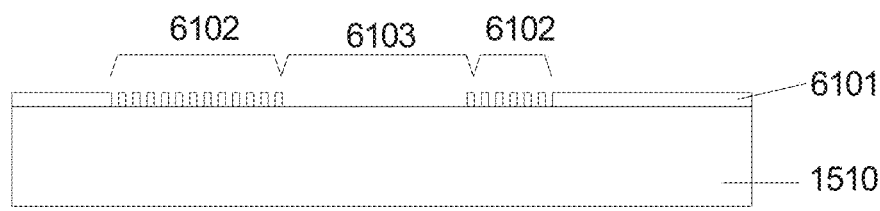
FIG. 63 is a schematic of an etch process.
Figure 64:
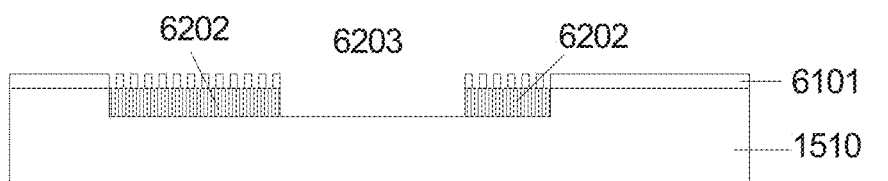
FIG. 64 is a schematic of the etch process of FIG. 63 at a later stage of manufacture.

FIG. 63 shows a cross-sectional view of an exemplary semiconductor structure patterned for a one step process to form the structure of FIG. 62. The structure in FIG. 63 comprises a mask 6101 with patterns 6102 and 6103. An opening in pattern 6103 may be relatively larger than an opening in pattern 6102. For example an opening in pattern 6103 may be in the range of about 1 µm to about 20 µm whereas an opening in pattern 6102 may be in the range of about 2 nm to about 1000 nm. Mask 6101 may comprise, for example photoresist or a hard mask, as discussed previously, however the mask material and method of patterning is not a limitation of the present invention. In some embodiments of this aspect of the invention, one etch step, in conjunction with the mask structure of FIG. 63, the structure of FIG. 64. The structure in FIG. 64 may comprise one or more openings 6203 and one or more photonic crystal or photonic lattice regions 6202.

After formation of openings 6302 and photonic crystal regions 6202, layer 5410 may be formed over photonic crystal region 6202, opening 6302 and layer 5110 and patterned. Layer 5410 may serve several purposes. In some embodiments of the present invention a portion of layer 5410 may form an electrical or ohmic contact with a portion of bottom confining region 220 directly if layer 5110 is not present, or may form an electrical or ohmic contact to layer 5110 which may be electrically coupled with bottom confining region 220. In some embodiments of the present invention a portion of layer 5410 may form an electrical contact with a portion of layer 4510 through opening 6302. In some embodiments of the present invention a first portion of layer 5410 may form an electrical or ohmic contact with a portion of bottom confining region 220 directly if layer 5110 is not present, or may form an electrical or ohmic contact to layer 5110 which may be electrically coupled with bottom confining region 220 and a second portion of layer 5410 may form an electrical contact with a portion of layer 4510 through opening 6302.

Figure 65:
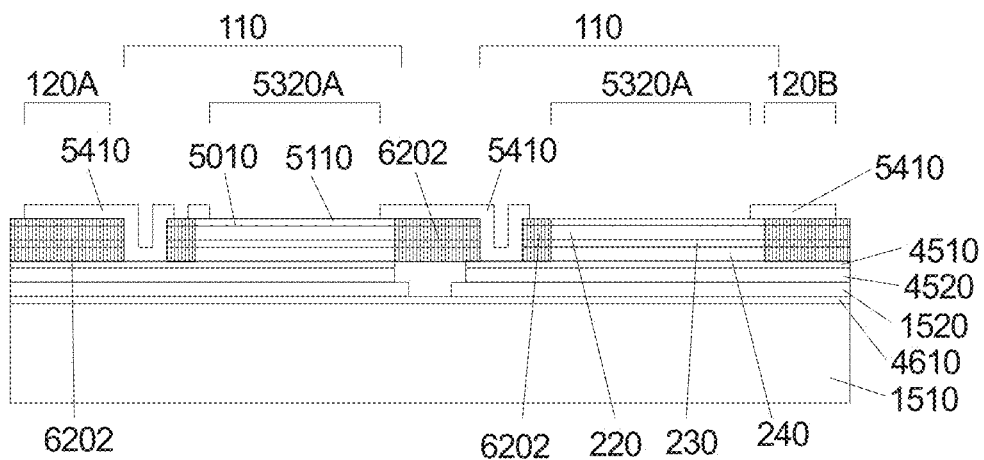
FIG. 65 is a cross-sectional view of the light emitting device of FIG. 62 at a later stage of manufacture.

In some embodiments of the present invention layer 5410 may completely cover opening 6302 as shown in FIG. 65, however this is not a limitation of the present invention and in other embodiments layer 5410 may only partially cover opening 6302 (FIG. 65). In some embodiments of the present invention layer 5410 may only partially cover the exposed portions of layer 5110, or if not present, bottom confining region 220, as shown in FIG. 65, leaving opening 5320A that is not covered with layer 5410 and permitting light to escape LED unit 110 through opening 5320A. However this is not a limitation of the present invention and in other embodiments layer 5410 may completely cover the exposed portions of layer 5110, or if not present, bottom confining region 220. In some embodiments of the present invention, as shown in FIGS. 58, 59 and 65, layer 5410 may cover a portion of the exposed portions of layer 5110, or if not present, bottom confining region 220 near the periphery of the light emitting area, for example layer 5410 may extend about 0.25 μm to about 10 μm into the light emitting area from the boundary of the light emitting area and photonic crystal region 6202.

Referring now to FIGS. 58 and 59, in some embodiments of the present invention a first portion of layer 5410 may form contact area 120A and a second portion of layer 5410 may form contact area 120B. As discussed above, contact areas 120A and 120B may be used to provide electrical contact to the light engine. In FIG. 58, layer 5410 is shown as one layer. However this is not a limitation of the present invention and in other embodiments, layer 5410 may comprise a plurality of layers and/or materials. In FIG. 58, layer 5410 is shown as forming both a contact to contact layer 4510 and to either layer 5110 or bottom confining layer 220. However this is not a limitation of the present invention and in other embodiments an additional optional contact layer (not shown) may be formed, prior to formation of layer 5410, over all or a portion of layer 5110 or bottom confining layer 220, thus forming an electrical or ohmic contact with a portion of bottom confining region 220 directly if layer 5110 is not present, or may form an electrical or ohmic contact to layer 5110 which may be electrically coupled with bottom confining region 220. In this embodiment, layer 5410 may then make electrical contact with the additional contact layer (not shown).

In some embodiments of the present invention, one or more heat treatments may be required to achieve acceptable ohmic contact between a portion of layer 5410 and a portion of bottom confining region 220 if layer 5110 is not present, or between a portion of layer 5410 and a portion of layer 5110 which may be electrically coupled with bottom confining region 220.

Acceptable ohmic contact may mean a specific contact resistance of less than 1E−3 Ω-cm2, or less than 1E−4 Ω-cm2. Such heat treatments may be performed, for example, in a furnace, on a hot plate, in a rapid thermal anneal system or the like. Annealing temperatures may range from about 300° C. to about 800° C., however the method and time and temperature of the anneal process are not limitations of the present invention and in other embodiments, other annealing methods, temperatures or temperature profiles, or times may be used. It is important to note that the contact between contact layer 4510 and top confining region 240 will also receive the anneal from an anneal of the contact to bottom confining region 220. In some embodiments of the present invention, one anneal step may be carried out after formation of both contacts. Annealing may be done in an inert ambient, for example nitrogen, a reducing ambient, for example forming gas, or any other ambient; the annealing ambient is not a limitation of the present invention.

In some embodiments of the present invention, it may be desirable to minimize the annealing temperature and/or time or to eliminate the annealing altogether, for example when top contact layer 4510 also act as a mirror. In this example, reduced annealing temperatures and/or elimination of the annealing step or steps altogether may provide a higher reflectivity to a wavelength of light emitted by the light-emitting device.

Layer 5410 may comprise one or more layers and may comprise metals, silicides or other conductive materials, for example metals such as gold, silver, aluminum, Au/Ge, Au/Ge/Ni and the like. The specific material(s) used for layer 5410 will depend on the specific semiconductors in layer structure 250 (FIG. 20). In some embodiments the thickness of layer 5410 may be in the range of about 200 Å to about 5 μm, but this is not a limitation of the present invention and in other embodiments layer 5410 may be any thickness. In some embodiments of the present invention layer 5410 may be formed using techniques such as evaporation, sputtering, chemical vapor deposition (CVD), low pressure chemical vapor deposition (LPCVD), oxidation, spin deposition or the like.

Referring to FIGS. 58 and 59, LED units 110 are shown as having a square shape, however this is not a limitation of the present invention and in other embodiments LED unit 110 may be rectangular, hexagonal, circular or any arbitrary shape. FIG. 59 shows all LED units 110 having the same shape, however this is not a limitation of the present invention and in other embodiments a plurality of shapes for LED units 110 may be employed. FIG. 59 shows each LED unit 110 being spaced apart from adjacent LED units 110 an equal distance. However, this is not a limitation of the present invention and in other embodiments the spacing between LED units 110 may not be equal.

Referring to FIGS. 58 and 59, photonic crystal regions 6202 are shown as being formed everywhere on the wafer except for the area used for LED units 110. However this is not a limitation of the invention and in other embodiments photonic crystal regions 6202 may be formed on or in only a portion of the wafer area.

FIG. 59 shows each LED unit 110 being spaced apart from adjacent LED units 110 an equal distance. However, this is not a limitation of the present invention and in other embodiments the spacing between LED units 110 may not be equal.

FIG. 59 shows a particular configuration for the contact to bottom confining region 240 as being formed around the periphery of opening 5320A. However, this is not a limitation of the present invention and in other embodiments any pattern or configuration of metallization or conductive elements may be utilized.

In some embodiments of the present invention, opening 5320A may comprise a square and may have a side length in the range of about 75 μm to about 1000 μm. In some embodiments of the present invention opening 5320A may comprise a square and may have a side length in the range of about 200 μm to about 500 μm. In some embodiments of the present invention the spacing between LED units 110 may be uniform and be in the range of about 15 μm to about 10,000 μm. In some embodiments of the present invention the spacing between LED units 110 may be uniform and be in the range of about 25 μm to about 200 μm.

In the example shown in FIGS. 58 and 59, openings 6302 are shown as having a rectangular shape, however this is not a limitation of the present invention and in other embodiments openings 6302 may be square, hexagonal, circular or any arbitrary shape.

In the example shown in FIGS. 58 and 59, openings 5320 are shown in the same location in each LED unit 110. However, this is not a limitation of the present invention and in other embodiments opening openings 5320 may each have different positions on all or some of LED units 110.

In some embodiments of the present invention LED unit 110 may comprise one bottom electrical contact and one top electrical contact. However, this is not a limitation of the present invention and in other embodiments LED unit 110 may comprise a plurality of bottom electrical contacts and/or a plurality of top electrical contacts.

In some embodiments of the present invention all or some layers may be chosen on the basis of their properties to improve overall device yield and/or performance. In some embodiments of the present invention layers that are provided in an example as a single material may comprise a plurality of materials chosen on the basis of their properties to improve overall device yield and/or performance. For example, in some embodiments of the present invention attachment layer 1520 and or attachment layer 4520 may comprise a plurality of layers of different materials to reduce the overall strain and/or to increase the mechanical strength of semiconductor structure 600.

FIG. 58 is a cross-sectional view of the semiconductor structure of FIG. 65 at a later stage of manufacture. After formation of interconnect layer 5410, optional light conversion material 1810 may be formed over LED units 110 and all or portions of interconnect layer 5410. Optional light conversion material 1810 may comprise organic or inorganic phosphors or other materials capable of absorption of a portion of or all of the light emitted from active region 230 and re-emitting it at a different wavelength. In some embodiments of the present invention light conversion material 1810 may comprise a down conversion material and in other embodiments light conversion material 1810 may comprise an up conversion material.

In some embodiments of the present invention light conversion material may be formed by evaporation, screen printing, ink jet printing, other printing methods, CVD, spin deposition or the like. In some embodiments of the present invention, optional light conversion material 1810 may be suspended or embedded in a second material (not shown), and in some embodiments the second material may comprise a material with an index of refraction between that of the material in layer structure 250 (FIG. 20) and air. In one example of this embodiment such second material may comprise an epoxy, gel or resin with an index of refraction in the range of about 1.2 to about 1.7. Such a second material may act to reduce total internal reflection and increase the light extraction efficiency of the light engine.

In FIG. 58, light conversion material 1810 is shown as being formed over the LED units 110. However, this is not a limitation of the present invention and in other embodiments light conversion material 1810 may be formed over portions of LED units 110, such that a portion of the light emitted by active region 230 may exit LED unit 110 directly and a portion of the light emitted by active region 230 may be absorbed in and then re-emitted by light conversion material 1810. In some embodiments of the present invention a portion of the light emitted by active region 230 may be transmitted through light conversion material 1810 and a portion of light emitted by active region 230 may be absorbed in and then re-emitted by light conversion material 1810.

In some embodiments of the present invention light conversion material 1810 may comprise a plurality of layers or a mixture of different types of light conversion materials. In some embodiments of the present invention, a first light conversion material may be formed over a first portion of LED units 110 and a second light conversion material may be formed over a second portion of LED units 110. In one example, a first portion of LED units 110 may be covered with a first light conversion material 1810 that when mixed with the light emitted from the first portion of LED units 110 produces a warm white color and a second portion of LED units 110 may be covered with a second light conversion material 1810 that when mixed with the light emitted from the second portion of LED units 110 produces a cool white color. In one example of this embodiment, the LED units associated with the first and second light conversion materials may be separately addressable, and thus a light having either warm or cool properties may be created by separately turning on LED units 110 associated with either the warm or cool light conversion materials respectively. In this example both the first and second portions of LED units 110 may be turned on creating a neutral white color, in between that of cool white and warm white. By varying the intensity of light from said first and/or second portions of LED units 110, various color temperatures may be achieved. In this example two sub-arrays of LED units 110 and two types of light conversion materials 1810 are discussed, however this is not a limitation of the present invention and other embodiments may comprise three or more sub-arrays of LED units 110 and three or more different light conversion materials 1810. In this example two types of white light, cool and warm are discussed, however this is not a limitation of the present invention and in other embodiments multiple colors may be produced using this approach.

At this point in the manufacture of the semiconductor structure shown in FIG. 58, a plurality of complete light engines is formed on carrier 1510. FIGS. 58-65 have shown one light engine; a schematic of the entire wafer at this stage of manufacture is shown in FIG. 38. FIG. 38 shows a top view of the entire wafer at this stage of manufacture, comprising carrier 1510 and a plurality light engines 3610 formed on carrier 1510 spaced apart from each other by streets 3620. Streets 3620 may have a width in the range of about 5 μm to about 500 μm. However this is not a limitation of the present invention and in other embodiments, streets 3620 may have any width.

After removal of a portion of light conversion material 1810 (FIG. 58) if necessary and exposing portions of interconnect layer 5410 (FIG. 58) acting as contact areas 120A and 120B (FIG. 58), individual light engines 3610 may be separated from the semiconductor structure of FIG. 38. In other words, the semiconductor structure of FIG. 38 comprises a wafer of light engines and the light engines are separated or singulated from the wafer to form separate light engines as shown in FIG. 58. Singulation may be performed using methods such as laser cutting, laser scribing, mechanical scribe and break or dicing. However, this is not a limitation of the present invention and in other embodiments other methods of separation or singulation may be used.

FIG. 38 shows all light engines 3610 formed on carrier 1510 as having the same size. However this is not a limitation of the present invention and in other embodiments, more than one size light engine may be formed on carrier 1510. In some embodiments of the present invention, different light engines formed on carrier 1510 may have different characteristics. For example they may have a different size, a different number of LED units, a different color or spectral distribution and the characteristics and variation of the characteristics of the light engines on carrier 1510 are not a limitation of the present invention.

In some embodiments of the present invention in which substrate 210 (FIG. 20) may comprise a material that may be transparent and or translucent to a wavelength of light emitted by LED unit 110, all of substrate 210 (FIG. 20) may be left in place and the light emitted by LED units 110 may be transmitted from LED units 110 through substrate 210 (FIG. 20). In some embodiments of the present invention wherein substrate 210 (FIG. 20) may be transparent to a wavelength of light emitted by LED unit 110, light extraction features may be formed in substrate 210 (FIG. 20) and/or at the interface of substrate 210 (FIG. 20) and layer structure 250 (FIG. 20) or within a region of layer structure 250 (FIG. 20) adjacent to substrate 210 (FIG. 20) to improve the light extraction efficiency. In some embodiments of the present invention, light extraction features may comprise one or more anti-reflection coatings and/or surface roughening, texturing, patterning, imprinting or the like. In some examples such light extraction features may be formed in a regular periodic array, however this is not a limitation of the present invention and in other embodiments, light extraction features may be formed in a random or semi-random pattern.

In some embodiments of the present invention wherein substrate 210 (FIG. 20) may be transparent to a wavelength of light emitted by LED unit 110, a pattern may be formed in or on substrate 210 (FIG. 20) to aid in homogenization of the light exiting the light engine or to control or shape the distribution of light exiting the light engine. Such patterns may be formed, for example by wet or dry (RIE) etching, lapping, polishing, grinding or drilling, however the method of patterning substrate 210 (FIG. 20) is not a limitation of the present invention.

Figure 66:
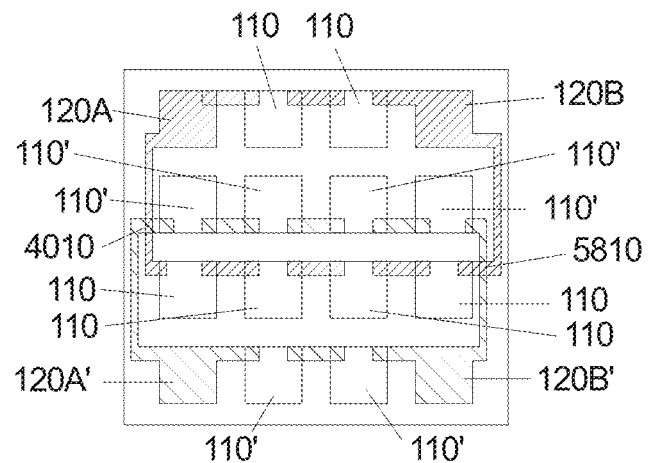
FIG. 66 is a top view of a light emitting device made in accordance with an thirteenth embodiment of the invention.

In some embodiments of the present invention a light engine may comprise a plurality of interleaved arrays of LED units 110. In other words, the light engine may comprise, for example a first, second and third array of LED units, with each LED units associated with each sub array positioned in an intermingled fashion with LED units of other sub arrays. FIG. 66 is a schematic of an embodiment of the present invention comprising a first sub-array of LED units 110 coupled together and to a first set of contact regions 120A and 120B and a second sub-array of LED units 110' coupled together and to a second set of contact regions 120A' and 120B', permitting separately addressable sub-arrays of LED units 110 and 110' within one light engine or LED array. In the example shown in FIG. 66, conductors that are a part of first sub-array of LED units 110 may have to cross conductors that are a part of second sub-array of LED units 110' and this crossing is identified in FIG. 66 as 5810. Such a crossing may comprise the two conductors separated by an insulator, but this is not a limitation of the present invention and crossings 5810 may be formed using an air bridge, wire bonds, or any other method. In some embodiments of the present invention, sub-arrays may be formed without crossings 5810. The number of sub arrays and the positioning of each LED unit 110 within each sub array is not a limitation of the present invention. In some embodiments of the present invention comprising a plurality of sub arrays of LED units 110, each sub-array of LED units 110 may comprise a different light conversion material 1810, resulting in each sub-array of LED units 110 emitting light with a different characteristic or color. In one example, one sub-array of LED units 110 may emit "cool" white light while the second sub-array of LED units 110 may emit "warm" white light. In another example one sub-array of LED units 110 may emit blue light while the second sub-array of LED units 110 may emit white light. However, the color emitted by each sub array of LED units 110 is not a limitation of the present invention and in other embodiments each sub array of LED units may emit in any color. In some embodiments of the present invention the light engine may comprise a plurality of sub-arrays of LED units 110 wherein different light conversion materials 1810 may be formed over all or portions of the LED units within each sub array. In other words, each sub array of LED units 110 may be covered or partially covered by a different light conversion material 1810. In some embodiments of this aspect of the invention, the different light conversion materials may, with or without a portion of light emitted directly by active region 230, form a plurality of components of light that collectively make light appearing white to the human eye. This is in contrast to the prior art approach of mixing the phosphors and applying them to one LED die. The approach of the present invention may provide improved color quality and LED luminous efficacy because of several reasons. First, each light conversion material is separate, thus eliminating losses related to absorption of a first wavelength of light emitted by first light conversion material 1810 by a second light conversion material 1810 and the like. Second by separating the plurality of light conversion materials, one relatively better control the intensity of the various components of light originating from each light conversion material associated with the plurality of sub arrays of LED units 110.

In some embodiments of the present invention the light engine may comprise a plurality of sub-arrays of LED units 110 wherein each sub array of LED units 110 may emit light of the same color and characteristic and the total light output of the light engine may be dimmed or reduced by selectively turning off one or more sub-arrays of LED units 110. One advantage of this approach is that the luminous efficacy of the light engine remains relatively constant under different light output levels.

In some embodiments of the present invention, a plurality of sub-arrays of LED units may be coupled to a plurality of driver or electronics and one or more control signals may be received by the plurality of drivers or electronics which may then send the appropriate signals to the light engine to change the color or characteristic of the light emitted by the light engine. In one example of this embodiment, a plurality of sub-arrays of LED units may be coupled with a different light conversion material 1810 such that each sub-array of LED units 110 emits light of a different color and/or characteristic and by varying the control signals to the drivers and or the light engine, light of a different color or characteristic may be caused to be emitted from the light engine.

In some embodiments of the present invention the light engine may comprise an array of LED units, one or more conductive elements and one or more passive and/or active circuit elements, for example conductors, resistors, capacitors, inductors, diodes or transistors. In some embodiments of the present invention the light engine may comprise an array of LED units, one or more conductive elements and one or more passive and/or active circuit elements, for example conductors, resistors, capacitors, inductors, diodes or transistors, wherein the LED units and one or more conductive elements may be formed monolithically on or over a common substrate and one or more passive and/or active circuit elements may be formed in a hybrid fashion on the common substrate or an adjacent carrier. In some embodiments of the present invention the light engine may comprise an array of LED units, one or more conductive elements and one or more passive and/or active circuit elements, for example conductors, resistors, capacitors, inductors, diodes or transistors, wherein the LED units and one or more conductive elements and one or more passive and/or active circuit elements may be formed monolithically on a common substrate.

In one example LED units 110 and one or more active and passive circuit elements may be formed in or on or over, for example, substrate 210 of FIG. 20. In another example LED units 110 may be formed in or on or over substrate 210 of FIG. 20 and one or more active and passive elements may be formed in carrier 1510 of FIG. 32. The method of formation and/or mounting of the passive and/or active circuit element is not a limitation of the present invention. Such active and/or passive circuit elements may be configured to provide additional functionality to the light engine, for example to control dimming, power management, color, intensity and the like, however the use of the additional circuit elements is not a limitation of the present invention. An advantage of this arrangement is that only one set of power lines may be required to be coupled to the light engine, thus decreasing the number of connections to the light engine.

In some embodiments of the present invention all layer structures 250 (FIG. 20) in the light engine (for example semiconductor structure 100) may emit light with the same peak wavelength or engineered spectral light distribution and/or characteristic. However, this is not a limitation of the present invention and in other embodiments, a first portion of LED units 110 comprising a first portion of layer structures 250 may emit light with a first wavelength or with a first engineered spectral light distribution and/or characteristic and a second portion of LED units 110 comprising a second portion of layer structures 250 may emit light with a second wavelength or with a second engineered spectral light distribution and/or characteristic.

Figure 67:
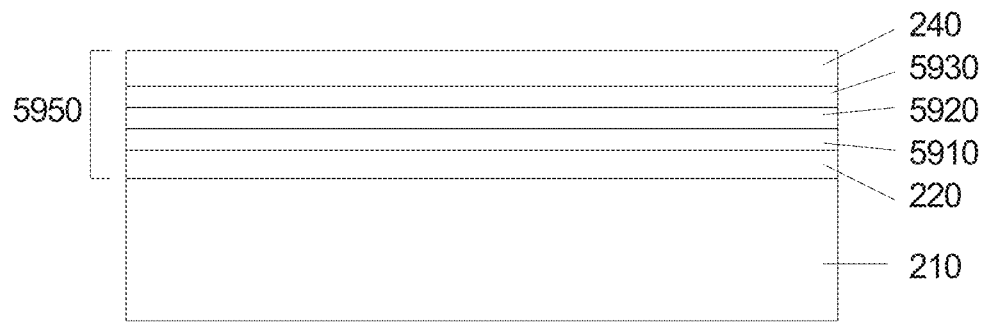
FIG. 67 is a cross-sectional view of a light emitting device made in accordance with a fourteenth embodiment of the invention.

FIG. 67 shows an example of a semiconductor structure in which layer structure 5950 may comprise two light emitting layers. In this example bottom confining region 220 may be formed over substrate 210, a first light emitting layer 5910 may be formed over bottom confining region 220, a barrier layer 5920 may be formed over first light emitting layer 5910, a second light emitting layer 5930 may be formed over barrier layer 5920 and top confining region 240 may be formed over second light emitting layer 5930. In one example the bandgap of first light emitting layer 5910 may be different than that of second light emitting layer 5930 and the bandgap of both first light emitting layer 5910 and second light emitting layer 5930 may be less than that of bottom confining region 220, barrier layer 4120 and top confining region 240. In the example shown in FIG. 67 layer structure 5950 comprises two light emitting layers. However this is not a limitation of the present invention and in other embodiments layer structure 5950 may comprise any number of light emitting layers.

In some embodiments of a semiconductor structure starting with the layer structure shown in FIG. 67, all LED units 110 may be associated with the same light conversion material 1810. However, this is not a limitation of the present invention and in other embodiments, a first portion of LED units 110 may be associated with a first conversion material 1810 and a second portion of LED units 110 may be associated with a second conversion material 1810. In other embodiments of the present invention a plurality of LED units may be associated with a plurality of different light conversion materials 1810, or may not be associated with any light conversion material 1810.

In some embodiments of a semiconductor structure starting with the layer structure shown in FIG. 67, all LED units may be powered or addressed together. However, this is not a limitation of the present invention and in other embodiments, a first sub-array of LED units 110 may be addressed in a separate fashion from a second sub-array of LED units 110. In other embodiments a plurality of sub-arrays of LED units may be separately addressable.

In the examples discussed up to now with respect to FIG. 67, all LED units emitted the same light comprising the light emitted from all light emitting layers in layer structure 5950. However, this is not a limitation of the present invention and in other embodiments different LED units may emit light of different characteristics.

Figure 68:
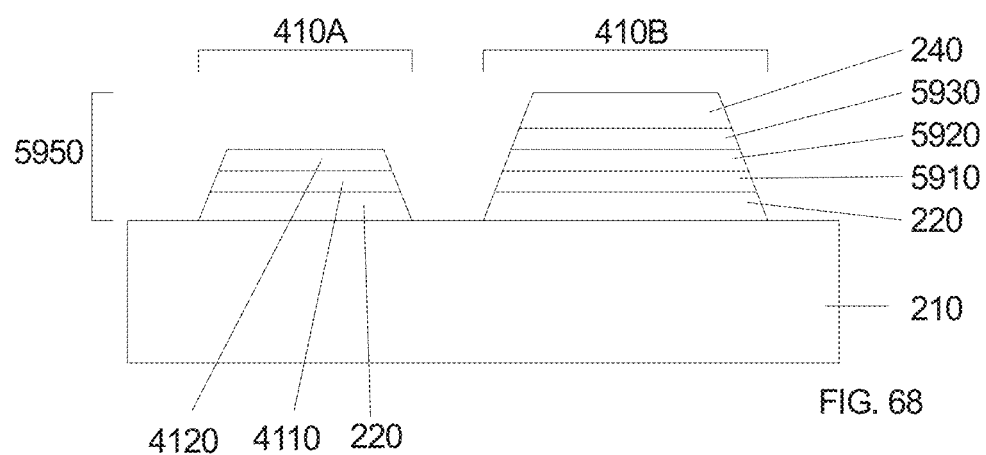
FIG. 68 is a cross-sectional view of the light emitting device of FIG. 67 at a later stage of manufacture.

FIG. 68 is a cross-sectional view of the semiconductor structure of FIG. 67 at a later stage of manufacture. After formation of layer structure 5950, a portion of top confining region 240 and second light emitting layer 5930 may be removed over barrier layer 5920 using for example photolithography and etching processes. After removal of a portion of top confining region 240 and second light emitting layer 5930, mesas 410A and 410B may be formed using for example photolithography and etching processes. Mesas 410A and 410B form LED units 110 as identified in FIG. 17 or 45 with the exception in this example that mesa 410A comprises bottom confining region 220, first light emitting layer 5910 and barrier layer 5920 and mesa 410B comprises bottom confining region 220, first light emitting layer 5910, barrier layer 5920, second light emitting layer 5930 and top confining region 240. In this example mesa 410A may result in a first LED unit 110 that emits light characteristic of first light emission layer 5910 and mesa 410B may result in a second LED unit 110 that emits light characteristic of first light emission layer 5910 and second light emission layer 5930.

In the example shown in FIGS. 67 and 68 layer structure 5950 comprises two light emitting layers. However this is not a limitation of the present invention and in other embodiments layer structure 5950 may comprise any number of light emitting layers. However, it should be recognized that numerous methods and materials may be used to make produce light emission at multiple wavelengths or with an engineered spectral light distribution and/or characteristic, and these examples do not represent limitations on the invention.

In some embodiments of a semiconductor structure starting with the structure shown in FIG. 68, all LED units may be associated with the same light conversion material 1810. However, this is not a limitation of the present invention and in other embodiments, a first portion of LED units 110 may be associated with a first conversion material 1810 and a second portion of LED units 110 may be associated with a second conversion material 1810. In other embodiments a plurality of LED units may be associated with a plurality of different light conversion materials 1810, or may not be associated with any light conversion material 1810.

In some embodiments of a semiconductor structure starting with the structure shown in FIG. 68 all LED units may be powered or addressed together. However, this is not a limitation of the present invention and in other embodiments, a first sub-array of LED units 110 may be addressed in a separate fashion from a second sub-array of LED units 110. In some embodiments of the present invention a plurality of sub-arrays of LED units may be separately addressable. In some embodiments of the present invention each LED unit 110 may be separately addressable.

In some embodiments of the present invention comprising multiple sub arrays, a first sub array may be operated in a pulsed mode with a first duty cycle and a second sub array may be operated in a pulsed mode with a second duty cycle. In some embodiments of this aspect of the present invention, the first and second duty cycle may be varied during operation. In some embodiments of this aspect of the present invention, a first sub array may be operated during a first time and a second sub array may be operated during a second later time. In some embodiments of this aspect of the present invention, a first sub array and a second sub array may be used to provide redundancy to the light emitting device, for example a first sub array may be operated for a first period of time, then a second sub array may be operated for a second period of time and this operational timing may be repeated as desired, for example to provide redundancy or to reduce the operating time of each sub array, for example in use in critical applications in which failure of the light emitting device would cause problems.

In some embodiments of the present invention, LED units may be operated in pulse mode, with the duty cycle of operation faster than a time able to be perceived by the human eye, for example less than about $\frac{1}{120}$ of a second. In this mode of operation the light emitting device may appear to be continuously on to the human eye while saving energy and operating cost by not having the light emitting device operating continuously.

In other embodiments of the present invention a plurality of mesas 410 may be formed wherein a first portion of the plurality of mesas 410 emit at a first wavelength or with a first engineered spectral light distribution and/or characteristic and a second portion of the plurality of mesas 410 emit at a second wavelength or with a second engineered spectral light distribution and/or characteristic.

For example in some embodiments of the present invention, mesas may be formed using a plurality of formation steps. In one example a first portion of the plurality of mesas 410 may be formed over a first portion of substrate 210 and subsequently a second portion of the plurality of mesas 410 may be formed over a second portion of substrate 210. In some embodiments, this process may be accomplished using selective deposition or selective epitaxy. In other embodiments, this may be accomplished by forming a first layer structure 250 over substrate 210, patterning and etching portions of first layer structure 250 to remove portions of first layer structure 250 over substrate 210, forming a second layer structure 250' over portions of substrate 210 and first layer structure 250, patterning and etching portions of second layer structure 250' to remove portions of second layer structure 250' over first layer structure 250, leaving portions of second layer structure 250' over substrate 210 and forming mesas 410 from portions of first layer structure 250 and mesas 410' from portions of second layer structure 250', wherein mesas 410 formed from portions of first layer structure 250 may emit a first wavelength or with a first engineered spectral light distribution and/or characteristic and mesas 410' formed from portions of second layer structure 250' may emit at a second wavelength or with a second engineered spectral light distribution and/or characteristic.

In some embodiments of the present invention, light conversion material 1810 and/or all or a portion of LED units 110 and/or all or a portion of the light engine may be encapsulated. For example encapsulation may be performed to protect the light engine and its component parts during subsequent manufacturing steps or to simplify subsequent manufacturing steps. In some embodiments of this aspect of the present invention, said encapsulation may be performed on the wafer level, for example after formation of light conversion material 1810. Encapsulation may be performed using conformal or non-conformal processes, using for example evaporation, spin deposition, sputtering, sol gel processing, screen printing, ink jet printing, dispensing or the like. In some embodiments of this aspect of the invention, encapsulation may be performed by forming a thin shell over the area or volume to be encapsulated and filling the space between the shell and the light engine with the encapsulating material. Encapsulation materials may include for example, silicon dioxide, silicon nitride, aluminum nitride, glass, silicon carbide, epoxy, gels, resins, hydrophobic coatings or the like. The method of encapsulation and the encapsulation materials are not a limitation of the present invention.

In some embodiments of the present invention carrier 1510 may be flexible or semi-flexible such that the entire semiconductor structure may be able to be flexed, bent, curved, rolled or otherwise formed to a variety of shapes such as a cylinder, arch or any other arbitrary shape. In some embodiments of the present invention in which carrier 1510 may be flexible or semi-flexible, portions of the semiconductor structure may be removed to permit folding or otherwise formation of a variety of three dimensional shapes, for example a sphere, a hemisphere, a cube, or any other shape, with the light emitting surfaces on the inside and/or outside of the shapes.

In some embodiments of the present invention light conversion material 1810 may comprise a material that absorbs all of or substantially all of the light emitted by active region 230 and emits light perceived to be white by the human eye. In some embodiments of this aspect of the present invention, the light engine may be less susceptible to relatively small variations in emission wavelength of active region 230, and thus provide a relatively higher yield with respect to light engine color properties.

In some embodiments of the present invention light conversion material 1810 may comprise a plurality of layers of light conversion materials wherein said plurality of light conversion materials emits light of a different wavelength. In some embodiments of this aspect of the invention light conversion material may comprise a first light conversion material 1810a formed over a second light conversion material 1810b and a third light conversion material 1810c formed over light conversion material 1810b and light conversion materials 1810a, 1810b and 1810c may emit at wavelengths $\lambda A$, $\lambda B$ and $\lambda c$ such that $\lambda A > \lambda B > \lambda c$. In some embodiments of this aspect of the invention, light from active region 230 may be incident upon light conversion material 1810a, a portion of said light may be absorbed in light conversion material 1810a and re-emitted at wavelength $\lambda A$, a portion of said light may be absorbed in light conversion material 1810b and re-emitted at wavelength $\lambda B$ and a portion of said light may be absorbed in light conversion material 1810c and re-emitted at wavelength $\lambda C$, such that the collective light emitted by the light emitting device is made up of $\lambda A$, $\lambda B$ and $\lambda c$ and optionally a portion of light emitted by active region 230. In some embodiments of this aspect of the invention, light conversion material 1810c may be relatively transparent to light of wavelengths $\lambda A$ and $\lambda B$, and light conversion material 1810b may be relatively transparent to light of wavelengths $\lambda A$.

Figure 69:
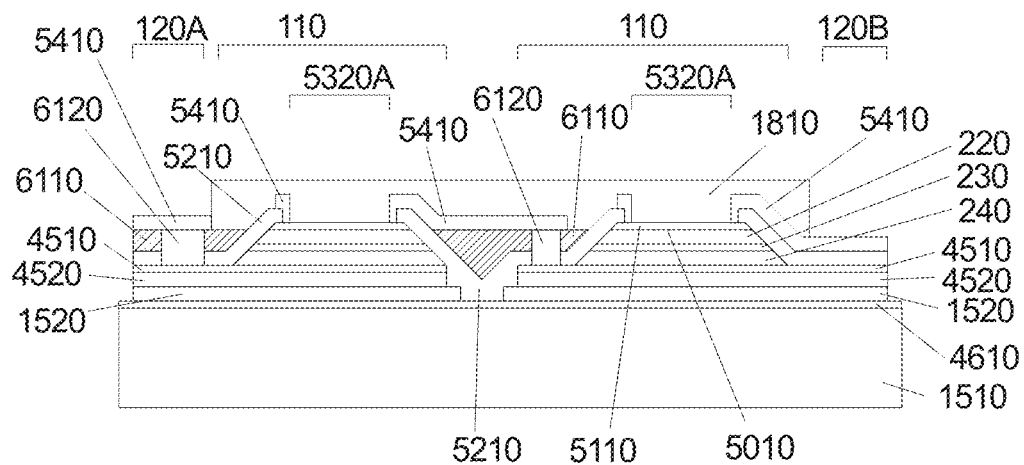
FIG. 69 is a cross-sectional view of a light emitting device made in accordance with a fifteenth embodiment of the invention.

In some embodiments of the present invention a planarization layer may be utilized to reduce the step heights and simplify processing. FIG. 69 shows a cross sectional view of a semiconductor structure similar to that of FIG. 57. The structure of FIG. 69 comprises planarization layer 6110 and optional via plugs 6120. Planarization layer 6110 acts to make the surface of the structure of FIG. 69 more planar and may comprise a polymer such as polyimide or BCB or a dielectric such as silicon oxide or silicon nitride. However the material of planarization layer 6110 is not a limitation of the present invention and in other embodiments other materials may be used. Planarization layer 6110 may be formed using techniques such as, for example, spin deposition, CVD, LPCVD, dispensing, however the method of formation of planarization layer 6110 is not a limitation of the present invention and in other embodiments other formation methods may be used. Optional via plug 6120 may be utilized to provide electrical coupling between top contact 4510 and interconnect layer 5410. Optional via plug 6120 may comprise a conductive material for example a metal or silicide such as Au, Ni, Cu, W, WSi, NSi or the like; the composition of via plug 6120 is not a limitation of the present invention. In some embodiments of the present invention where optional via plug 6120 is not utilized, interconnect 5410 may make contact directly with top contact 4510. FIG. 61 shows via plug 6120 as one material, however this is not a limitation of the present invention and in other embodiments via plug 6120 may comprise a plurality of materials.

Another aspect of the present invention is structures and methods to reduce testing and binning requirements. Testing and binning is required for prior art LEDs and has been discussed previously. Prior art LEDs are typically tested on wafer for color, intensity and forward voltage. The die are then sorted into bins and sold based on these characteristics. From a lamp manufacturers' perspective, it is desirable to have the highest available intensity (corresponding to the highest available luminous efficacy) and color and forward voltage characteristics in as narrow a range as possible. However, because of the variability of the prior art process, and the fact that the LEDs that are actually purchased may come from different wafers and different runs widely separated in time, such a tight specification results in a relatively low yield of LEDs that meet all of these criteria. The relatively low yield associated with such tight specification of packaged LEDs would lead to unacceptably high prices for the packaged LEDs and thus LED lamp manufacturers have to accept LEDs with a wider range of characteristics than desired. This leads to either the need for other systems (and cost) to homogenize the characteristics of these LEDs (for example sensors to measure the brightness and adjust the current to achieve a specified lumen output value or additional testing and binning on the part of the lamp manufacturer) or undesirable variability in the performance of LED lamps using said LEDs. Such undesired variability has an adverse impact on purchase decisions, while additional systems adds cost, the result of both of these is that sales of LED lamps are reduced.

LED lamps comprising the light engine of the present invention may have less variability in their output characteristics, for example color and intensity than prior art LED lamps because of the more uniform characteristics of the light engine and the ability to tune these characteristics on the wafer level, where costs are much less than at the die, LED package or lamp level. A key feature of LED lamps comprising the light engine of the present invention is that only one light engine is required per lamp, thus there is no need to test and match or control a plurality of packaged LEDs with different characteristics within each lamp.

Improved uniformity of characteristics and reduced testing for light engines and lamps comprising light engines of the present invention are a result of several features and processes associated with the design and manufacture of the light engine and a LED lamp comprising the light engine of the present invention.

First, the light engine of the present invention is fabricated on wafer using standard integrated circuit (IC) processing techniques and tools. Because the area of the light engine is relatively small compared to the wafer area (the light engine may be about 5 mm by about 5 mm while the wafer may be about 100 mm in diameter or larger), the uniformity of the epitaxial structure (layer structure 250 in FIG. 20) may be quite uniform over the area of one light engine. Furthermore, because all of the LED units within the light engine are fabricated simultaneously using the same processes, the processing-induced variation for the LED units comprising the light engine may be relatively smaller than the processing-induced variation achievable in LEDs from different wafers and runs manufactured at different times. Thus on an individual lamp basis, the single light engine, comprising a layer structure from a very small region of a wafer and LED units all fabricated at the same time using the same processing, may provide a more uniform set of characteristics than a plurality of packaged LEDs manufactured at different times and potentially taken from different bins. For example, because the LED units of the light engine of the present invention are all manufactured from an epitaxial structure in a very small region of the wafer, the variations in material composition or layer thickness that may cause a wavelength variation may be smaller than that achievable from a plurality of purchased packaged LEDs. In another example, the quality of the layer structure may affect the light output and luminous efficacy of the LED and, in a similar fashion, the variations in quality over a small area of a wafer may be relatively small. In both cases the variations in these characteristics in a plurality of packaged LEDs may be reduced by purchasing LEDs from narrow bins, however this may greatly increase the cost of said LEDs—in comparison the light engine of the present invention achieves improved uniformity with little to no additional cost.

The next level of variation comes at the lamp level; that is from lamp to lamp. For the prior art LED lamp, the same issues are present as within each prior art LED lamp, that is the plurality of LEDs have different characteristics and either they must be selected from narrow bins, at increased cost, or they may use additional systems to provide a more homogeneous set of characteristics from lamp to lamp, or a relatively large variation in lamp characteristics may be accepted. None of these choices is desirable and various designs and methods of the light engine of the present invention may act to reduce variations at the lamp to lamp level, as discussed next.

In some embodiments of the present invention, the light engines may be tested on wafer and their spectral and electrical characteristics recorded, for example including color, intensity and I-V characteristics. Note that this is testing of the light engine, not the LED units comprising the light engine. In an embodiment of this aspect of the invention (situation 1) of this aspect of the present invention the uniformity on wafer and from wafer to wafer is sufficient for commercial purposes and no additional processing is necessary (this may be the case for a light engine with or without light conversion material. In another embodiment of this aspect of the invention (situation 2), the uniformity variation across the wafer is known and relatively the same from wafer to wafer and in this situation action may be taken on a wafer level without the need to test every wafer—wafer testing may be done on a periodic basis in this situation. In another embodiment of this aspect of the invention (situation 3), the uniformity variation across the wafer is not constant, either within a deposition process (i.e. from wafer to wafer within one run) for the epitaxial layer structure (for example layer structure 250 (FIG. 20) or from run to run. In this situation action may be taken on a wafer level based on the results of testing of the light engine and not testing of individual LED die as must be done in prior art LEDs and LED lamps.

Several actions may be taken as part of various embodiments of the present invention. These will be discussed in the context of a light engine comprising light conversion material, for the production of what is generally termed white light. However this is not a limitation of the present invention and in other embodiments these actions may be applicable to light engines of the present invention emitting other color lights or, where applicable, light engines of the present invention with no light conversion material. The various actions to be described below may be applicable to situation 1 and situation 2; the difference is in the frequency of testing required to get the required data.

In some embodiments of this aspect of the invention, the amount of light conversion material formed over each light engine on the wafer is calculated from the map of color distribution (emission wavelength) and intensity distribution across the wafer, and the correct amount of light conversion material for each light engine is formed over each light engine on the wafer level. The light from the light engine is comprise of light emitted by the light conversion material and in some cases a portion of the light emitted directly from active region from all or a portion of LED units of the light engine. In some embodiments of this aspect of the invention, an automated system may be employed to form or dispense the correct amount of light conversion material over each light engine of the present invention.

In some embodiments of this aspect of the invention, it may not be possible to adequately correct for the color and intensity variation on a wafer only by the amount of light conversion material to be formed over the light engine, and in this situation a plurality of light conversion materials may be utilized in conjunction with the wafer map of color and intensity to form or dispense two or more different light conversion materials on all or a portion of LED units comprising the light engine. In some embodiments of this aspect of the invention, a first light conversion material may be formed over a first portion of LED units and a second light conversion material may be formed over a second portion of LED units within each light engine to provide the desired output color. In some embodiments of this aspect of the invention, a first and second light conversion material may be mixed and applied to all or a portion of LED units of the present invention. In some embodiments of this aspect of the invention both the amount and type of light conversion material may be varied, however this is not a limitation of the present invention and in other embodiments only the amount or only the type of light conversion material may be varied.

In some embodiments of this aspect of the invention, the light conversion material may be dispensed using high speed dispensing tools, however this is not a limitation of the present invention and in other embodiments other methods of forming the light conversion material may be employed. In one example the light conversion material or materials may be printed, for example using ink jet or other technologies, on the wafer and in one example of this approach an ink jet print head covering the entire wafer area with individual print heads corresponding to each light engine on the wafer may be employed to form or dispense the correct and appropriate light conversion material on all light engines simultaneously. It is important to note that testing and formation of the correct and appropriate amount of light conversion material is done on the wafer level, where automated, high speed process tools may be employed to minimize costs.

Figure 70:
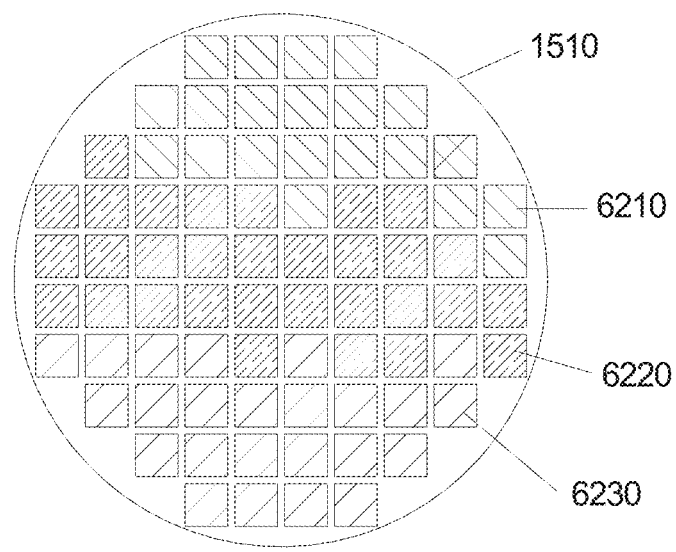
FIG. 70 is a schematic of a wafer of light emitting devices.

FIG. 70 is a wafer comprising light engines where the color and intensity distribution has been divided into three groups 6210, 6220 and 6230. In some embodiments of this aspect of the invention the light engines in each group may receive a different amount of light conversion material. In some embodiments of this aspect of the invention the light engines in each group may receive a different type and/or amount of light conversion material.

In some embodiments of the present invention, light conversion material 1810 may be chosen and formed in a way to absorb all or substantially all of the light emitted directly by active region 230. In some embodiments of this aspect of the invention, this may reduce the sensitivity of the color of light emitted by the light engine to the emission wavelength or color of the light emitted by the LED units comprising the light engine. In some embodiments of this aspect of the invention, light conversion material may comprise a material that, when excited by light of a wavelength emitted by active region 230, re-emits light that may appear white to the human eye. Such a phosphor may emit (re-emit) at several wavelengths to create the impression of white light to the human eye, for example in three wavelength ranges in approximately the red, green and blue regions of the spectrum. Such a light conversion material may be called a tri-color light conversion material or a tri-color phosphor. Said light conversion material may be less sensitive to small variations in the excitation wavelength (the light emitted from active region 230) and thus may lead to a more uniform color across the wafer of light engines and from wafer to wafer and batch to batch.

Such tri-color light conversion materials typically have a lower efficiency than materials used for white LEDs wherein a portion of the light emitted directly by the LED is mixed with the light re-emitted by the light conversion material. Such a lower efficiency further reduces the luminous efficacy of prior-art LEDs and LED lamps and thus such materials are not widely used. In the present invention, this may be less of a problem because the LED units of the light engine are operated at near peak luminous efficacy (low current or current density) and thus it may be desirable in the case of the present invention to trade off a small amount of reduction in luminous efficacy for an improvement in color uniformity and a corresponding reduction in the necessity of testing and binning. In some embodiments of this aspect of the present invention, the number of LED units in the light engine may be increased at relatively little cost to achieve a particular luminous flux of the light engine or LED lamp when using such light conversion materials (i.e. tri-color). The small increase in manufacturing cost associated with an increase in the number of LED units per light engine may be more than offset by the increased yield and reduced testing and binning requirements and may also result in an overall reduction in cost.

Another issue related to the use of light conversion materials is that their performance, and in particular their efficiency and in some cases lifetime may decrease at elevated temperatures. In the prior-art approach where LEDs are operated at high current or current density levels, a relatively large amount of heat is generated resulting in a further decrease in light output as well as a color shift for configurations where the emitted light comprises a portion of the light emitted from the active region 230 and a portion of light re-emitted by light conversion material 1810. The result of this is that the color of the prior art LED or prior art LED lamp may shift as a function of drive current (intensity) and lifetime. In prior-art LEDs one way to mitigate this is to locate the light conversion material some distance away from the die (sometimes called remote phosphor) in an attempt to keep the light conversion material relatively cooler. While this approach may have some benefits, it increases the manufacturing complexity as well as cost and in general is undesirable. In some embodiments of the present invention the sensitivity of the light conversion material to heat may be relatively greatly reduced because of the relatively lower amount of heat generated in comparison to prior art LEDs. The light engine of the present invention may generate about 2× to about 3× less heat than prior art LEDs, and thus may cause relatively much smaller thermally-induced variations in the efficiency and lifetime of the light conversion materials in comparison to prior art LEDs and lamps.

Figure 71:
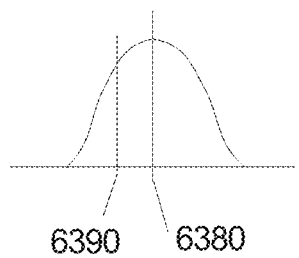
FIG. 71 is a distribution of luminous efficacy across a wafer.

In some embodiments of the present invention only the light intensity variation may need to be corrected, for example in the case of using a tri-color phosphor, as discussed above. Light intensity may correspond to a variation in luminous efficacy, and this is typically about 30% across a 3" or 4" diameter wafer. Luminous efficacy variation across a wafer is typically in the range of about 30%. In one example the peak luminous efficacy may be about 143 lm/W, the mean value may be about 110 lm/W and the minimum value may be about 77 lm/W. FIG. 71 shows such a distribution of luminous efficacy across a wafer. Marker 6380 corresponds to about the mean of the distribution and marker 6390 may correspond to a minimum acceptable value of luminous efficacy.

In one embodiment of the present invention, light engines having a luminous efficacy between markers 6390 and 6380 may comprise a first light conversion material and light engines having a luminous efficacy greater than marker 6380 may comprise a second light conversion material wherein said first light conversion material comprises a cold white light conversion material and said second light conversion material comprises a warm white light conversion material. Warm white light conversion materials typically have a relatively lower efficiency than cold white light conversion materials, for example about a 15% to about 20% lower efficiency. Applying the relatively lower efficiency second light conversion material to light engines with a relatively higher luminous efficacy and applying the relatively higher efficiency light conversion material to light engines with a relatively lower luminous efficacy may result in the ability to use all light engines, with all light engines producing substantially the same amount of light (same luminous efficacy) but with different color temperatures, thus resulting in increased yields and lower costs. In one example marker 6390 may correspond to about 95 lm/W and marker 6380 may correspond to about 110 lm/W and using a relative efficiency of about 100% for the cold white phosphor and about 85% for the warm white phosphor results in a luminous efficacy for the cold white light engine in the range of about 95 lm/W to about 110 lm/W and a minimum luminous efficacy for the warm white light of about 93.5 lm/W. The maximum of the luminous efficacy distribution is about 143 lm/W, which would correspond to about 121 lm/W with the cold white phosphor. To maintain the same range of luminous efficacy as the warm white light engines, the upper acceptable limit would be about 129 lm/W. The result of this approach is that many more of the light engines may be used in lamps without the need for intensity binning.

In some embodiments of this aspect of the invention, light intensity or luminous efficacy correction may be performed by a light sensor formed on the light engine or within the LED lamp that measures the light output and provides a correction signal to the driver electronics to change the power to the light engine to achieve the desired luminous flux. In some embodiments of this aspect of the invention, the driver electronics, in response to the sensor signal, may increase or decrease the current to the light engine. In some embodiments of this aspect of the invention, the light sensor may be integrated on or in the light engine and may be formed from all or a portion of the layers used to form the LED units.

Figure 72:
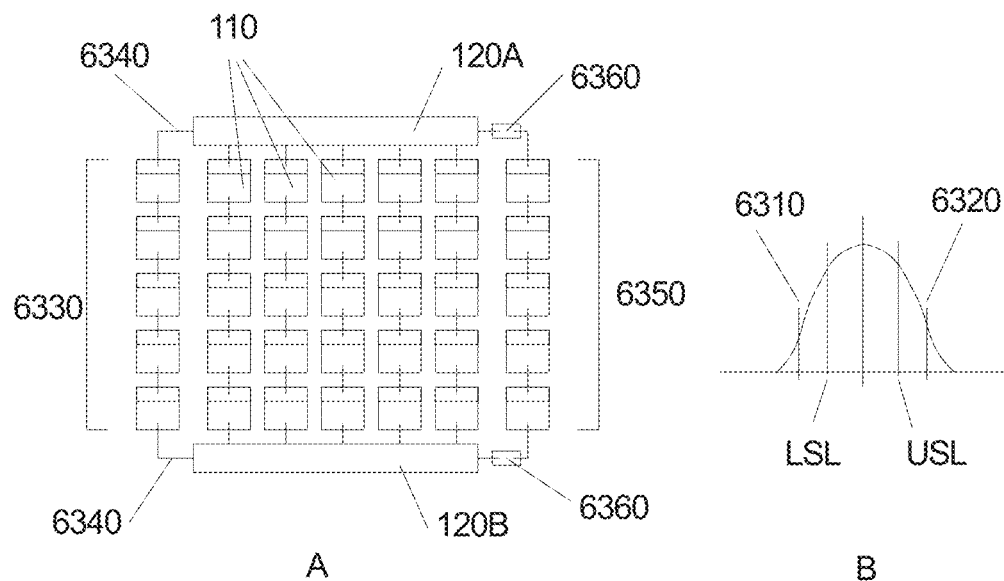
FIG. 72 (A) is a top view of a light emitting device made in accordance with a sixteenth embodiment of the invention and (B) is a distribution of intensity across a wafer.

In some embodiments of this aspect of the invention, the light engine may comprise additional LED units which are not initially electrically coupled to the light engine and/or may comprise a portion of the LED units which may be removed from the LED array after fabrication. In response to a map of intensity across the wafer, the additional or removable LED units may be added or removed to bring the intensity (or luminous flux) within the specified range. FIG. 72A shows a top view of a light engine of the present invention comprising contact areas 120A and 120B, a main array of LED units 110, a string of LED units capable of being removed from the main array identified as 6330, a string of LED units capable of being added to the main array identified as 6350, removal points 6340 and addition points 6360. Removal of LED string 6330 may be accomplished by removal of the conductive elements associated with removal points 6340, for example by laser cutting, however this is not a limitation of the present invention and in other embodiments other methods of removal of LED string 6330 may be employed. Addition of LED string 6350 may be accomplished by adding conductive elements associated at the addition points 6360 to electrically couple LED string 6350 to contact areas 120A and 120B, for example by optically enhanced CVD, local metallization or the like, however this is not a limitation of the present invention and in other embodiments other methods of adding LED string 6350 may be employed.

FIG. 72B shows an exemplary distribution of characteristics across a wafer of light engines of the present invention. The lower specification limit (LSL) and upper specification limit (USL) are shown on the distribution indicating the portion of the distribution that is within the specifications across the wafer. The portions of the distribution between 6310 and LSL and between ULS and 6320 are the portions that may be brought into the specification range by adding or removing LEDs 6350 or 6360 respectively. For example, if the intensity of a particular light engine is low LEDs 6350 may be added to that particular light engine and if the intensity of a particular light engine is too high, LEDs 6330 may be removed from that particular light engine. In some embodiments of this aspect of the invention, each light engine may have both removable and addable LEDs, however this is not a limitation of the present invention and in other embodiments each light engine may have only removable LEDs or only addable LEDs. By using addable and removable LEDs, the portion of light engines that are within the specification limits may be relatively greatly increased.

In some embodiments of the present invention, light conversion material 1810 may be mixed with at least one second material, for example an epoxy or resin or other material that may be cured using visible or ultraviolet (UV) light. In some embodiments of this aspect of the invention, after material 1810 and said second material are formed or dispensed over all or portions of the light engine, said second material may be cured by irradiation of light of the appropriate wavelength, thus fixing the phosphor in place on the light engine. In some embodiments of this aspect of the invention, this may be done when the light engines are in wafer form; that is before singulation. In some embodiments of this aspect of the invention, the same tool may apply light conversion material 1810 and said second material and effect the curing of said second material. In some embodiments of this aspect of the invention, curing may be effected by energizing the light engine, whereby the LED units of the light engine provide light of the appropriate wavelength to cure said second material.

Another aspect of the present invention comprises a lamp or luminaire comprising a light engine of the present invention and in particular a lamp comprising a monolithically formed light engine. A key feature of this aspect of the present invention is a lamp with relatively higher luminous efficacy and relatively significantly lower cost. As discussed previously prior art LED lamps and luminaires are made using a plurality of individually packaged LEDs that are mounted on a carrier or circuit board that provides electrical coupling between the individual packaged LEDs and the power supply and provides thermal coupling to remove heat generated by the individual packaged LEDs. The cost of the individual packaged LEDs and their assembly on the carrier or circuit board represent a significant portion of the cost of prior art LED lamps and luminaires. Because individual packaged LEDs have variability in their intensity (luminous efficacy), color and I-V characteristics, the LED manufacturers have to bin the LEDs, that is test and separate them into a number of categories for use by lamp or luminaire manufacturers. This leads to a lower yield of packaged LEDs that meet the lamp manufacturer's specifications and thus higher costs. For example, a typical LED process may have 8 color bins, 3 flux bins and 4 forward voltage bins. If the a customer desires to specify a portion of the LEDs from each category, for example they will take 30% of the available color bins, 55% of the available flux bins and 70% of the available forward voltage bins, the best yield for this choice is only about 11% of the full distribution. Such a low yield is not commercially acceptable, and thus at this point in time, manufacturers are limited to selecting portions of only one, or perhaps two of the three bins. For example if one prioritizes on color and accepts variations in forward voltage or flux, or one prioritizes on flux and accepts variations in color and forward voltage, the expected yield from these selections increases to about 70% to about 80% of the full distribution (Jeffrey Perkins, Yole Development, "LED Manufacturing Technologies and Costs," DOE SSL Workshop, Fairfax, Va. April 2009).

There is accordingly a need for improved LED lamps and luminaires, and specifically a need for LED lamps with higher luminous efficacy and lower cost.

Figure 73:
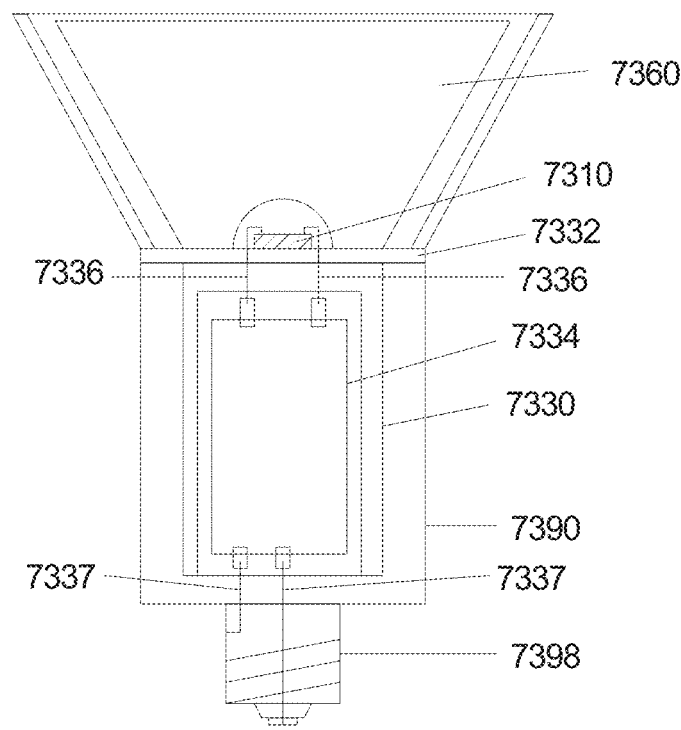
FIG. 73 is a FIG. 69 is a cross-sectional view of a light emitting device made in accordance with an embodiment of the invention.

FIG. 73 shows a cross-sectional view of a lamp comprising a light engine of the present invention. The lamp has a modular design resulting in relatively easy and short assembly times and with a relatively low assembly cost. The lamp and each module are designed for automated assembly to further reduce costs and assembly time. The lamp in FIG. 73 comprises light engine 7310, an electronics module 7330, an optics module 7360, a housing 7390 and a base 7398.

Attributes of the LED lamp of the present invention may include a LED lamp luminous efficacy greater than about 100 lm/W and a total light output from the LED lamp greater than about 1000 lm or greater than about 1500 lm. Key features of the LED lamp of the present invention may include (1) the ability to configure the connections between individual LED units comprising the array to match the maximal efficiency of the AC/DC power converter and LED driver to reduce electrical losses, (2) integration of the light engine with the lamp optics to reduce optical losses, integration of the light engine and electronics in a complete thermal management system to reduce overall heat generation and improve heat dissipation and system lifetime and integration of all aspects of the lamp design and manufacturing to reduce cost and increase luminous efficacy and lifetime.

In contrast to prior-art LED lamps, only one light engine needs to be mounted in the LED lamp of the present invention, thus greatly reducing assembly complexity and cost, increasing reliability, and also eliminating the cost of multiple packaged LEDs—the package cost can be a very significant portion of the entire cost, often more than the LED die itself.

In contrast to prior-art LED lamps, in the LED lamp of the present invention the optics may be optically coupled to the light engine, reducing the number of different index of refraction interfaces, thus decreasing optical losses and additional heat generation by absorption.

The light engine of the present invention may be provided with power from a power converter and/or LED driver. The input to the LED lamp of the present invention may typically be an AC voltage, for example 120VAC at about 60 Hz in the United States, and this may be provided through the lamp base. This is the widespread AC power available in residences and businesses. However, LEDs operate typically in a DC mode, and thus usually some type of power converter (to convert the 120VAC to a relatively lower DC voltage) and LED driver (to provide a constant drive current to the LEDs) may be incorporated into the LED lamp. This is desirable, as opposed to having the AC/DC converter and or LED driver external to the LED lamp, because an internal configuration permits easy replacement of conventional bulbs with LED bulbs with no change to the electrical or mechanical infrastructure. However, this is not a limitation of the present invention and in some embodiments the LED lamp may comprise an electronics module to permit operation of the LED lamp on AC power and in some embodiments the LED lamp may operate on DC power.

In some embodiments off-the-shelf power converters and/or LED drivers may be used. In this situation, these electrical circuits may be analyzed to determine the output voltage and current from these devices that result in the highest electrical efficiency. In some cases for the power converter, an output voltage closer to the input voltage may result in a higher electrical efficiency. The array in the light engine may then be configured to match the maximal efficiency output voltage of the power converter and/or LED driver. This may be done by connecting the LED units comprising the array in a series and/or parallel array. In some embodiments of the present invention each LED unit may have an operating voltage of about 3 V. If the optimal output voltage of the electronics system is about 45 volts, then the number of LEDs in series to best match this may be determined by dividing the driver output voltage by the LED voltage (45/3) resulting in about 15 LEDs in series to achieve about a 45V load. Each LED unit may provide about 8 lumens, and thus each series string may provide about 8 lm*15 LEDs or about 120 lumens. The number of strings in parallel may be determined by dividing the total desired lumen output by the lumen value per string. For example if the desired lumen output is about 1000 lumens, then the number of strings required is about 1000/120 or about 8 or about 9. This example has been simplified because no correction factors are used for electrical and optical losses. For example, if the electrical efficiency is about 85% and the optical efficiency of the optics and housing is about 85%, then the required amount of initial lumens from the light engine is about 1000/0.85/0.85 or about 1384 lumens. This gross amount of light may need to be further increased if there is a need to de-rate the light output of the light engine because of the need to operate it at relatively higher temperatures. However, it is an aim of this invention to operate the light engine at relatively low temperatures compared to prior-art LED lamps, and thus minimize or eliminate the need for temperature-related de-rating. It is another aim of this invention to use an integrated approach to designing the in a modular fashion to minimize efficiency losses in all areas and thus to achieve relatively high luminous efficacy compared to prior are LED lamps.

As discussed previously the light engine generates relatively less heat compared to prior-art LEDs, in some examples about 2-3× less heat, and thus the requirements of the thermal management system are relatively relaxed. In some embodiments of the present invention the junction temperature of the LED units in the light engine may be less than 65° C., or less than 60° C., or less than 55° C., or less than 50° C. This may be significantly lower than typical junction temperatures for prior art LEDs or LED lamps, which typically are at least about 85° C. The light engine may be mounted to the thermal management system, which in some examples may comprise a support structure with a relatively high thermal conductivity. In some examples this may be a metal, for example, Al, Cu, brass or other metals, or materials such as silicon, AlN, SiC or others. In some examples the support structure may be formed of the same metal as is used in all or a portion of the lamp housing and/or lamp base and/or electronics module. The electronics may also be mounted to the support structure in some examples. The support structure may be part of the lamp housing and/or lamp base, or may be coupled to them through a relatively high thermal conductivity pathway. In some examples the support structure and/or lamp housing and/or lamp base may act as a heat sink or a thermal conduction pathway to transfer heat away from the light engine and to the lamp housing, lamp base and possibly the lamp socket.

Another advantage of the relatively low heat generation and relatively low junction temperature is that the LED lamp of the present invention may have a significantly longer lifetime than prior art LED lamps. It is well known that the light output of LEDs decreases with time (they do not "burn out" as do incandescent lamps) and the rate of decrease increases with increasing operating or junction temperature. Thus the LED lamps of the present disclosure may have a relatively longer operating time (as defined as the time to get to 70% (or any other value) of the initial light output. The difference in lifetime of LEDs operated at 64° C. and 74° C. is about a factor of two longer at the lower temperature.

In other embodiments of the present invention, the LED lamp may comprise a light engine comprising a hybrid array of relatively small LED units operated near peak efficiency, mounted on a carrier or a circuit board.

In other embodiments of the present invention, a portion or all of the required electronics may be formed in or on the light engine. In some examples a portion of the electronics may be formed in the material used to make the LED, and in other examples the electronics may be formed in a carrier that supports the LED material. In other examples, all or a portion of the electronics may be mounted to the light engine in a hybrid fashion. In one example a portion or all of the electronics may be formed in a silicon carrier to which the LED material is attached. In another example one or more power conversion chips, driver chips and or other circuitry, for example resistors, capacitors, inductors, transistors, diodes, etc, may be mounted on the LED material and/or the carrier.

In another embodiment of the present invention, a custom or partially custom designed electronics package may be utilized (as opposed to an of-the-shelf) electronics package, to permit improved optimization and matching of the electronics to the light engine to provide increased luminous efficacy, lower cost, enhanced functionality, greater reliability, simplified manufacturing or for other reasons. Such a custom, or partially custom electronics package may be monolithically integrated with the light engine, mounted on the light engine, or mounted within the lamp housing, for example on the thermal management system.

As discussed above, the optics may be optically coupled to the light engine to minimize the number of different interfaces between the LED die and the exterior of the lamp. Schematically this is shown in FIG. 73, in which a single optical system is optically coupled to a single light engine. Light enters the optical system and is appropriately shaped and exits through a lens or other such surface. This design eliminates the multiple air interfaces that exist within prior-art LEDs.

Light engine 7310 has been described previously, and at this stage, comprises the complete light emitting component of the lamp. In some embodiments of the present invention light engine 7310 may comprise two contacts for electrical coupling to the LED driver. However this is not a limitation of the present invention and in other embodiments light engine 7310 may comprise more than two contacts, for example in order to separately control a plurality of sub-arrays of LED units in light engine 7310. In another example, more than two contacts may be used to electrically couple the driver to light engine 7310.

In some embodiments of the present invention electronics module 7330 may comprise a mounting element 7332 and electronics 7334. In some embodiments of the present invention electronics module 7330 may comprise components required to operate light engine 7310 from AC power. In some embodiments of the present invention electronics module 7330 may convert AC voltage to DC voltage and provide a constant current source for light engine 7310. However, this is not a limitation of the present invention and in other embodiments electronics module 7330 may provide any type of power to light engine 7310, for example, a constant DC current, a varying DC current, a pulsed DC current, an AC voltage or any arbitrary voltage and current signal.

Figure 74:
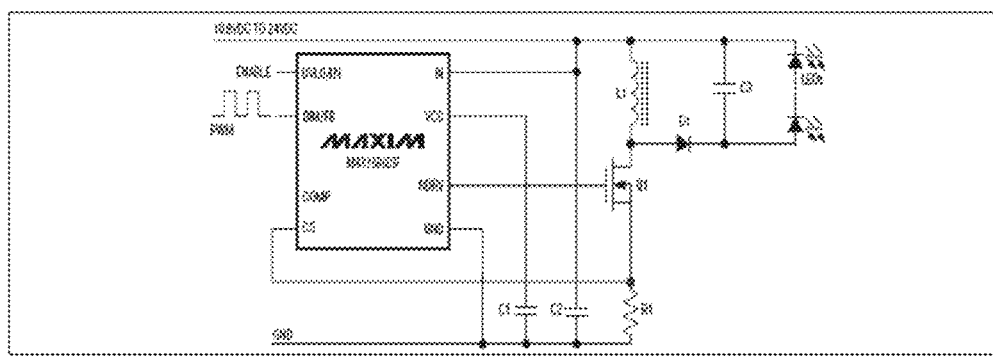
FIG. 74 is a schematic of a LED driver circuit.

In some embodiments of the present invention, electronics 7334 may comprise a driver chip and associated circuitry, for example comprising one or more conductive elements, one or active elements such as a transistor or diode and/or one or more passive elements such as a resistor, capacitor, inductor. FIG. 74 shows an example of a LED driver circuit using a Maxim 16802B LED driver chip. In this example the light engine would have contact pads for the drain, gate and source of transistor Q1 as well as both terminals of the LED array.

Additional key components include inductor L1, transistor Q1 and diode d1. Losses may occur in these elements which contribute to reducing the overall efficiency of the electronics module. In particular, in systems employing a form of switching to carry out the power conversion and or driver function, the external transistor(s) and diode(s) are switched off and on at a high rate (hundreds of kilohertz to hundreds of megahertz) and thus any switching losses in these components may contribute significantly to the overall losses in the system.

A key measure for evaluating the electrical losses that may be incurred in an active device such as a transistor or diode is the on resistance. There are many different designs for diodes and transistors that have been developed to reduce the on resistance, but an intrinsic limit is the volume resistance of the semiconductor material through which the electrical current must flow. In large measure this is determined by how large a voltage the device must be able to support in the off state. Each material has critical breakdown field strength, for example measured in V/cm. For a particular material this is fixed, and thus a minimum volume of material is required to support a voltage across the device in the off state. When the device turns on, the electrical current must flow through this volume—the larger the volume (length) of this material, the higher the on resistance. Thus the higher the breakdown field strength, the less volume of material is required, and the lower the on resistance. Most such devices are currently made using silicon which has a breakdown field strength of about 3 E5 V/cm. Other materials, for example SiC or GaN, have higher breakdown field strengths of about 1-3 E6 and 5E6 V/cm respectively. The thickness of material required to support a given off-state voltage is proportional to the square root of the breakdown field strength, and thus GaN may have an intrinsic on resistance about 3× lower than that of silicon. The difficulty in this approach is that the devices in which a low on resistance is desired must be made of a different and typically much more expensive material resulting in higher overall cost.

In some embodiments of the present invention, the layout of the LED units and contact areas may be made such that is additional space in which one or more diodes or transistors may be formed on or in layer structure 250 (FIG. 20). In some embodiments of this aspect of the invention, layer structure 250 (FIG. 20) may comprise a material with a relatively large bandgap, for example larger than about 1.7 eV or larger than about 2.5 eV. Examples of materials with relatively large bandgaps include SiC, GaN, AlGaN, InGaN and the like. This provides several advantages. First, the circuit elements may have a lower on resistance than those in relatively lower bandgap materials such as silicon because of the much higher breakdown field strength in the relatively wider bandgap materials. Second, these devices will be integrated monolithically on the light engine substrate, thus reducing the parts count, cost and number of connections. In some embodiments, circuit elements such as resistors, capacitors and inductors may also be monolithically incorporated on the light engine substrate. Even if these do not take advantage of the higher breakdown field strength of relatively wider bandgap materials, they reduce the parts count, cost and number of connections. These features may also lead to increased reliability. In some embodiments of this aspect of the invention the layer structure for the electronic circuit elements may be formed or grown over the same substrate as used for the layer structure for the light emitting device. In some embodiments of this aspect of the invention the electronic circuit elements may be formed in all or a portion of the layer structure for the light emitting device. In some embodiments of this aspect of the invention the electronic circuit elements may be electrically coupled to one or more LED units comprising the light engine, however this is not a limitation of the present invention and in other embodiments the electronic circuit elements may be electrically coupled to other components in electronics module 7330 or the electronic circuit elements may be electrically coupled to one or more LED units comprising the light engine and to other components in electronics module 7330.

Figure 75:
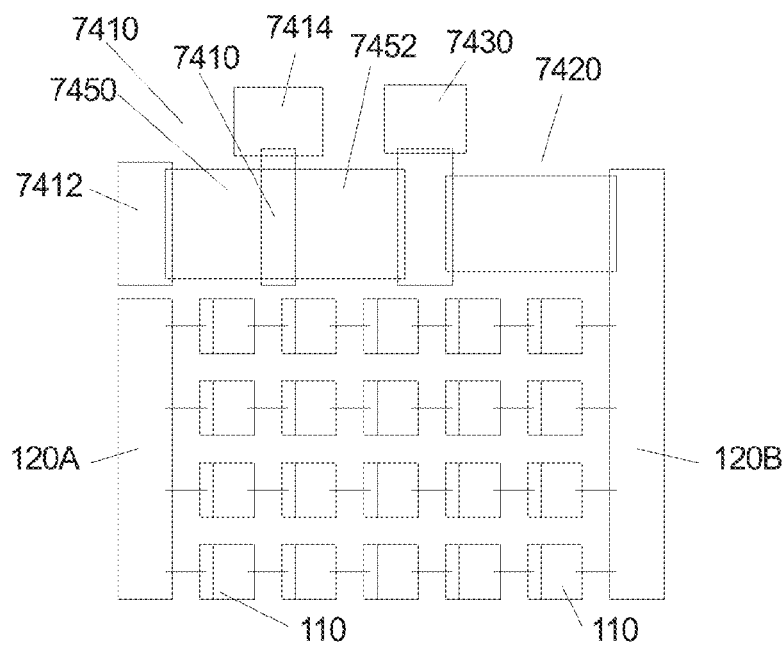
FIG. 75 is a top view of a light emitting device made in accordance with a seventeenth embodiment of the invention.

FIG. 75 shows a schematic layout of an LED array comprising contact areas 120A and 120B, LED units 110, a FET transistor 7410 and a diode 7420. In some embodiments of the present invention transistor 7410 may correspond to transistor Q1 in FIG. 74 and diode 7420 may correspond to diode D1 in FIG. 74. Contact area 7412 may be electrically coupled to a source region 7450 of transistor 7410. One terminal of diode 7420 may be electrically coupled to contact area 7430 and to a drain region 7452 of transistor 7410 and the other terminal of diode 7420 may be electrically to contact area 120B. Contact area 7414 may be electrically coupled to gate region 7454 of transistor 7410. The configuration shown in FIG. 75 is similar to that shown in the circuit schematic of FIG. 74. External components may be electrically coupled to contact area 7414, 7420 and contact areas 120A and 120B.

In some embodiments of the present invention, light engine 7310 may be mounted on one side of mounting element 7332 and electronics 7334 may be mounted on the opposite side of mounting element 7332. The contacts on light engine 7310, for example contact areas 120A and 120B (FIG. 17) may be electrically coupled to electronics 7334 through conductive elements 7336 which may pass through mounting element 7332. In some embodiments of the present invention conductive elements 7336 may be electrically isolated from light engine 7310 and/or electronics 7334. Electrical coupling of conductive elements 7336 to contact areas 120A and 120B on light engine 7310 may comprise bond wires, soldering, pressure contacts, snap contacts or the like, the method of electrical coupling is not a limitation of the present invention.

In some embodiments of the present invention, a portion or all of mounting element 7332 and optionally a portion or all of additional structural components of electronics module 7330 may comprise a thermal management system or part of a thermal management system, for example a heat sink, to aid in removal of heat generated by light engine 7310 and electronics 7334. In some embodiments of this aspect of the invention the thermal management system may comprise all or a portion of base 7398, all or a portion of housing 7390, all or a portion of mounting element 7332 and/or all or a portion of electronics module 7330.

In some embodiments of the present invention base 7398 may comprise a standard base that mates to commercially available sockets, for example an Edison screw base (E10, E11, E12, E14, E17, E26, E27 or the like), a bayonet mount or a pin base. However, this is not a limitation of the present invention and in other embodiments base 10020 may be any type of base, including a custom base made especially for one or more specialty lamps or luminaires or lighting systems. In some embodiments of the present invention, the electrical contacts on base 7398 may be electrically coupled to electronics 7334 by conductive elements 7337.

Mounting element 7332 may comprise a recess into which light engine 7310 may be mounted. However this is not a limitation of the present invention and in other embodiments light engine 7310 may be mounted over mounting element 7332 without a recess in mounting element 7332. Light engine 7310 may be mounted over mounting element 7332 using a variety of techniques, for example soldering, epoxy, adhesive, press fit or the like, the method of mounting light engine 7310 to mounting element 7332 is not a limitation of the present invention.

Figure 76:
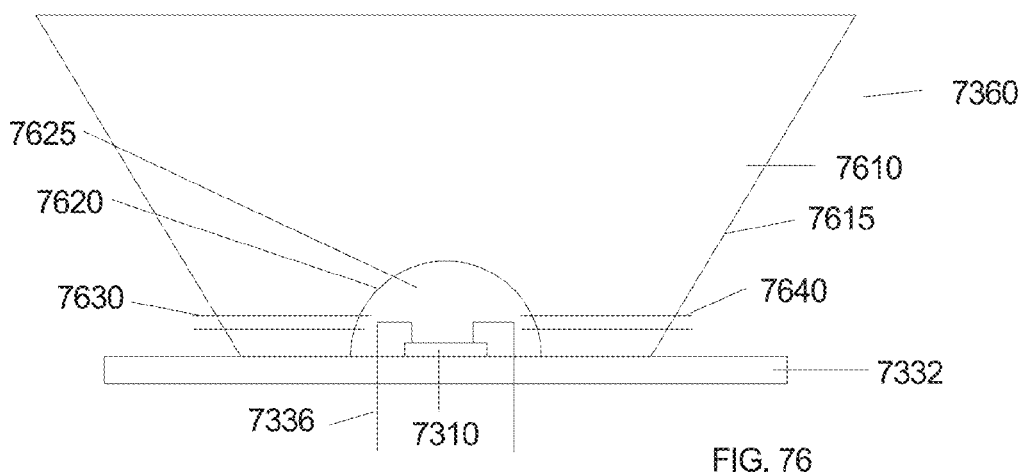
FIG. 76 is a schematic of a light engine and optical element.

FIG. 76 shows an example of optics module 7360. Optics module 7630 may comprise a single optical element 7610 optically coupled to light engine 7310. Optical element 7610 may act to focus and/or shape the light emitted by light engine 7310 to the desired illumination pattern. For example illumination patterns may include a spot pattern in which the light is relatively tightly focused to a relatively small spot, a flood pattern providing a broad distribution of light or any other pattern, the light pattern is not a limitation of the present invention.

Optical element 7610 may comprise, for example glass, plastic or other materials transparent to a wavelength of light emitted by light engine 7310. In some embodiments of the present invention, one or more portions or all of the surfaces 7615 of optical element 7610 may be reflective to a wavelength of light emitted by light engine 7310. Such reflectivity may be achieved by the application of a reflective coating over all of or portions of surfaces 7615 of optical element 7610. For example a reflective coating may comprise silver, gold aluminum or the like. In some embodiments of this aspect of the present invention, the reflective coating may comprise a plurality of layers. In other examples the reflectivity may be achieved using a Bragg reflector.

In some embodiments of the present invention, optical element 7610 may have an index of refraction in the range of about 1 to about 3. In some embodiments of the invention optical element 7610 may have an index of refraction matching that of fill material 7625 or may have an index of refraction that may provide an index matching layer between fill material 7625 and that of the space outside of the lamp (index of refraction is about 1 of air).

In some embodiments of the present invention optical element 7610 may comprise a single optical element. However this is not a limitation of the present invention and in other embodiments optical element 7610 may comprise a plurality of elements. In some embodiments of the present invention optical element 7610 may be molded to provide a relatively low cost optical element.

In some embodiments of the present invention, optical element 7610 may be attached directly to mounting element 7332 using, for example adhesive, glue or other means, or optical element may be positioned adjacent to mounting element 7332 by other means, for example a clamp or other mechanical support. In some embodiments of the invention a portion of housing 7390 may be attached to optical element 7610 and said portion of housing 7390 may be mechanically or otherwise attached to mounting element 7332 and/or other portions of housing 7390, resulting in the coupling of optical element 7610 to light engine 7310. Optical element 7610 may have one or more cavities 7620 into which light engine 7310 may be positioned and which may completely or partially surround light engine 7310. Contact areas on light engine 7310 may be electrically coupled to conductive elements within cavity 7620 or on mounting element 7332 to permit eventual coupling to electronics module 7330.

After positioning of optical element 7610 on mounting element 7332 such that light engine 7310 may be within or partially within cavity 7620, cavity 7620 may be filled with a fill material 7625 with an appropriate index of refraction. Fill material 7625 may also be called filler material. In some embodiments of this aspect of the invention fill material 7625 may have an index of refraction matching that of optical element 7610, and in other cases fill material 7625 may have an index of refraction matching that may provide an index matching layer between light engine 7310 and optical element 7610. In some embodiments of this aspect of the invention, fill material 7625 may contain light conversion material 1810, however this is not a limitation of the present invention and in other embodiments light conversion material 1810 may be part of light engine 7310 or may be part of the optics module 7360 or some combination of these examples. Optical element 7610 and/or optic module 7630 may be attached to support element 7332, thus creating a sturdy assembly comprising optics module 7360 and light engine 7310.

In some embodiments of the present invention, cavity 7620 may be filled with fill material 7625 using ports 7630 and 7640. Ports 7630 and 7640 may provide access to the interior of cavity 7620 after optical element 7610 is coupled to light engine 7310. A source of fill material 7625 may be coupled to port 7630 and a source of vacuum may be coupled to port 7640, wherein fill material 7625 may be drawn through port 7630, cavity 7620 and port 7640, resulting in a complete filling of cavity 7620 with fill material 7625.

Ports 7630 and 7640 may be de-coupled from the source of fill material 7625 and vacuum respectively and fill material 7625 may remain in and completely fill cavity 7620. In some embodiments of this aspect of the invention fill material 7625 may be cured through the application of heat, optical radiation, for example UV, or other means.

In some embodiments of the present invention, different materials in the optical path of the light from light engine 7310 to the space outside of the lamp may have refractive index changing as a function of distance from the light engine. In one example, filler material 7625 may have refractive index graded from a value matching or close to that of the material of light engine 7310 or that of layer structure 750 (FIG. 20) to a value matching or close to that of the material comprising optical element 7610. This may provide reduced optical losses at the interface between light engine 7310 and filler material 7625 and at the interface between filler material 7625 and optical element 7610. In some embodiments of the present invention, optical element 7610 may have a graded refractive index, and in some embodiments may be graded from a value matching or close to that of the material comprising light engine 7310 (or that comprising layer structure 750 (FIG. 20)) to a value matching or close to that of the material comprising optical element 7610.

In some embodiments of the present invention, one or more surfaces or a portion of one or more surfaces of optical element 7610 may be shaped to provide a desired light distribution. For example the surface from which the light exits optical element 7610 may comprise a lens or a portion of a lens. In some embodiments of the present invention, one or more surfaces or a portion of one or more surfaces of optical element 7610 may be etched, patterned, frosted, or otherwise modified to provide a certain characteristic light output. In some embodiments of the present invention, one or more surfaces or a portion of one or more surfaces of optical element 7610 may be patterned to form surface features designed to improve light extraction or to direct light out of the optics, for example a photonic crystal. In some embodiments of the present invention, the surface from which light exits optical element 7610 may also be the exterior surface of the lamp through which light is emitted—in other words there may be no additional lenses, diffuser plates, interfaces or other optical elements, to cause additional optical losses, after the light exits optical element 7610. In some embodiments of the present invention, the light may be patterned in a directional pattern, for example for use in down lights, where it may be desirable for all of the light to exit the lamp in a directional fashion. In this example, if a lamp in a down light emits omnidirectionally or relatively omnidirectionally, a relatively significant portion may be absorbed within the fixture, reducing the usable light from that luminaire. However, this is not a limitation of the present invention and in other embodiments the light may exit the LED lamp of the present invention omnidirectionally or in any pattern or with any distribution.

As shown in FIG. 73, optical module 7360 may be spaced apart from housing 7390 in one or more areas. In some embodiments of the present invention, passive convective cooling may be employed to draw air into a portion of lamp housing 7390, provide cooling for internal components such as light engine 7310 and/or electronics module 7330, and then exhaust the heated air out of the lamp towards the direction of base 7398. In this fashion a circulation system may be set up, drawing cold air in from the bottom and exhausting hot air out the top.

In contrast to prior-art LED lamps, the LED lamp of the present invention starts with the light engine which may be optimized for use in a particular lamp. In conjunction with the integrated optical module and optimized electronics, the lamp of the present invention may provide relatively improved performance at relatively lower cost than prior-art LED lamps.

Figure 77:
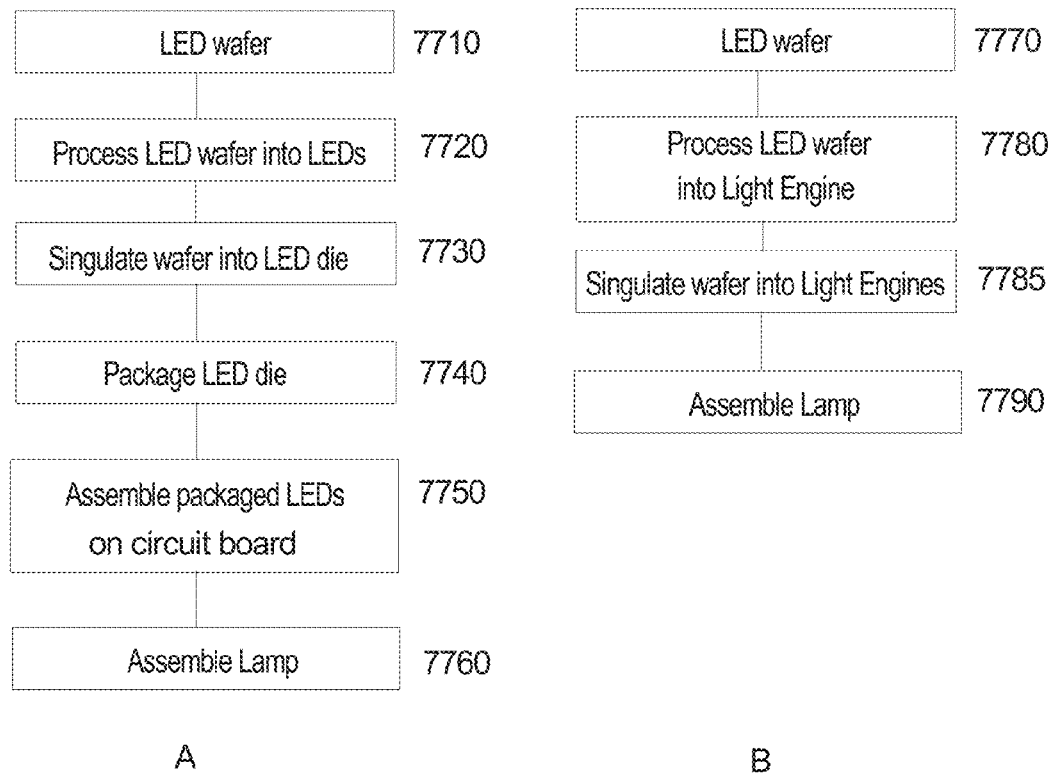
FIG. 77 shows a process flow for a prior-art LED lamp and a light emitting device made in accordance with an embodiment of the invention.

A key area of differentiation and cost reduction is the manufacture of the ILT LED light engine. FIG. 77 compares the manufacturing process for a LED lamp of the present invention with that of a prior-art LED lamp. Both processes start with an epitaxial LED wafer comprising a substrate and epitaxial layers (similar to the semiconductor structure in FIG. 20). In the conventional process, shown in FIG. 77A, step 7710 starts with the LED wafer.

The LED wafer is then processed to make individual LEDs on the wafer in step 7720. The wafer is then singulated into LED die in step 7730 and the individual LED die are packaged in step 7740. The packaged LEDs are then assembled on the circuit board in step 7750 and finally the lamp is assembled in step 7760. Lamp assembly may comprise assembly of the electronics, optics, thermal management system, LEDs on the circuit board into the lamp housing.

In the LED lamp of the present invention all of the steps of taking apart, packaging and assembling the packaged LEDs may be eliminated by the fabrication and use of the light engine. In some embodiments of the present invention, several hundred light engines may be fabricated simultaneously on each wafer using standard IC processing techniques and tools. Each light engine is complete after wafer singulation. An exemplary process for a LED lamp of the present invention is shown in FIG. 77B. Step 7770 starts with the LED wafer. The LED wafer is then processed to make light engines on the wafer in step 7780. The wafer is then singulated into completed light engines in step 7785 and then the lamp is assembled in step 7790. In some embodiments of the present invention lamp assembly may be relatively simplified and be able to be performed at a relatively lower cost compared to the process for the prior-art LED lamp because of the modular nature of the LED lamp of the present invention.

In some embodiments of the present invention relatively large cost savings may be possible, resulting from a reduction in the number of processing steps, elimination of the LED packages (which often cost as much as or more than the LED die) and elimination of the circuit board and assembly steps. In some embodiments of the present invention, the light engine of the present invention may use about 2× to about 3× more wafer area than the combined wafer area in the packaged LEDs used in prior-art LED lamps, for a similar light output. However, this cost of this additional area occurs at the wafer level, which is relatively less expensive than further downstream at the packaged LED level. In some embodiments of the present invention the light engine of the present invention may cost about 8× to about 10× less to manufacture than the light emitting assembly (LEDs+circuit board+assembly cost) of a prior-art LED lamp.

The LED lamp of the present invention is designed to be assembled in a modular fashion. The light engine module may be attached to the optics module. The light engine and optics sub-assembly may then be mounted together with the electronics module on the thermal management module. This complete assembly may then be mounted in the lamp housing. Because of the relatively low level of generated heat, the thermal management system may be quite simple, for example consisting of a relatively modest heat sink or in some embodiments of the present invention, the LED lamp housing itself. Overall, the LED lamp of the present invention has fewer components, higher performance and reduced assembly costs. After lamp assembly, the cost to manufacture a LED lamp of the present invention may be about 4× to about 6× less than the cost to manufacture a prior-art LED lamp.

Figure 78:
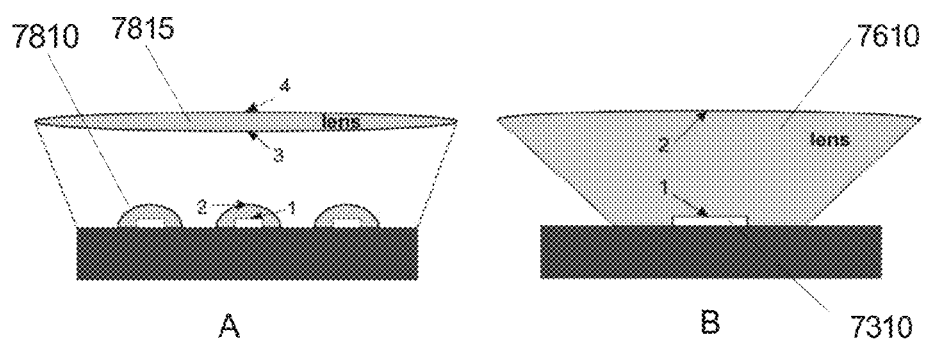
FIG. 78 shows a comparison of the optical system for a prior-art LED and a light emitting device made in accordance with an embodiment of the invention.

FIG. 78 shows a comparison of the optical system in a prior-art LED lamp (FIG. 78A) and a LED lamp of the present invention (FIG. 78B). LED lamps may require an optical system to diffuse the light emitted by the LEDs and provide the required light distribution pattern. Significant losses in optics may occur at interfaces, because only part of the light is transmitted, while the remainder is reflected back and may be absorbed, generating heat. The larger the number of interfaces the light has to traverse, the lower the optical efficiency may be.

In the prior-art LED lamp (FIG. 78A) a plurality of packaged LEDs 7810 may be positioned away from a lens 7815. The light emitted from each LED die inside each package must traverse 4 interfaces, including (1) die to encapsulant, (2) encapsulant to air, (3) air to lens, and (4) lens to air.

In contrast, in the approach of the present invention using an optical element optically coupled to the light engine as discussed above in reference to FIG. 76 the number of interfaces may only be about 2. Optical element 7610 may comprise a material transparent to a wavelength of light emitted by the light engine, for example glass, and may be coupled to light engine 7310 with an index matching material (not shown in FIG. 78), as discussed above. In some embodiments of the present invention the optical efficiency may be about 10% to about 20% higher than achievable using the prior-art approach.

Another aspect of optical losses is related to the etendue (etendue refers to how "spread out" the light is in area and angle) of the system. The result of this is that one can only, without loss, capture light radiated within a certain spatial distribution for a given optical design. If the etendue is too large, optical losses will occur, decreasing the optical efficiency. In the LED lamp of the present invention, the light emitting area of the light engine may be in the range of about 3 mm×3 mm to about 7 mm×7 mm, which is relatively much smaller than the area covered by a plurality of packaged LEDs in the prior-art LED lamp approach. In some embodiments of the present invention the optical efficiency may be about 10% to about 20% higher than achievable using the prior-art approach.

Figure 3:
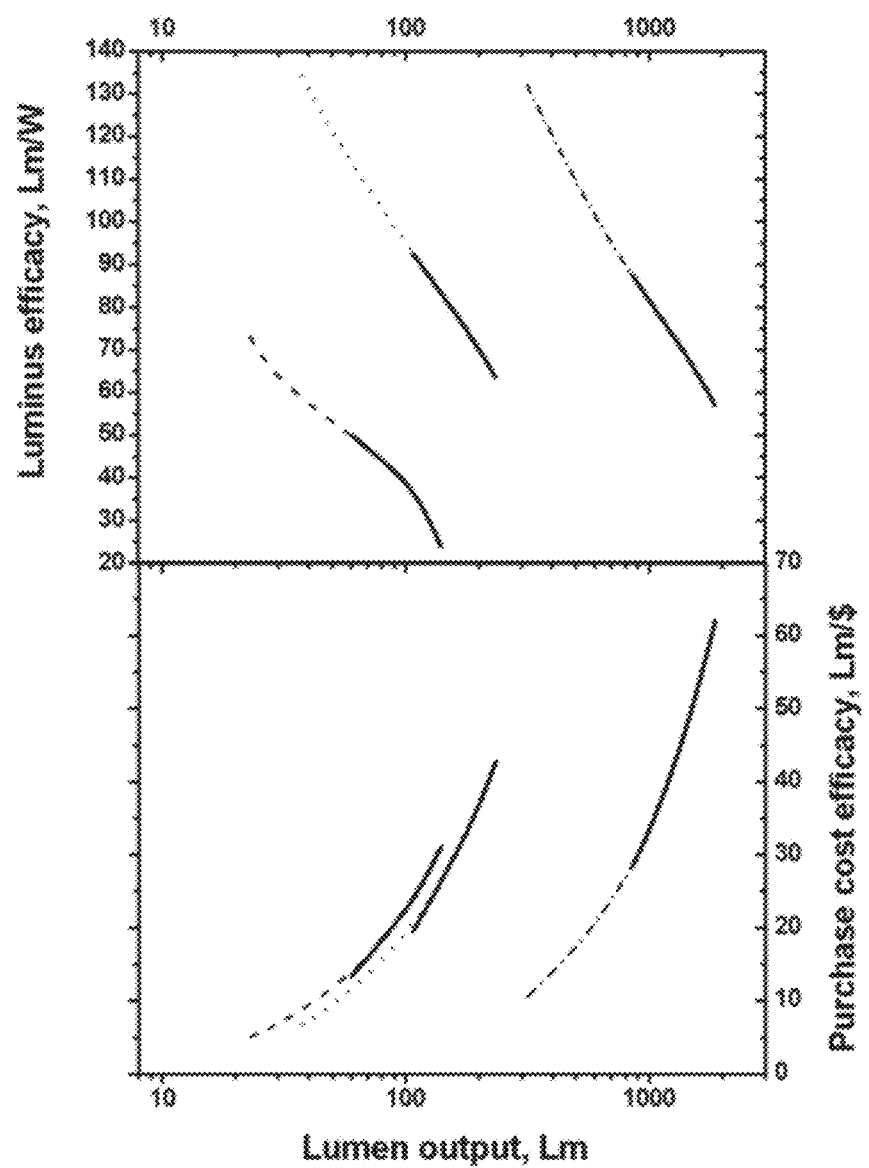
FIG. 3 is a plot of luminous efficacy and total light output as a function of light output for state-of-the-art LEDs.
Figure 4:
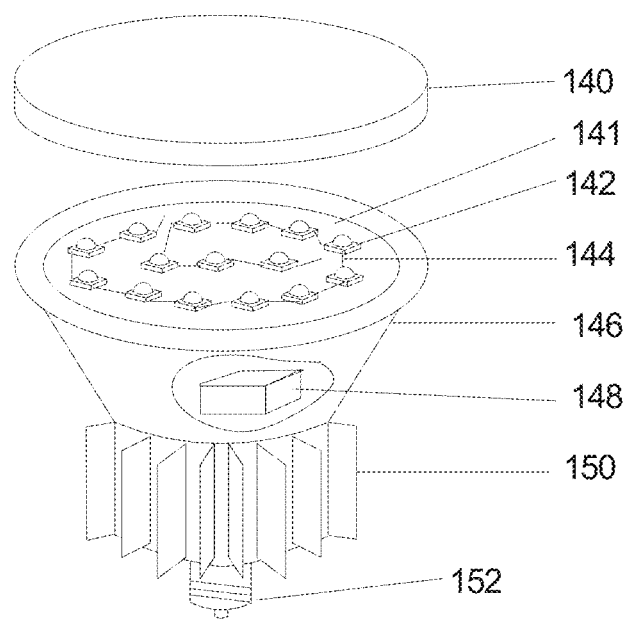
FIG. 4 is a schematic illustration of an exemplary prior-art LED lamp.

In some embodiments of the present invention, a large area modular lamp may be formed, comprising a plurality of the light engines, and optics, using either a single electronics and thermal management system or multiple electronics and/or thermal management systems. Such a lamp may be used in applications in which a very large total light output (more than 10,000 lm or more than 20,000 lm) is required. Examples of such lamps may include street lights, parking lights, or large area ceiling light (say 1×1 foot) in large rooms. A schematic example of such a modular lamp is shown in FIG. 3.

In some embodiments of the present invention, a large area modular lamp may be formed, comprising a plurality of light engines, and optical elements, using either a single electronics and thermal management system or a plurality of electronics and/or thermal management systems. Such a lamp may be used in applications in which a relatively very large total light output (more than about 10,000 lm or more than about 20,000 lm) may be required. Examples of such lamps may include street lights, parking lights, or large area ceiling light (for example with a size of about 1 ft×about 1 ft) in relatively large rooms.

Figure 79:
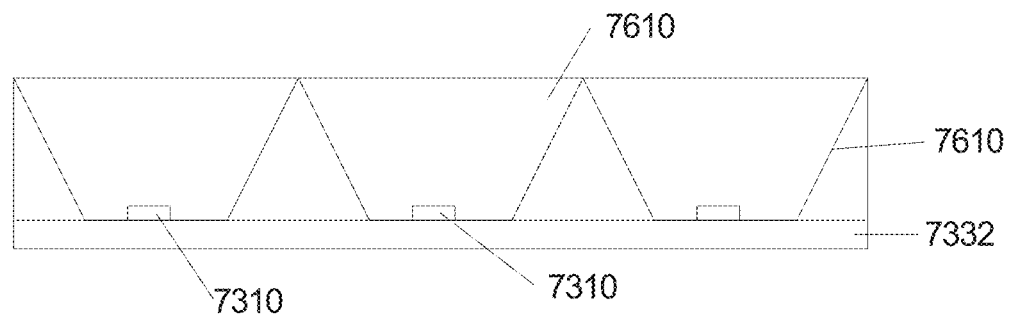
FIG. 79 is a cross-sectional view of a light emitting device made in accordance with an eighteenth embodiment of the invention taken along section line 79-79 of FIG. 80.
Figure 80:
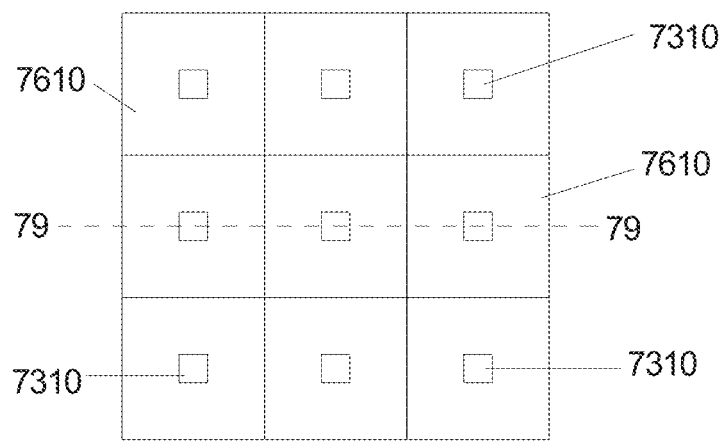
FIG. 80 is a view from the light emitting side of the light emitting device of FIG. 79.

FIG. 79 is a cross-sectional view of a portion of an exemplary large area modular LED lamp in accordance with an embodiment of the present invention. FIG. 80 is a view of the structure of FIG. 79 from the light emitting side of the structure and FIG. 79 is a cross-sectional view taken along section line 79-79 of FIG. 80. The example shown in FIG. 3 comprises a 3×3 modular array of light engines 7310 with optical elements 7610 disposed on a single support element 7332. Not shown in FIG. 79 or 80 are the electronics module, the housing and any necessary additional thermal management system.

The example shown in FIG. 80 comprises optical element 7610 with a rectangular shape, however this is not a limitation of the present invention and in other embodiments optical element 7610 may have any shape. The example shown in FIG. 80 comprises an array of 3×3 light engines 7310, however this is not a limitation of the present invention and in other embodiments any number or arrangement of light engines and optical elements 7610 may be used. The example shown in FIG. 80 comprises an array with equal number of rows and columns of light engines 7310, however this is not a limitation of the present invention and in other embodiments any number of light engines may be in used in both rows and columns. The example shown in FIG. 80 comprise an array with equal number of rows and columns of light engines 7310, however this is not a limitation of the present invention and in other embodiments any number of light engines may be in used in both rows and columns. The example shown in FIG. 80 comprises a regular periodic array of light engines 7310 and optical elements 7610, however this is not a limitation of the present invention and in other embodiments one or more light engines 7310 and/or one or more optical elements 7610 may be in any random position. The example shown in FIG. 80 comprises a plurality of light engines 7310 and optical elements 7610, wherein each light engine 7630 may be optically coupled to one optical element 7610, however this is not a limitation of the present invention and in other embodiments one or more light engines 7310 may be optically coupled to one or more optical elements 7610 or one or more optical elements 7610 may be optically coupled to one or more light engines 7310.

Several examples of LED units, light engines and LED lamps emitting at different wavelengths have been presented herein, however, it should be recognized that numerous methods and materials may be used to make produce light emission at multiple wavelengths or with an engineered spectral light distribution and/or characteristic, and these examples do not represent limitations on the invention.

It is to be understood that each of fabrication sequences discussed herein and shown in the figures represents only certain embodiments and that the specification of specific steps and an order for those steps is exemplary rather than limiting. In particular, in each case, there are embodiments in which some of the specified steps might not be performed, embodiments in which additional steps might be performed, and embodiments in which specifically identified steps might be performed in a different order than is shown.

INDUSTRIAL APPLICABILITY

The present invention has industrial applicability for a wide range of lighting applications including, for example, automotive, architectural, backlighting of displays and signage and general lighting.

What is claimed is:

1. A lighting system comprising:
an electrically insulating carrier having a plurality of conductive elements disposed thereon;
disposed over the carrier, a light-emitting array comprising a plurality of light-emitting strings, each light-emitting string comprising a plurality of light-emitting diodes (LEDs), each LED having at least two electrical contacts, wherein each electrical contact is electrically connected to a conductive element by a conductive adhesive; and
at least one power source for providing power to the light-emitting strings.

2. The system of claim 1, wherein the electrically insulating carrier comprises a polymeric material.

3. The system of claim 1, wherein the electrically insulating carrier is flexible.

4. The system of claim 1, wherein at least one of the LEDs comprises a light-conversion material disposed therein or thereon, at least one of (i) light emitted from the light-conversion material or (ii) a mixture of light emitted from the at least one of the LEDs and the light-conversion material being white light.

5. The system of claim 1, wherein:
the light-emitting array comprises (i) a first group of one or more light-emitting strings, and (ii) a second group of one or more light-emitting strings different from the first group,
activation of the first group and deactivation of the second group produces light having a first color, color temperature, intensity, efficiency, color rendering index, or spectral light distribution, and
activation of the second group and deactivation of the first group produces light having a second color, color temperature, intensity, efficiency, color rendering index, or spectral light distribution different from the first color, color temperature, intensity, efficiency, color rendering index, or spectral light distribution.

6. The system of claim 1, further comprising:
a second electrically insulating carrier having a plurality of conductive elements disposed thereon; and
disposed over the second electrically insulating carrier, a light-emitting array comprising a plurality of light-emitting strings, each light-emitting string comprising a plurality of LEDs,
wherein (i) the strings on the electrically insulating carrier produce light having a first color, color temperature, intensity, efficiency, color rendering index, or spectral light distribution, and (ii) the strings on the second electrically insulating carrier produce light having a second color, color temperature, intensity, efficiency, color rendering index, or spectral light distribution different from the first color, color temperature, intensity, efficiency, color rendering index, or spectral light distribution.

7. The system of claim 1, further comprising:
a second electrically insulating carrier having a plurality of conductive elements disposed thereon; and
disposed over the second electrically insulating carrier, a light-emitting array comprising a plurality of light-emitting strings, each light-emitting string comprising a plurality of LEDs,
wherein (i) the strings on the electrically insulating carrier produce light having a first color, color temperature, intensity, efficiency, color rendering index, or spectral light distribution, and (ii) the strings on the second electrically insulating carrier produce light having a second color, color temperature, intensity, efficiency, color rendering index, or spectral light distribution substantially the same as the first color, color temperature, intensity, efficiency, color rendering index, or spectral light distribution.

8. The system of claim 1, further comprising a light-conversion material disposed in or over at least one of the LEDs, wherein the electrically insulating carrier is reflective to at least one of (i) a wavelength of light emitted by at least one of the LEDs or (ii) a wavelength of light emitted by the light-conversion material.

9. The system of claim 1, further comprising a light-conversion material disposed in or over at least one of the LEDs, wherein the electrically insulating carrier is substantially transparent to at least one of (i) a wavelength of light emitted by at least one of the LEDs or (ii) a wavelength of light emitted by the light-conversion material.

10. The system of claim 1, wherein at least one of the LEDs comprises a semiconductor material comprising at least one of silicon, SiC, GaAs, $Al_xIn_yGa_{1-x-y}P_zN_tAs_{1-t-z}$, $Al_xIn_yGa_{1-x-y}N$, ZnO, or mixtures or compounds thereof.

11. The system of claim 1, wherein at least one of the LEDs emits UV, blue, or green light.

12. The system of claim 1, further comprising, electrically connected to the plurality of light-emitting strings, electrical circuitry for selectively turning off various ones of the light-emitting strings, thereby dimming a light output of the light-emitting array, without altering a level of drive current supplied to the LEDs.

13. The system of claim 1, wherein:
the light-emitting array comprises a first group of one or more light-emitting strings and, associated with at least one of the LEDs of the first group, a first optical element of a first type,
the light-emitting array comprises a second group, different from the first group, of one or more light-emitting strings and, associated with at least one of the LEDs of the second group, a second optical element of a second type different from the first type,
activation of the first group and deactivation of the second group produces light having a first color, color temperature, intensity, efficiency, color rendering index, or spectral light distribution, and
activation of the second group and deactivation of the first group produces light having a second color, color temperature, intensity, efficiency, color rendering index, or spectral light distribution different from the first color, color temperature, intensity, efficiency, color rendering index, or spectral light distribution.

14. The system of claim 1, wherein:
the light-emitting array comprises a first group of one or more light-emitting strings and, associated with at least one of the LEDs of the first group, a first light-conversion material having a first optical characteristic,
the light-emitting array comprises a second group, different from the first group, of one or more light-emitting strings and, associated with at least one of the LEDs of the second group, a second light-conversion material having a second optical characteristic different from the first optical characteristic,
activation of the first group and deactivation of the second group produces light having a first color, color temperature, intensity, efficiency, color rendering index, or spectral light distribution, and
activation of the second group and deactivation of the first group produces light having a second color, color temperature, intensity, efficiency, color rendering index, or spectral light distribution different from the first color, color temperature, intensity, efficiency, color rendering index, or spectral light distribution.

15. The system of claim 1, wherein at least one LED comprises a substrate that is substantially transparent to a wavelength of light emitted by the at least one LED.

16. The system of claim 1, wherein at least one LED comprises a light-conversion material disposed therein or thereon, the at least one LED comprising a substrate that is substantially transparent to at least one of (i) a wavelength of light emitted by at least one LED or (ii) a wavelength of light emitted by the light-conversion material.

17. The system of claim 1, wherein the plurality of light-emitting strings comprises (i) a first light-emitting string in which at least one LED comprises a light-conversion material, and (ii) a second light-emitting string, different from the first light-emitting string, in which at least one LED lacks a light-conversion material.

18. The system of claim 1, wherein the plurality of light-emitting strings comprises a first light-emitting string configured for emission of white light and a second light emitting string, different from the first light-emitting string, configured for emission of red light.

19. The system of claim 1, further comprising an array of optical elements each associated with at least one LED, the array of optical elements at least one of focusing or shaping light from the LEDs to a desired illumination pattern.

20. The system of claim 19, wherein each optical element is optically coupled to at least one LED with no interface to air therebetween.

21. The system of claim 1, wherein at least one LED comprises a packaged LED.

22. The system of claim 21, wherein the packaged LED comprises a light-conversion material.

23. The system of claim 22, wherein the light-conversion material comprises a phosphor.

24. The system of claim 1, wherein at least one LED comprises a bare- die LED.

25. The system of claim 24, further comprising a light-conversion material disposed over at least a portion of the bare-die LED.

26. The system of claim 25, wherein the light-conversion material comprises a phosphor.

27. The system of claim 1, further comprising, disposed on the electrically insulating carrier, circuitry for controlling current supplied to the LEDs.

28. The system of claim 27, wherein the circuitry comprises one or more resistors.

29. The system of claim 27, wherein the circuitry comprises one or more transistors.

30. The system of claim 27, wherein the circuitry comprises at least one resistor and at least one transistor.

31. The system of claim 27, wherein the circuitry comprises at least one integrated circuit.

32. The system of claim 1, further comprising, disposed on the electrically insulating carrier, a plurality of circuits each for controlling current supplied to one of the light-emitting strings.

33. The system of claim 32, wherein each circuit comprises one or more resistors.

34. The system of claim 32, wherein each circuit comprises one or more transistors.

35. The system of claim 32, wherein each circuit comprises at least one resistor and at least one transistor.

36. The system of claim 1, wherein at least one first light-emitting string emits light having a color, color temperature, intensity, efficiency, color rendering index, or spectral light distribution different from a color, color temperature, intensity, efficiency, color rendering index, or spectral light distribution of at least one second light-emitting string.

37. The system of claim 36, wherein at least one of the LEDs of the at least one first light-emitting string is associated with a first light conversion material having a first optical characteristic, and at least one of the LEDs of the at least one second light-emitting string is associated with a second light conversion material having a second optical characteristic different from the first optical characteristic.

38. The system of claim 36, wherein at least one of the LEDs of the at least one first light-emitting string is associated with an optical element of a first type, and at least one of the LEDs of the at least one second light-emitting string is associated with an optical element of a second type different from the first type.

39. The system of claim 36, wherein the LEDs of the at least one first light-emitting string are substantially identical to the LEDs of the at least one second light-emitting string.

40. A lighting system comprising:
an electrically insulating polymeric carrier having a plurality of conductive elements disposed thereon;
disposed over the carrier, a light-emitting array comprising a plurality of light-emitting strings, each light-emitting string comprising a plurality of light-emitting diodes (LEDs), each LED having at least two electrical contacts, wherein each electrical contact is electrically connected to a conductive element by a conductive adhesive;
disposed on the carrier, circuitry for controlling current supplied to the LEDs; and
at least one power source for providing power to the light-emitting strings,
wherein (i) the conductive elements comprise copper and (ii) the LEDs emit white light.

* * * * *